US012803700B2

(12) United States Patent
Niu et al.

(10) Patent No.: US 12,803,700 B2
(45) Date of Patent: Nov. 17, 2026

(54) INFORMATION PROCESSING METHOD AND DEVICE

(71) Applicant: HUAWEI TECHNOLOGIES CO., LTD., Shenzhen (CN)

(72) Inventors: Kai Niu, Beijing (CN); Hao Dong, Beijing (CN); Jincheng Dai, Beijing (CN); Bichai Wang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 252 days.

(21) Appl. No.: 18/670,138

(22) Filed: May 21, 2024

(65) Prior Publication Data

US 2024/0322939 A1 Sep. 26, 2024

Related U.S. Application Data

(63) Continuation of application No. PCT/CN2022/127004, filed on Oct. 24, 2022.

(30) Foreign Application Priority Data

Nov. 23, 2021 (CN) ........................ 202111395441.2
Jan. 14, 2022 (CN) ........................ 202210045064.8

(51) Int. Cl.
*H04L 1/00* (2006.01)
*H03M 13/00* (2006.01)
*H03M 13/25* (2006.01)

(52) U.S. Cl.
CPC ........ *H04L 1/0014* (2013.01); *H03M 13/255* (2013.01); *H03M 13/616* (2013.01); *H04L 1/0061* (2013.01)

(58) Field of Classification Search
None
See application file for complete search history.

(56) References Cited

U.S. PATENT DOCUMENTS

2021/0211232 A1* 7/2021 Hwang ............. H04W 72/0446

FOREIGN PATENT DOCUMENTS

CN 106341138 A * 1/2017 .......... H03M 13/116
CN 107623560 A 1/2018

OTHER PUBLICATIONS

Chen et al, Joint Coding and Adaptive Image Transmission Scheme Based on DP-LDPC Codes for IoT Scenarios, IEEE (Year: 2019).*
Sanya Liu et al., "Edge Connection Optimization for JSCC System Based on DP-LDPC Codes," IEEE Wireless communications Letters, Aug. 2019, 4 pages.

(Continued)

*Primary Examiner* — Yaotang Wang
(74) *Attorney, Agent, or Firm* — Fish & Richardson P.C.

(57) ABSTRACT

Example information processing methods and devices are described. A first device determines a first source coding rate. The first device determines a source coding matrix based on the first source coding rate and a channel coding basis matrix. The first device inputs a source sequence into the source coding matrix to perform source coding on the source sequence. In some embodiments, the source coding matrix is determined based on the channel coding basis matrix to implement joint source and channel coding.

20 Claims, 16 Drawing Sheets

(56) References Cited

OTHER PUBLICATIONS

3GPP TS 38.212 V16.7.0, "3rd Generation Partnership Project; Technical Specification Group Radio Access Network; NR; Multiplexing and channel coding (Release 16)," Sep. 2021, 153 pages.
Deng et al. "Joint Coding and Adaptive Image Transmission Scheme Based on DP-LDPC Codes for IoT Scenarios," IEEE Access, Jan. 31, 2019, 7:18437-18449.
Chen et al., "Adaptive rate allocation scheme for joint source-channel coding based on double protograph LDPC codes," Proceedings of 2014 International Symposium on Wireless Personal Multimedia Communications (WPMC) Sep. 7, 2014, pp. 158-162.
Fresia et al., "Joint source and channel coding," IEEE Signal Processing Magazine, Oct. 18, 2010, 27(6):104-113.
Divsalar et al., "Low-rate LDPC codes with simple protograph structure," Proceedings of IEEE International Symposium on Information Theory, Sep. 4, 2005, pp. 1622-1626.
Dong et al., "Rate-Compatible Joint Source-Channel Coding Scheme Based on 5GNR LDPC Codes," Proceedings of 2023 4th Information Communication Technologies Conference (ICTC), May 17, 2023, pp. 1-5.
Extended European Search Report in European Appln. No. 22897494.5, mailed on Jan. 9, 2025, 10 pages.
Chiang, "Hardware Implementation and Improvement of Joint Source and Channel Coding Based on Double Protograph LDPO," Chapter Three and Four of Thesis for the degree of Master, Xiamen University, Jul. 17, 2019, 76 pages (with English translation).
Golmohammadi et al., "Concatenated Spatially Coupled LDPC Codes With Sliding Window Decoding for Joint Source-Channel Coding," Proceedings of IEEE Transactions on Communications, Feb. 2022, vol. 70, No. 2, pp. 851-864.
International Search Report and Written Opinion in International Appln. No. PCT/CN2022/127004, mailed on Jan. 28, 2023, 17 pages (with English translation).
Divsalar et al., "Capacity-Approaching Protograph Codes," IEEE Journal on Selected Areas in Communications, Aug. 2009, 27(6):876-888.

* cited by examiner

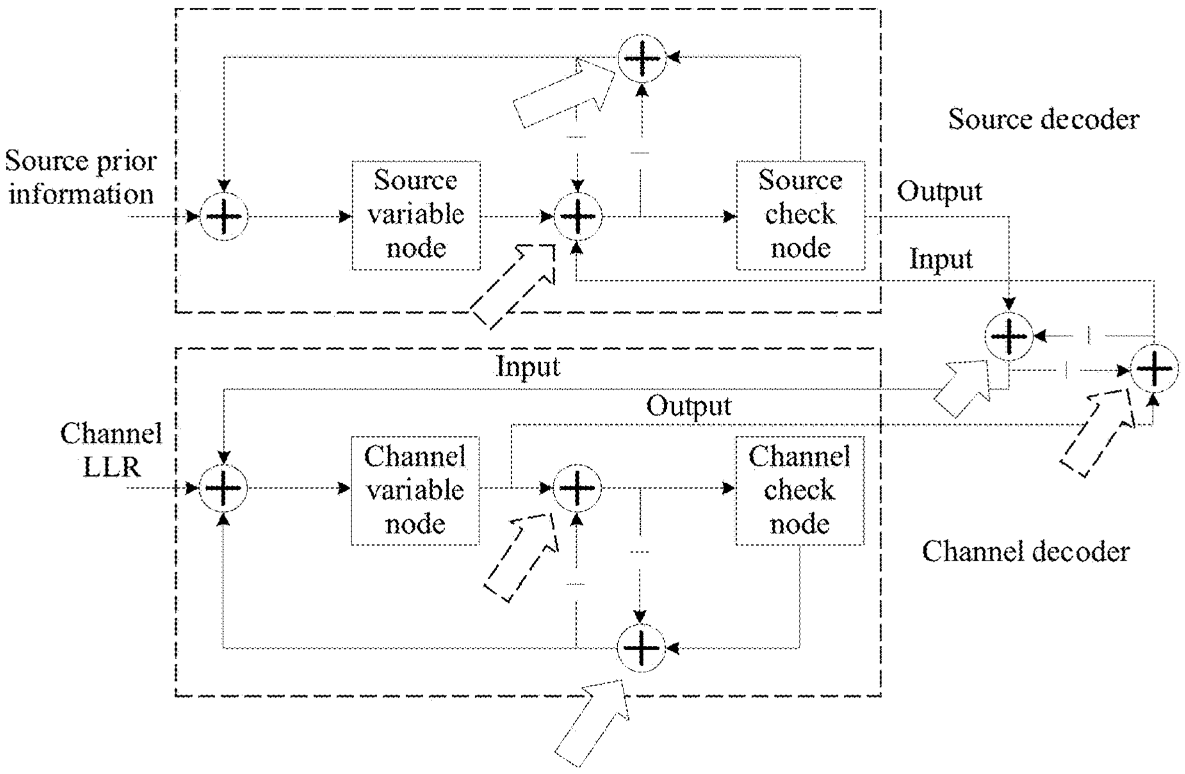
FIG. 6
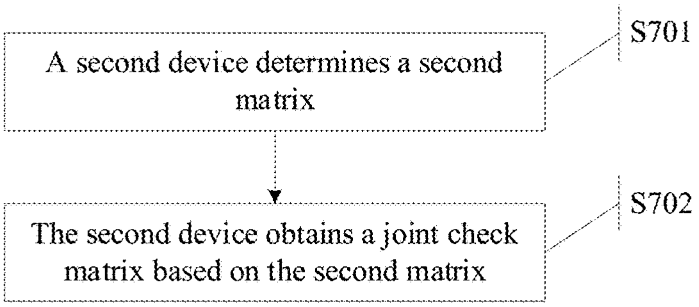
FIG. 7
$$H_{jsc} = \begin{bmatrix} H_{sc} & P & 0 \\ 0 & H_{cc} & \end{bmatrix}$$
FIG. 8

INFORMATION PROCESSING METHOD AND DEVICE

CROSS-REFERENCE TO RELATED APPLICATIONS

This application is a continuation of International Application No. PCT/CN2022/127004, filed on Oct. 24, 2022, which claims priority to Chinese Patent Application No. 202111395441.2, filed on Nov. 23, 2021, and Chinese Patent Application No. 202210045064.8, filed on Jan. 14, 2022. All of the aforementioned patent applications are hereby incorporated by reference in their entireties.

TECHNICAL FIELD

This application relates to the field of communication technologies, and in particular, to an information processing method and device.

BACKGROUND

Currently, researchers have proposed use of two low-density parity-check codes (LDPC) to perform source coding and channel coding and use of a joint decoder to perform decoding at a receiving end. This method is referred to as a double LDPC (D-LDPC) joint source and channel coding/decoding scheme. Compared with independent source and channel coding/decoding methods, this scheme can have better bit error rate performance.

Later, some researchers have proposed an adaptive code rate allocation scheme using double LDPC codes. In this scheme, the researchers use R4JA and AR3A as source code and channel code respectively. However, a quantity of source coding rates that can be supported by this scheme is limited, and it is difficult to integrate this scheme into an existing LDPC-based channel coding scheme of the $5^{th}$ generation mobile communication technology (5G) new radio (NR).

SUMMARY

Embodiments of this application provide an information processing method and device, to provide a coding/decoding scheme that can be adapted to a 5G NR system.

According to a first aspect, a first information processing method is provided. The method may be performed by a terminal device, or may be performed by a larger device including a terminal device, or may be performed by a chip system or another functional module. The chip system or the functional module can implement a function of the terminal device, and the chip system or the functional module is, for example, disposed in the terminal device. Alternatively, the method may be performed by an access network device, or may be performed by another device including a function of an access network device, or may be performed by a chip system or another functional module. The chip system or the functional module can implement the function of the access network device. The chip system or the functional module is, for example, disposed in the access network device. The access network device is, for example, a base station. The method includes: determining a first source coding rate; determining a source coding matrix based on the first source coding rate and a channel coding basis matrix; and inputting a source sequence into the source coding matrix, to perform source coding on the source sequence.

In embodiments of this application, the source coding matrix may be determined based on the channel coding basis matrix, which is equivalent to determining source coding information based on channel coding information, to implement joint source and channel coding. Through the joint source and channel coding, a quantity of output bits of source coding can match a quantity of input bits of channel coding, so that the technical solutions in embodiments of this application can be adapted to a 5G NR system.

With reference to the first aspect, in a first optional implementation of the first aspect, the method further includes: determining the first source coding rate from first information based on an entropy rate and a source code length of the source sequence, where the first information includes a correspondence among a source coding rate, a source code length, and an entropy rate, and a quantity of source coding rates included in the first information is greater than 6. The first information provided in embodiments of this application includes a large quantity of source coding rates. For example, the quantity of source coding rates included in the first information is greater than 6. Therefore, a granularity of the source coding rate provided by the first information is finer. A first device has high flexibility in selecting a source coding rate, and can select an appropriate source coding rate based on the entropy rate and the source code length of the source sequence, to improve flexibility and accuracy of code rate selection.

With reference to the first aspect or the first optional implementation of the first aspect, in a second optional implementation of the first aspect, the determining a source coding matrix based on the first source coding rate and a channel coding basis matrix includes: determining a source coding basis matrix based on the first source coding rate and the channel coding basis matrix; and determining the source coding matrix based on the source coding basis matrix. The source coding basis matrix may be first determined, and then the source coding matrix is determined based on the source coding basis matrix.

With reference to the second optional implementation of the first aspect, in a third optional implementation of the first aspect, the determining a source coding basis matrix based on the first source coding rate and the channel coding basis matrix includes: determining a set index to which a lifting size corresponding to the first source coding rate belongs; determining a first channel coding basis matrix corresponding to the set index; transposing the first channel coding basis matrix to obtain a second channel coding basis matrix; and pruning rows and/or columns of the second channel coding basis matrix to obtain the source coding basis matrix. This is only a manner of obtaining the source coding basis matrix, and the source coding basis matrix may be alternatively obtained in another manner. For example, after the first channel coding basis matrix is obtained, the first channel coding basis matrix may not be transposed, but rows and/or columns of the first channel coding basis matrix are pruned to obtain the source coding basis matrix; or after the first channel coding basis matrix is obtained, rows and/or columns of the first channel coding basis matrix are pruned first, and then transposed to obtain the source coding basis matrix; or the source coding basis matrix may be obtained in another manner, which is flexible.

With reference to the third optional implementation of the first aspect, in a fourth optional implementation of the first aspect, the pruning rows and/or columns of the second channel coding basis matrix includes: reserving the first $N_1$ rows of the second channel coding basis matrix, where $N_1$ is a positive integer less than or equal to a total quantity of rows of the second channel coding basis matrix; and/or reserving $N_2$ columns of the second channel coding basis matrix, where $N_2$ is a positive integer less than or equal to a total quantity of columns of the second channel coding basis matrix. This manner is effective for performance improvement.

With reference to the fourth optional implementation of the first aspect, in a fifth optional implementation of the first aspect, $N_1=22$. Alternatively, $N_1$ may be another value. When $N_1=22$, the performance is better.

With reference to the fourth optional implementation of the first aspect or the fifth optional implementation of the first aspect, in a sixth optional implementation of the first aspect, if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{th}$ column of the second channel coding basis matrix. In this column pruning manner, the performance is better.

With reference to any one of the first aspect or the first optional implementation of the first aspect to the sixth optional implementation of the first aspect, in a seventh optional implementation of the first aspect, the method further includes: performing, based on a first matrix, channel coding on bits output by the source coding matrix, where an output dimension of the source coding matrix is equal to an input dimension of the first matrix. The first matrix is also referred to as, for example, a channel generator matrix, and may be used in a channel coding process. The output dimension of the source coding matrix is equal to the input dimension of the first matrix, so that the technical solutions provided in embodiments of this application can be applied to a 5G system.

With reference to the seventh optional implementation of the first aspect, in an eighth optional implementation of the first aspect, the performing, based on a first matrix, channel coding on bits output by the source coding matrix includes: shuffling, based on a second matrix, the bits output by the source coding matrix; and performing the channel coding on the shuffled bits based on the first matrix. The second matrix is, for example, an identity matrix, or may be a matrix obtained based on an identity matrix.

According to a second aspect, a second information processing method is provided. The method may be performed by a terminal device, or may be performed by a larger device including a terminal device, or may be performed by a chip system or another functional module. The chip system or the functional module can implement a function of the terminal device, and the chip system or the functional module is, for example, disposed in the terminal device. Alternatively, the method may be performed by an access network device, or may be performed by another device including a function of an access network device, or may be performed by a chip system or another functional module. The chip system or the functional module can implement the function of the access network device. The chip system or the functional module is, for example, disposed in the access network device. The access network device is, for example, a base station. The method includes: obtaining a joint check matrix based on a second matrix, where the second matrix is a matrix obtained based on an identity matrix; and decoding received second information based on the joint check matrix.

For technical effects of the second aspect, refer to the descriptions of the technical effects of the first aspect or the corresponding implementations.

According to a third aspect, a third information processing method is provided. The method may be performed by a terminal device, or may be performed by a larger device including a terminal device, or may be performed by a chip system or another functional module. The chip system or the functional module can implement a function of the terminal device, and the chip system or the functional module is, for example, disposed in the terminal device. Alternatively, the method may be performed by an access network device, or may be performed by another device including a function of an access network device, or may be performed by a chip system or another functional module. The chip system or the functional module can implement the function of the access network device. The chip system or the functional module is, for example, disposed in the access network device. The access network device is, for example, a base station. The method includes: determining a first source coding rate; determining a source coding matrix based on the first source coding rate; and decoding received second information based on the source coding matrix.

For technical effects of the third aspect, refer to the descriptions of the technical effects of the first aspect or the corresponding implementations.

According to a fourth aspect, a communication apparatus is provided. The communication apparatus may be a device configured to perform the method in the foregoing first aspect. The communication apparatus has a function of the device configured to perform the method in the foregoing first aspect. The communication apparatus is, for example, a terminal device, or a functional module in a terminal device, for example, a baseband apparatus, a chip system, or the like. Alternatively, the communication apparatus is, for example, an access network device, or a functional module in an access network device, for example, a baseband apparatus, a chip system, or the like. In an optional implementation, the communication apparatus includes a baseband apparatus and a radio frequency apparatus. In another optional implementation, the communication apparatus includes a processing unit (sometimes also referred to as a processing module) and a transceiver unit (sometimes also referred to as a transceiver module). The transceiver unit can implement a sending function and a receiving function. When the transceiver unit implements the sending function, the transceiver unit may be referred to as a sending unit (sometimes also referred to as a sending module). When the transceiver unit implements the receiving function, the transceiver unit may be referred to as a receiving unit (sometimes also referred to as a receiving module). The sending unit and the receiving unit may be a same functional module, and the functional module is referred to as the transceiver unit. The functional module can implement the sending function and the receiving function. Alternatively, the sending unit and the receiving unit may be different functional modules, and the transceiver unit is a general term for these functional modules.

In an optional implementation, the communication apparatus further includes a storage unit, and the processing unit is configured to be coupled to the storage unit, and execute a program or instructions in the storage unit, to enable the communication apparatus to perform the method in the first aspect.

According to a fifth aspect, a communication apparatus is provided. The communication apparatus may be a device configured to perform the method in the foregoing second aspect. The communication apparatus has a function of the device configured to perform the method in the foregoing second aspect. The communication apparatus is, for example, a terminal device, or a functional module in a terminal device, for example, a baseband apparatus, a chip system, or the like. Alternatively, the communication apparatus is, for example, an access network device, or a functional module in an access network device, for example, a baseband apparatus, a chip system, or the like. In an optional implementation, the communication apparatus includes a baseband apparatus and a radio frequency apparatus. In another optional implementation, the communication apparatus includes a processing unit (sometimes also referred to as a processing module) and a transceiver unit (sometimes also referred to as a transceiver module). For an implementation of the transceiver unit, refer to related descriptions in the fourth aspect.

In an optional implementation, the communication apparatus further includes a storage unit, and the processing unit is configured to be coupled to the storage unit, and execute a program or instructions in the storage unit, to enable the communication apparatus to perform the method in the second aspect.

According to a sixth aspect, a communication apparatus is provided. The communication apparatus may be a device configured to perform the method in the foregoing fourth aspect. The communication apparatus has a function of the device configured to perform the method in the foregoing third aspect. The communication apparatus is, for example, a terminal device, or a functional module in a terminal device, for example, a baseband apparatus, a chip system, or the like. Alternatively, the communication apparatus is, for example, an access network device, or a functional module in an access network device, for example, a baseband apparatus, a chip system, or the like. In an optional implementation, the communication apparatus includes a baseband apparatus and a radio frequency apparatus. In another optional implementation, the communication apparatus includes a processing unit (sometimes also referred to as a processing module) and a transceiver unit (sometimes also referred to as a transceiver module). For an implementation of the transceiver unit, refer to related descriptions in the fourth aspect.

In an optional implementation, the communication apparatus further includes a storage unit, and the processing unit is configured to be coupled to the storage unit, and execute a program or instructions in the storage unit, to enable the communication apparatus to perform the method in the third aspect.

According to a seventh aspect, a computer-readable storage medium is provided. The computer-readable storage medium is configured to store a computer program or instructions. When the computer program or the instructions is/are run, the method performed by the terminal device or the access network device in the foregoing aspects is implemented.

According to an eighth aspect, a computer program product including instructions is provided. When the instructions are run on a computer, the method in the foregoing aspects is implemented.

According to a ninth aspect, an apparatus is provided, including one or more units configured to perform the method in any embodiment of this application.

According to a tenth aspect, a communication system is provided, including the communication apparatus in the fourth aspect and the communication apparatus in the fifth aspect.

According to an eleventh aspect, a communication system is provided, including the communication apparatus in the fourth aspect and the communication apparatus in the sixth aspect.

BRIEF DESCRIPTION OF DRAWINGS

FIG. 6 is a schematic diagram of a joint source and channel decoding process according to an embodiment of this application;

FIG. 7 is a flowchart of a second information processing method according to an embodiment of this application;

FIG. 8 is a schematic diagram of a structure of a joint check matrix according to an embodiment of this application;

DESCRIPTION OF EMBODIMENTS

Figure 1:
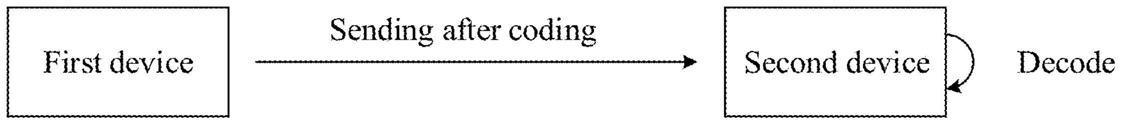
FIG. 1 is a schematic diagram of an application scenario according to an embodiment of this application.

To make objectives, technical solutions, and advantages of embodiments of this application clearer, the following further describes embodiments of this application in detail with reference to the accompanying drawings.

The following describes some terms or concepts in embodiments of this application, to facilitate understanding by a person skilled in the art.

In embodiments of this application, a terminal device is a device with a wireless transceiver function, and may be a fixed device, a mobile device, a handheld device (for example, a mobile phone), a wearable device, an in-vehicle device, or a wireless apparatus (for example, a communication module, a modem, or a chip system) built in the foregoing device. The terminal device is configured to connect people, things, machines, and the like, and may be widely used in various scenarios, for example, including, but not limited to, the following scenarios: cellular communication, device-to-device communication (D2D), vehicle to everything (V2X), machine-to-machine/machine-type communication (M2M/MTC), internet of things (IoT), virtual reality (VR), augmented reality (AR), industrial control (industrial control), self driving (self driving), remote medical (remote medical), smart grid (smart grid), smart furniture, smart office, smart wearables, smart transportation, smart city (smart city), drones, and robots. The terminal device may be sometimes referred to as user equipment (UE), a terminal, an access station, a UE station, a remote station, a wireless communication device, a user apparatus, or the like. For ease of description, in embodiments of this application, the terminal device being UE is used as an example for description.

A network device in embodiments of this application may include, for example, an access network device and/or a core network device. The access network device is a device having a wireless transceiver function, and is configured to communicate with the terminal device. The access network device includes, but is not limited to, a base station (base transceiver station (BTS), a NodeB, an eNodeB/eNB, or a gNodeB/gNB), a transmission reception point (TRP), a base station evolved after the 3$^{rd}$ generation partnership project (3GPP), an access node in a wireless fidelity (Wi-Fi) system, a wireless relay node, a wireless backhaul node, and the like. The base station may be a macro base station, a micro base station, a pico base station, a small cell, a relay station, or the like. A plurality of base stations may support networks using a same access technology, or may support networks using different access technologies. The base station may include one or more co-site or non-co-site transmission reception points. The access network device may be alternatively a radio controller, a central unit (CU), and/or a distributed unit (DU) in a cloud radio access network (CRAN) scenario. The access network device may be alternatively a server or the like. For example, a network device in a vehicle to everything (V2X) technology may be a road side unit (RSU). The following uses an example in which the access network device is a base station for description. The base station may communicate with a terminal device, or may communicate with a terminal device via a relay station. The terminal device may communicate with a plurality of base stations in different access technologies. The core network device is configured to implement functions such as mobility management, data processing, session management, and policy and charging. Names of devices that implement core network functions in systems of different access technologies may be different. This is not limited in embodiments of this application. Using a 5G system as an example, the core network device includes an access and mobility management function (AMF), a session management function (SMF), a policy control function (PCF), a user plane function (UPF), or the like.

In embodiments of this application, a communication apparatus configured to implement a function of the network device may be a network device, or may be an apparatus, for example, a chip system, that can support the network device in implementing the function. The apparatus may be installed in the network device. In the technical solutions provided in embodiments of this application, an example in which the apparatus configured to implement the function of the network device is a network device is used for describing the technical solutions provided in embodiments of this application.

In embodiments of this application, unless otherwise specified, a quantity of nouns indicates "a singular noun or a plural noun", namely, "one or more". "At least one" means one or more, and "a plurality of" means two or more. "And/or" describes an association relationship between associated objects and represents that three relationships may exist. For example, A and/or B may represent the following three cases: Only A exists, both A and B exist, and only B exists. A and B may be singular or plural. The character "/" usually indicates an "or" relationship between the associated objects. For example, A/B indicates A or B. "At least one of the following items (pieces)" or a similar expression thereof refers to any combination of these items, including any combination of singular items (pieces) or plural items (pieces). For example, at least one item (piece) of a, b, or c indicates a, b, c, a and b, a and c, b and c, or a, b, and c, where a, b, and c may be singular or plural.

Ordinal numerals such as "first" and "second" mentioned in embodiments of this application are used to distinguish between a plurality of objects, and are not intended to limit sizes, content, a sequence, a time sequence, priorities, importance degrees, or the like of the plurality of objects. For example, first information and second information may be same information or may be different information. In addition, the names do not indicate a difference between content, application scenarios, priorities, importance degrees, or the like of the two pieces of information. In addition, step numbers in embodiments described in this application are merely used to distinguish between different steps, but are not used to limit a sequence of the steps. For example, S201 may occur before S202, or may occur after S202, or may occur at the same time with S202.

In embodiments of this application, a source coding matrix may be determined based on a channel coding basis matrix, which is equivalent to determining source coding information based on channel coding information, to implement joint source and channel coding. Through the joint source and channel coding, a quantity of output bits of source coding can match a quantity of input bits of channel coding, so that the technical solutions in embodiments of this application can be adapted to a 5G NR system.

The technical solutions provided in embodiments of this application may be applied to a 4$^{th}$ generation mobile communication technology (4G) system, for example, a long term evolution (LTE) system, or may be applied to a 5G system, for example, a new radio (NR) system, or may be applied to a next generation mobile communication system or another similar communication system. This is not specifically limited. In addition, the technical solutions provided in embodiments of this application may be applied to a device-to-device (D2D) scenario, for example, an NR-D2D scenario, or may be applied to a vehicle to everything (V2X) scenario, for example, an NR-V2X scenario, for example, may be applied to an internet of vehicles, for example, V2X, vehicle-to-vehicle (V2V), or may be applied to fields such as intelligent driving, assisted driving, intelligent and connected vehicles, or the like. If the technical solutions are applied to a D2D scenario, both communication parties may be UEs. If the technical solutions are applied to a non-D2D scenario, one communication party may be UE, and the other communication party may be a network device (for example, an access network device or a core network device), or both communication parties may be network devices. Alternatively, either or both of the two communication parties may be electronic devices of other types than a network device and a terminal device. In the following description process, an example in which two communication parties are respectively a first device and a second device is used. The first device is, for example, a terminal device, a network device, or an electronic device of another type, and the second device is, for example, a terminal device, a network device, or an electronic device of another type.

FIG. 1 shows a communication network architecture according to an embodiment of this application. All subsequent embodiments are applicable to the architecture. The first device can communicate with the second device. For example, the first device is a data transmitting end, and the second device is a data receiving end. When sending data, the first device may perform operations such as source coding and channel coding on the data. After receiving data from the first device, the second device may perform operations such as joint source and channel decoding on the data.

To better describe embodiments of this application, the following describes a method provided in embodiments of this application with reference to the accompanying drawings. In the accompanying drawings corresponding to embodiments of this application, all optional steps are represented by dashed lines.

Figure 2:
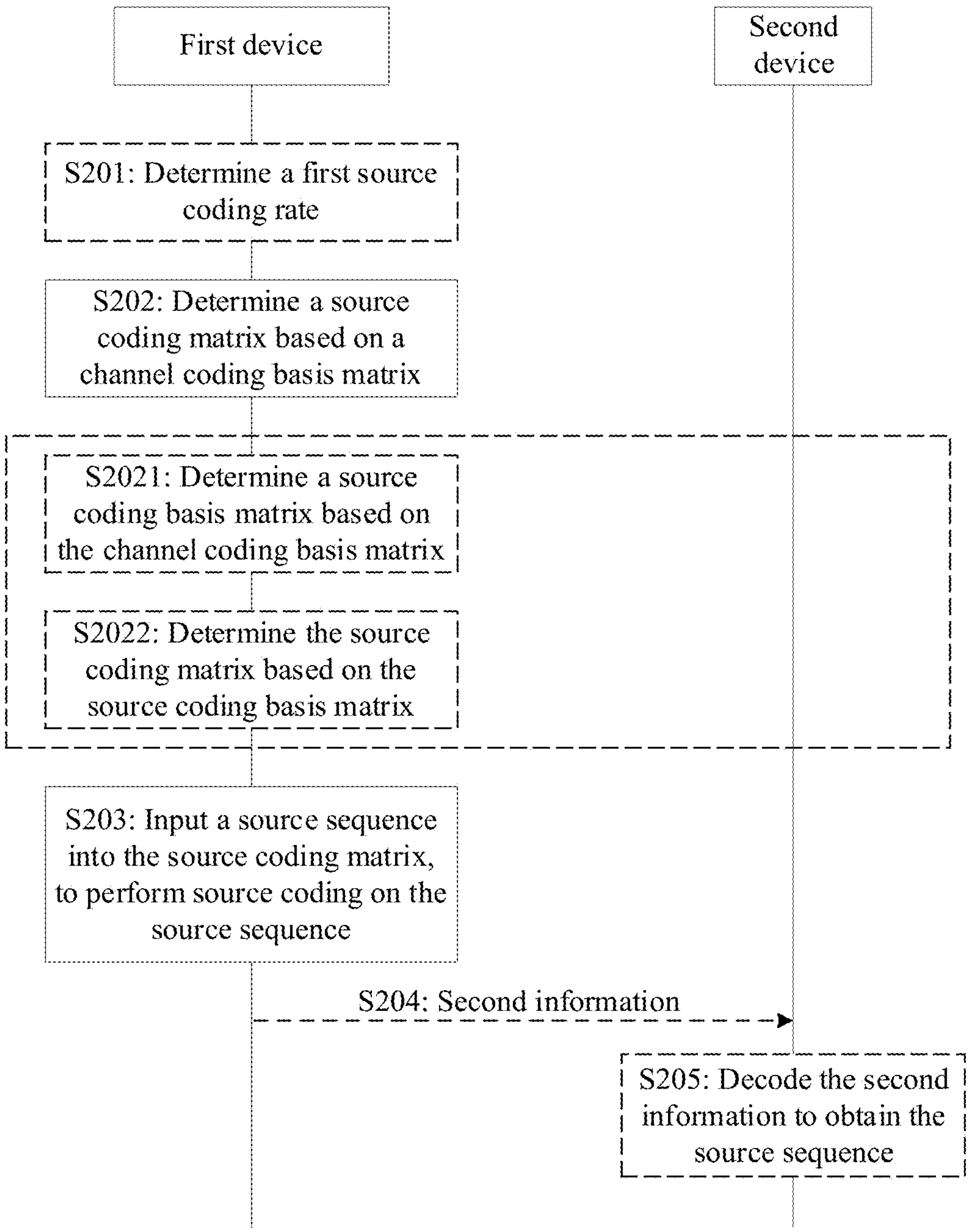
FIG. 2 is a flowchart of a first information processing method according to an embodiment of this application.

An embodiment of this application provides a first information processing method. FIG. 2 is a flowchart of the method. The method may be applied to the network architecture shown in FIG. 1. For example, a first device used in the method is the first device in FIG. 1, and a second device used in the method is the second device in FIG. 1.

S201: The first device determines a first source coding rate.

Optionally, the first device may determine a source coding rate of a source sequence based on a corresponding feature of the source sequence, that is, determine the first source coding rate. The source sequence is original data to be sent by the first device. The first device needs to perform processing such as source coding and channel coding on the source sequence, and then sends the processed source sequence to the second device. For example, the source sequence is represented as $c_0, c_1, \ldots, c_{N-1}$. N represents a length of the source sequence, and subscripts of characters used to represent the source sequence are integers from 0 to N−1, and are sequentially increased by 1. N is a positive integer.

Optionally, the feature of the source sequence includes, for example, an entropy rate and a source code length (where the source code length is also referred to as a code length for short in embodiments of this application) of the source sequence. In this case, the first device may determine the first source coding rate based on the entropy rate and the code length of the source sequence. In embodiments of this application, the source coding rate may also be referred to as a code rate for short, and the entropy rate of the source sequence may be referred to as a source entropy rate, or referred to as an entropy rate for short.

After obtaining the source sequence, the first device may evaluate the entropy rate of the source sequence. For example, the entropy rate of the source sequence is represented as H. In addition, the first device can further determine the code length of the source sequence. For example, the code length of the source sequence is related to N. For example, after obtaining the entropy rate and the code length of the source sequence, the first device may determine the first source coding rate by querying first information. Optionally, the first information includes a correspondence between a source coding rate and an entropy rate, or the first information includes a correspondence between a source coding rate and a source code length, or the first information includes a correspondence among a source coding rate, a source code length, and an entropy rate. Considering that there is a correspondence between a source code length and a lifting size (lifting size), the first information may alternatively include a correspondence among a source coding rate, a lifting size, and an entropy rate. Alternatively, the first information may include a correspondence among a source coding rate, a source code length, a lifting size, and an entropy rate. After obtaining the entropy rate and the code length of the source sequence, the first device may determine the source coding rate of the source sequence from the first information, that is, determine the first source coding rate. For example, the first information includes a correspondence among a source coding rate, a source code length, and an entropy rate, or the first information includes a correspondence among a source coding rate, a source code length, a lifting size, and an entropy rate. After obtaining the entropy rate and the code length of the source sequence, the first device may directly determine the first source coding rate from the first information. Alternatively, the first information includes a correspondence among a source coding rate, a lifting size, and an entropy rate. After obtaining the entropy rate and the code length of the source sequence, the first device may determine a lifting size based on the code length of the source sequence, and then may determine the first source coding rate based on the first information.

For example, the first information is presented in a form of a table, or may be presented in another form. For example, the first information is presented in a form of a table. Table 1 is an example of the first information.

TABLE 1

| | Source entropy rate H processed by the source coding rate | |
|---|---|---|
| Source coding rate $R_{sc}$ | Short code length ($40 \le Z_c < 160$) | Long code length ($Z_c \ge 160$) |
| 22/46 | H ≤ 0.3469 | H ≤ 0.3546 |
| 22/45 | 0.3469 < H ≤ 0.3508 | 0.3546 < H ≤ 0.3584 |
| 22/44 | 0.3508 < H ≤ 0.3546 | 0.3584 < H ≤ 0.3640 |
| 22/43 | 0.3546 < H ≤ 0.3584 | 0.3640 < H ≤ 0.3696 |
| 22/42 | 0.3584 < H ≤ 0.3640 | 0.3696 < H ≤ 0.3752 |
| 22/41 | 0.3640 < H ≤ 0.3696 | 0.3752 < H ≤ 0.3807 |
| 22/40 | 0.3696 < H ≤ 0.3752 | 0.3807 < H ≤ 0.3861 |
| 22/39 | 0.3752 < H ≤ 0.3807 | 0.3861 < H ≤ 0.3915 |
| 22/38 | 0.3807 < H ≤ 0.3861 | 0.3915 < H ≤ 0.3968 |
| 22/37 | 0.3861 < H ≤ 0.3915 | 0.3968 < H ≤ 0.4021 |
| 22/36 | 0.3915 < H ≤ 0.3968 | 0.4021 < H ≤ 0.4091 |
| 22/35 | 0.3968 < H ≤ 0.4021 | 0.4091 < H ≤ 0.4161 |
| 22/34 | 0.4021 < H ≤ 0.4091 | 0.4161 < H ≤ 0.4298 |
| 22/33 | 0.4091 < H ≤ 0.4161 | 0.4298 < H ≤ 0.4464 |
| 22/32 | 0.4161 < H ≤ 0.4298 | 0.4464 < H ≤ 0.4658 |
| 22/31 | 0.4298 < H ≤ 0.4464 | 0.4658 < H ≤ 0.4999 |
| 22/30 | 0.4464 < H ≤ 0.4658 | 0.4999 < H ≤ 0.5293 |
| 22/29 | 0.4658 < H ≤ 0.4999 | 0.5293 < H ≤ 0.5710 |
| 22/28 | 0.4999 < H ≤ 0.5351 | 0.5710 < H ≤ 0.5972 |
| 22/27 | 0.5351 < H ≤ 0.5842 | 0.5972 < H ≤ 0.6343 |

A row in Table 1 is considered as one entry, and the first information may include only one or more entries in Table 1; or the first information includes one or more entries in Table 1, and further includes another entry; or the first information does not include all entries in Table 1, but includes another entry. It can be learned from Table 1 that the first information provided in embodiments of this application includes a large quantity of source coding rates. For example, the first information is Table 1, and the quantity of source coding rates included in the first information is greater than 6. Therefore, a granularity of the source coding rate provided by the first information is finer. The first device has high flexibility in selecting a source coding rate, and can select an appropriate source coding rate based on the entropy rate and the source code length of the source sequence, to improve flexibility and accuracy of code rate selection.

In Table 1, $Z_c$ represents the lifting size, and $R_{sc}$ represents the code rate. If the lifting size is greater than or equal to 40 and less than 160, the corresponding code length is considered as a short code length. If the lifting size is greater than or equal to 160, the corresponding code length is considered as a long code length. For example, if the first device determines that the entropy rate H is less than or equal to 0.3469 and the source code length is a short code length or determines that the entropy rate H is less than or equal to 0.3469 and the lifting size is greater than or equal to 40 and less than 160, it may be determined, according to Table 1, that the corresponding code rate is 22/46.

The first device needs to process the source sequence. For example, in a processing manner, the source sequence is processed based on a source coding matrix, and a process of the processing is considered as a process of coding and compressing the source sequence. Bits output by the source coding matrix may be used as input bits in a channel coding process, and then the first device performs processing such as channel coding on the bits output by the source coding matrix. The compression performed on the source sequence based on the source coding matrix is a lossy compression when an LDPC is used as source code. Through tests, different source code rates, source code lengths, or source entropy rates affect the height of an error floor (error floor) of the LDPC used as the source code. In conclusion, when a source code rate and a source code length are fixed, a higher source entropy rate indicates a more serious error floor; when a source entropy rate and a source code length are fixed, a higher source code rate indicates a more serious error floor; or when a source entropy rate and a source code rate are fixed, an increase in a source code length can alleviate an error floor. To ensure effectiveness of source coding, embodiments of this application provide that, when the source entropy rate is fixed, the source code rate is made as high as possible on the premise that the error floor phenomenon is within an acceptable range, to reduce a waste of coding resources as much as possible. For example, if the source code rate is closer to the source entropy rate, source compression coding is more effective, and fewer coding resources are wasted. With reference to Table 1, in a case of a short code length, when the entropy rate H is 0.3508, a corresponding code length is 22/45. 22/45 is approximately equal to 0.48, and has a small difference from 0.3508, so that it may be considered that the two are close. It can be learned that source compression coding can be more effective by using the first information provided in embodiments of this application.

Table 1 is obtained in a plurality of manners. For example, one manner is that a code rate of channel coding is fixed. Based on this, a source coding rate and a lifting size are given, and a corresponding source coding matrix can be obtained. The source coding matrix is used in a joint source and channel coding/decoding system provided in embodiments of this application, bit error rates (BERs) of the source coding matrix in different signal-to-noise ratios are obtained through simulation at a specific source entropy rate, and an error floor of the source coding matrix is evaluated. If the error floor is low, the source entropy rate is increased within an acceptable range to determine whether the source coding matrix can process a source sequence with a higher entropy rate. After a plurality of times of similar processing, Table 1 can be obtained by combining different source code lengths and the highest entropy rates that can be processed by the source coding matrices corresponding to the source code rates.

Alternatively, the first device may not perform a process of determining the first source coding rate, but directly applies the first source coding rate. Therefore, S201 is an optional step.

S202: The first device determines a source coding matrix based on a channel coding basis matrix.

For example, the first device may first determine a source coding basis matrix based on the channel coding basis matrix, and then determine the source coding matrix based on the source coding basis matrix. The following describes the two steps separately.

S2021: The first device determines the source coding basis matrix based on the channel coding basis matrix.

The channel coding basis matrix is information related to a channel coding process, and is equivalent to source coding information determined by the first device based on channel coding information, so that the channel coding process matches a source coding process, and the technical solutions in embodiments of this application can be adapted to a 5G NR system.

Optionally, in addition to the channel coding basis matrix, the first device may further refer to the first source coding rate when determining the source coding matrix. In other words, the first device may determine the source coding matrix based on the first source coding rate and the channel coding basis matrix. Correspondingly, in an implementation in which the first device determines the source coding basis matrix based on the channel coding basis matrix, the first device may determine the source coding basis matrix based on the first source coding rate and the channel coding basis matrix. The first device determines the source coding basis matrix based on the first source coding rate and the channel coding basis matrix. For example, in a determining process, the first device processes a first channel coding basis matrix to obtain the source coding basis matrix. The processing manner includes, for example, transposition and/or pruning, and if the processing manner includes transposition and pruning, a sequence between the two steps of transposition and pruning is not limited. The first channel coding basis matrix is used in this determining process. Optionally, the determining process may further include a step of obtaining the first channel coding basis matrix by the first device. The first device needs to obtain the first channel coding basis matrix. For example, in an obtaining manner, the first device determines a set index to which a lifting size corresponding to the first source coding rate belongs, and then determines a matrix corresponding to the set index. The matrix may be used as the first channel coding basis matrix. The first channel coding basis matrix may be represented as $H_{cc\_BG}$. For example, the first device may query third information, and determine, from the third information, a set index to which a lifting size corresponding to the first source coding rate belongs. The first device then queries fourth information, and determines, from the fourth information, a matrix corresponding to the set index. The matrix may be used as the first channel coding basis matrix $H_{cc\_BG}$.

Optionally, the third information is presented, for example, in a form of a table. For example, the third information may include one or more entries of the following Table 2. A row in Table 2 is considered as one entry.

TABLE 2

| Set index ($i_{LS}$) | Lifting size ($Z_c$) |
|---|---|
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

For example, if the lifting size corresponding to the first source coding rate is 2, it may be determined, according to Table 2, that the set index to which the lifting size belongs is 0.

Alternatively, the third information may be presented in another form, or even if the third information is presented in a form of a table, the third information may be presented in another table than Table 2.

Optionally, the fourth information is presented, for example, in a form of a table. For example, the fourth information may include one or more entries of the following Table 3. A row in Table 3 is considered as one entry.

TABLE 3

| $H_{cc\_BG}$ | | $V_{i,j}$ Set index $i_{LS}$ of a lifting size | | | | | | | |
|---|---|---|---|---|---|---|---|---|---|
| Row number i | Column number j | 0 | 1 | 2 | 3 | 4 | 5 | 6 | 7 |
| 0 | 0 | 250 | 307 | 73 | 223 | 211 | 294 | 0 | 135 |
| | 1 | 69 | 19 | 15 | 16 | 198 | 118 | 0 | 227 |
| | 2 | 226 | 50 | 103 | 94 | 188 | 167 | 0 | 126 |
| | 3 | 159 | 369 | 49 | 91 | 186 | 330 | 0 | 134 |
| | 5 | 100 | 181 | 240 | 74 | 219 | 207 | 0 | 84 |
| | 6 | 10 | 216 | 39 | 10 | 4 | 165 | 0 | 83 |
| | 9 | 59 | 317 | 15 | 0 | 29 | 243 | 0 | 53 |
| | 10 | 229 | 288 | 162 | 205 | 144 | 250 | 0 | 225 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 288 | 261 | 46 | 256 | 338 | 0 | 22 |
| | 5 | 71 | 144 | 161 | 119 | 160 | 268 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 207 | 258 | 226 | 132 | 189 |
| | 1 | 111 | 250 | 7 | 203 | 167 | 35 | 37 | 4 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |

TABLE 3-continued

| $H_{cc\_BG}$ | | $V_{i,j}$ Set index $i_{LS}$ of a lifting size | | | | | | | |
|---|---|---|---|---|---|---|---|---|---|
| Row number i | Column number j | 0 | 1 | 2 | 3 | 4 | 5 | 6 | 7 |
| | 6 | 93 | 161 | 227 | 186 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 24 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 96 |
| | 18 | 205 | 240 | 246 | 117 | 269 | 163 | 179 | 125 |
| | 19 | 25 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 246 | 231 | 253 | 213 | 57 | 345 | 154 | 22 |
| | 13 | 219 | 341 | 164 | 147 | 36 | 269 | 87 | 24 |
| | 14 | 21 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 157 | 332 | 233 | 170 | 246 | 42 | 24 | 64 |
| | 1 | 102 | 181 | 205 | 10 | 235 | 256 | 204 | 211 |
| | 26 | 0 | 0 | 0 | 0 | 0 | 0 | 0 | 0 |
| 5 | 0 | 205 | 195 | 83 | 164 | 261 | 219 | 185 | 2 |
| | 1 | 236 | 14 | 292 | 59 | 181 | 130 | 100 | 171 |
| | 3 | 194 | 115 | 50 | 86 | 72 | 251 | 24 | 47 |
| | 12 | 231 | 166 | 318 | 80 | 283 | 322 | 65 | 143 |
| | 16 | 28 | 241 | 201 | 182 | 254 | 295 | 207 | 210 |
| | 21 | 123 | 51 | 267 | 130 | 79 | 258 | 161 | 180 |
| | 22 | 115 | 157 | 279 | 153 | 144 | 283 | 72 | 180 |
| | 27 | 0 | 0 | 0 | 0 | 0 | 0 | 0 | 0 |
| 6 | 0 | 183 | 278 | 289 | 158 | 80 | 294 | 6 | 199 |
| | 6 | 22 | 257 | 21 | 119 | 144 | 73 | 27 | 22 |
| | 10 | 28 | 1 | 293 | 113 | 169 | 330 | 163 | 23 |
| | 11 | 67 | 351 | 13 | 21 | 90 | 99 | 50 | 100 |
| | 13 | 244 | 92 | 232 | 63 | 59 | 172 | 48 | 92 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 108 | 305 | 91 | 13 |
| | 28 | 0 | 0 | 0 | 0 | 0 | 0 | 0 | 0 |
| 7 | 0 | 220 | 9 | 12 | 17 | 169 | 3 | 145 | 77 |
| | 1 | 44 | 62 | 88 | 76 | 189 | 103 | 88 | 146 |
| | 4 | 159 | 316 | 207 | 104 | 154 | 224 | 112 | 209 |
| | 7 | 31 | 333 | 50 | 100 | 184 | 297 | 153 | 32 |
| | 8 | 167 | 290 | 25 | 150 | 104 | 215 | 159 | 166 |
| | 14 | 104 | 114 | 76 | 158 | 164 | 39 | 76 | 18 |
| | 29 | 0 | 0 | 0 | 0 | 0 | 0 | 0 | 0 |
| 8 | 0 | 112 | 307 | 295 | 33 | 54 | 348 | 172 | 18 |
| | 1 | 4 | 179 | 133 | 95 | 0 | 75 | 2 | 105 |
| | 3 | 7 | 165 | 130 | 4 | 252 | 22 | 131 | 141 |
| | 12 | 211 | 18 | 231 | 217 | 41 | 312 | 141 | 223 |
| | 16 | 102 | 39 | 296 | 204 | 98 | 224 | 96 | 177 |
| | 19 | 164 | 224 | 110 | 39 | 46 | 17 | 99 | 145 |
| | 21 | 109 | 368 | 269 | 58 | 15 | 59 | 101 | 199 |
| | 22 | 241 | 67 | 245 | 44 | 230 | 314 | 35 | 153 |
| | 24 | 90 | 170 | 154 | 201 | 54 | 244 | 116 | 38 |
| | 30 | 0 | 0 | 0 | 0 | 0 | 0 | 0 | 0 |
| 9 | 0 | 103 | 366 | 189 | 9 | 162 | 156 | 6 | 169 |
| | 1 | 182 | 232 | 244 | 37 | 159 | 88 | 10 | 12 |
| | 10 | 109 | 321 | 36 | 213 | 93 | 293 | 145 | 206 |

TABLE 3-continued

| $H_{cc\_BG}$ | | $V_{i,j}$ Set index $i_{LS}$ of a lifting size | | | | | | | |
|---|---|---|---|---|---|---|---|---|---|
| Row number i | Column number j | 0 | 1 | 2 | 3 | 4 | 5 | 6 | 7 |
| | 11 | 21 | 133 | 286 | 105 | 134 | 111 | 53 | 221 |
| | 13 | 142 | 57 | 151 | 89 | 45 | 92 | 201 | 17 |
| | 17 | 14 | 303 | 267 | 185 | 132 | 152 | 4 | 212 |
| | 18 | 61 | 63 | 135 | 109 | 76 | 23 | 164 | 92 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 98 | 101 | 14 | 82 | 178 | 175 | 126 | 116 |
| | 2 | 149 | 339 | 80 | 165 | 1 | 253 | 77 | 151 |
| | 4 | 167 | 274 | 211 | 174 | 28 | 27 | 156 | 70 |
| | 7 | 160 | 111 | 75 | 19 | 267 | 231 | 16 | 230 |
| | 8 | 49 | 383 | 161 | 194 | 234 | 49 | 12 | 115 |
| | 14 | 58 | 354 | 311 | 103 | 201 | 267 | 70 | 84 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 229 | 142 | 225 | 123 | 6 | 186 |
| | 1 | 42 | 186 | 235 | 175 | 162 | 217 | 20 | 215 |
| | 10 | 21 | 174 | 169 | 136 | 244 | 142 | 203 | 124 |
| | 11 | 32 | 232 | 48 | 3 | 151 | 110 | 153 | 180 |
| | 13 | 234 | 50 | 105 | 28 | 238 | 176 | 104 | 98 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 56 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 178 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 40 | 241 | 229 | 90 | 170 | 176 | 173 | 39 |
| | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 81 | 182 | 173 |
| | 18 | 75 | 55 | 184 | 209 | 68 | 176 | 53 | 142 |
| | 25 | 179 | 269 | 51 | 81 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 181 | 6 | 0 | 110 | 6 | 108 |
| | 7 | 72 | 344 | 101 | 103 | 118 | 147 | 166 | 159 |
| | 8 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |
| | 22 | 160 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 64 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 166 | 0 | 255 | 74 | 141 |
| | 7 | 116 | 383 | 96 | 65 | 0 | 111 | 16 | 11 |
| | 14 | 182 | 312 | 46 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |
| 28 | 0 | 128 | 222 | 11 | 146 | 275 | 102 | 4 | 32 |
| | 4 | 165 | 19 | 293 | 153 | 0 | 1 | 1 | 43 |
| | 19 | 181 | 244 | 50 | 217 | 155 | 40 | 40 | 200 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 86 | 252 | 27 | 150 | 0 | 273 | 92 | 232 |
| | 14 | 236 | 5 | 308 | 11 | 180 | 104 | 136 | 32 |
| | 18 | 84 | 147 | 117 | 53 | 0 | 243 | 106 | 118 |
| | 25 | 6 | 78 | 29 | 68 | 42 | 107 | 6 | 103 |
| | 51 | 0 | 0 | 0 | 0 | 0 | 0 | 0 | 0 |
| 30 | 0 | 216 | 159 | 91 | 34 | 0 | 171 | 2 | 170 |
| | 10 | 73 | 229 | 23 | 130 | 90 | 16 | 88 | 199 |
| | 13 | 120 | 260 | 105 | 210 | 252 | 95 | 112 | 26 |
| | 24 | 9 | 90 | 135 | 123 | 173 | 212 | 20 | 105 |
| | 52 | 0 | 0 | 0 | 0 | 0 | 0 | 0 | 0 |
| 31 | 1 | 95 | 100 | 222 | 175 | 144 | 101 | 4 | 73 |
| | 7 | 177 | 215 | 308 | 49 | 144 | 297 | 49 | 149 |
| | 22 | 172 | 258 | 66 | 177 | 166 | 279 | 125 | 175 |
| | 25 | 61 | 256 | 162 | 128 | 19 | 222 | 194 | 108 |
| | 53 | 0 | 0 | 0 | 0 | 0 | 0 | 0 | 0 |
| 32 | 0 | 221 | 102 | 210 | 192 | 0 | 351 | 6 | 103 |
| | 12 | 112 | 201 | 22 | 209 | 211 | 265 | 126 | 110 |
| | 14 | 199 | 175 | 271 | 58 | 36 | 338 | 63 | 151 |
| | 24 | 121 | 287 | 217 | 30 | 162 | 83 | 20 | 211 |
| | 54 | 0 | 0 | 0 | 0 | 0 | 0 | 0 | 0 |
| 33 | 1 | 2 | 323 | 170 | 114 | 0 | 56 | 10 | 199 |
| | 2 | 187 | 8 | 20 | 49 | 0 | 304 | 30 | 132 |
| | 11 | 41 | 361 | 140 | 161 | 76 | 141 | 6 | 172 |
| | 21 | 211 | 105 | 33 | 137 | 18 | 101 | 92 | 65 |
| | 55 | 0 | 0 | 0 | 0 | 0 | 0 | 0 | 0 |

TABLE 3-continued

| $H_{cc\_BG}$ Row number i | Column number j | $V_{i,j}$ Set index $i_{LS}$ of a lifting size 0 | 1 | 2 | 3 | 4 | 5 | 6 | 7 |
|---|---|---|---|---|---|---|---|---|---|
| 34 | 0 | 127 | 230 | 187 | 82 | 197 | 60 | 4 | 161 |
| | 7 | 167 | 148 | 296 | 186 | 0 | 320 | 153 | 237 |
| | 15 | 164 | 202 | 5 | 68 | 108 | 112 | 197 | 142 |
| | 17 | 159 | 312 | 44 | 150 | 0 | 54 | 155 | 180 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 269 | 298 | 81 | 72 | 319 | 82 | 59 |
| | 13 | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 167 | 185 | 151 | 123 | 190 | 164 | 91 | 121 |
| | 9 | 151 | 177 | 179 | 90 | 0 | 196 | 64 | 90 |
| | 10 | 157 | 289 | 64 | 73 | 0 | 209 | 198 | 26 |
| | 12 | 163 | 214 | 181 | 10 | 0 | 246 | 100 | 140 |
| | 60 | 0 | 0 | 0 | 0 | 0 | 0 | 0 | 0 |
| 39 | 1 | 173 | 258 | 102 | 12 | 153 | 236 | 4 | 115 |
| | 3 | 139 | 93 | 77 | 77 | 0 | 264 | 28 | 188 |
| | 7 | 149 | 346 | 192 | 49 | 165 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 149 | 113 | 226 | 114 | 27 | 288 | 163 | 222 |
| | 4 | 157 | 14 | 65 | 91 | 0 | 83 | 10 | 170 |
| | 24 | 137 | 218 | 126 | 78 | 35 | 17 | 162 | 71 |
| | 64 | 0 | 0 | 0 | 0 | 0 | 0 | 0 | 0 |
| 43 | 1 | 151 | 113 | 228 | 206 | 52 | 210 | 1 | 22 |
| | 16 | 163 | 132 | 69 | 22 | 243 | 3 | 163 | 127 |
| | 18 | 173 | 114 | 176 | 134 | 0 | 53 | 99 | 49 |
| | 25 | 139 | 168 | 102 | 161 | 270 | 167 | 98 | 125 |
| | 65 | 0 | 0 | 0 | 0 | 0 | 0 | 0 | 0 |
| 44 | 0 | 139 | 80 | 234 | 84 | 18 | 79 | 4 | 191 |
| | 7 | 157 | 78 | 227 | 4 | 0 | 244 | 6 | 211 |
| | 9 | 163 | 163 | 259 | 9 | 0 | 293 | 142 | 187 |
| | 22 | 173 | 274 | 260 | 12 | 57 | 272 | 3 | 148 |
| | 66 | 0 | 0 | 0 | 0 | 0 | 0 | 0 | 0 |
| 45 | 1 | 149 | 135 | 101 | 184 | 168 | 82 | 181 | 177 |
| | 6 | 151 | 149 | 228 | 121 | 0 | 67 | 45 | 114 |
| | 10 | 167 | 15 | 126 | 29 | 144 | 235 | 153 | 93 |
| | 67 | 0 | 0 | 0 | 0 | 0 | 0 | 0 | 0 |

Alternatively, the fourth information may be presented in another form, or even if the fourth information is presented in a form of a table, the fourth information may be presented in another table than Table 3.

Figure 3A:
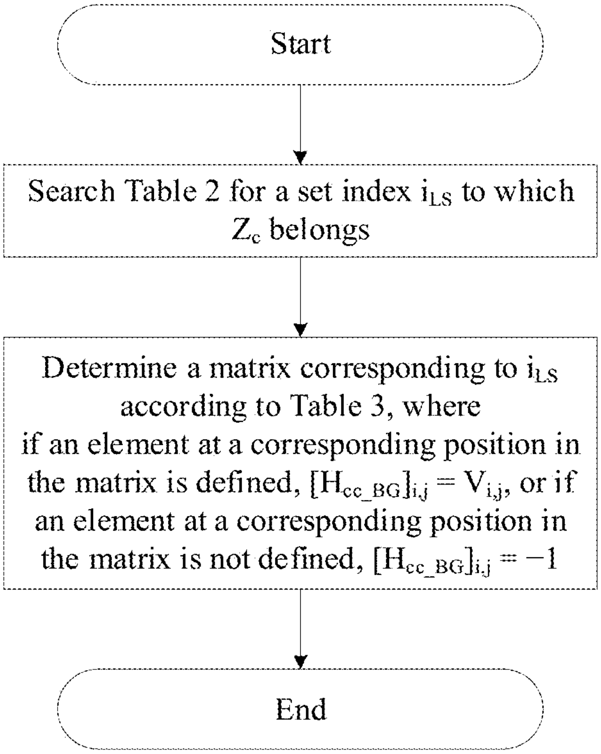
FIG. 3A is a flowchart of determining a first channel coding basis matrix by a first device according to an embodiment of this application.

FIG. 3A is a flowchart in which the first device determines the first channel coding basis matrix according to Table 2 and Table 3. For example, the first device queries Table 2 for a set index to which a lifting size corresponding to the first source coding rate belongs. For example, the lifting size is represented as $Z_c$, and the set index is represented as $i_{LS}$. The first device then determines, according to Table 3, a matrix corresponding to $i_{LS}$, and the matrix may be used as the first channel coding basis matrix $H_{cc\_BG}$. For elements in $H_{cc\_BG}$, some elements may have been defined in Table 3, and some elements may not be defined in Table 3. If an element in $H_{cc\_BG}$ has been defined in Table 3, a value of the element is $V_{i,j}$, that is, $[H_{cc\_BG}]_{i,j}=V_{i,j}$, and $[H_{cc\_BG}]_{i,j}$ represents an element in an $i^{th}$ row and a $j^{th}$ column of $H_{cc\_BG}$. $V_{i,j}$ is also defined in Table 3. Alternatively, if an element in $H_{cc\_BG}$ is not defined in Table 3, a value of the element is −1, that is, $[H_{cc\_BG}]_{i,j}=-1$. A value assignment process of $H_{cc\_BG}$ is a process of obtaining the first channel coding basis matrix. After a value is assigned to $H_{cc\_BG}$, the first device obtains the first channel coding basis matrix.

As described above, after determining the first channel coding basis matrix, the first device may perform processing such as transposition and/or pruning on the first channel coding basis matrix, to obtain the source coding basis matrix. There may be several cases in which the first device performs processing such as transposition and/or pruning on the first channel coding basis matrix. For example, in Case 1, the first device first transposes the first channel coding basis matrix, and an obtained matrix is referred to as a second channel coding basis matrix; and then the first device prunes the second channel coding basis matrix (for example, prunes rows and/or columns of the second channel coding basis matrix), to obtain the source coding basis matrix. For another example, in Case 2, the first device first prunes the first channel coding basis matrix (for example, prunes rows and/or columns of the first channel coding basis matrix), and an obtained matrix is referred to as a third channel coding basis matrix; and then the first device transposes the third channel coding basis matrix, to obtain the source coding basis matrix. For another example, in Case 3, the first device prunes the first channel coding basis matrix (for example, prunes rows and/or columns of the first channel coding basis matrix) to obtain the source coding basis matrix. In this case, no transposition is required, and a processing process can be simplified. The following describes these cases through examples.

1. Case 1: To be specific, the first device first transposes the first channel coding basis matrix to obtain the second channel coding basis matrix; and then the first device prunes the second channel coding basis matrix (for example, prunes rows and/or columns of the second channel coding basis matrix), to obtain the source coding basis matrix.

The first device first determines the first channel coding basis matrix. After determining the first channel coding basis matrix, the first device transposes the first channel coding basis matrix to obtain the second channel coding basis matrix. For example, the second channel coding basis matrix is represented as $H_{sc1\_BG}$, and $H_{sc1\_BG}$ is, for example, a matrix of 68 rows and 46 columns.

Next, the first device prunes rows and/or columns of the second channel coding basis matrix to obtain the source coding basis matrix.

That the first device prunes rows of the second channel coding basis matrix means that the first device selects some rows from the second channel coding basis matrix. That the first device prunes columns of the second channel coding basis matrix means that the first device selects some columns from the second channel coding basis matrix. The first device may prune only rows of the second channel coding basis matrix, and a quantity of columns remains unchanged; or the first device may prune only columns of the second channel coding basis matrix, and a quantity of rows remains unchanged; or the first device prunes both rows and columns of the second channel coding basis matrix. Specifically, how to perform pruning may be determined based on factors such as performance of an actual coding/decoding system or adaptability between embodiments of this application and a 5G NR system. The following uses an example in which the first device prunes both rows and columns of the second channel coding basis matrix for description.

The second channel coding basis matrix includes a large quantity of rows. However, the technical solutions provided in embodiments of this application are expected to be applied to a 5G NR system. In the 5G NR system, a quantity of input bits in a channel coding process is small. Therefore, the first device may select rows for the second channel coding basis matrix, that is, select some rows of the second channel coding basis matrix, so that a quantity of remaining rows of the second channel coding basis matrix can match the quantity of input bits in the channel coding process in the 5G NR system. Optionally, the quantity of remaining rows of the second channel coding basis matrix may be equal to the quantity of input bits in the channel coding process in the 5G NR system. For example, if the quantity of input bits in the channel coding process in the 5G NR system is 22, in embodiments of this application, the first device may select 22 rows from the second channel coding basis matrix, so that in embodiments of this application, a quantity of output bits in the source coding process is equal to the quantity of input bits in the channel coding process, and embodiments of this application can be applied to the 5G NR system. If the quantity of input bits in the channel coding process in the 5G NR system changes, for example, changes to another value than 22, the quantity of remaining rows of the second channel coding basis matrix may also change accordingly.

Figure 3B:
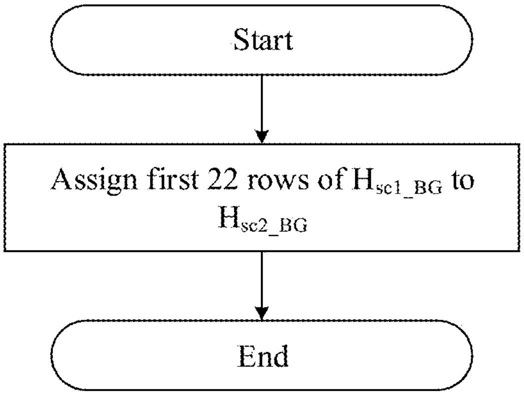
FIG. 3B is a flowchart of selecting the first $N_1$ rows from a second channel coding basis matrix by a first device according to an embodiment of this application.

For example, the first device needs to select $N_1$ rows from the second channel coding basis matrix. $N_1$ is a positive integer less than or equal to a total quantity of rows of the second channel coding basis matrix. For example, $N_1$ is determined based on the quantity of input bits in the channel coding process, and for example, $N_1$ is 22, or may be another value, provided that $N_1$ can match the quantity of input bits in the channel coding process. In a manner of selecting $N_1$ rows, for example, the first device may select the first $N_1$ rows of the second channel coding basis matrix, for example, a $0^{th}$ row to an $(N_1-1)^{th}$ row of the second channel coding basis matrix. In this selection manner, the selected matrix may have good performance. In addition, the first device may further select $N_1$ rows in another manner. For example, the first device may select the last $N_1$ rows of the second channel coding basis matrix, or the first device may randomly select $N_1$ rows from the second channel coding basis matrix. The first device selects $N_1$ rows from the second channel coding basis matrix. The $N_1$ rows may form a matrix, for example, referred to as a fourth channel coding basis matrix. The fourth channel coding basis matrix is, for example, represented as $H_{sc2\_BG}$. For example, if the second channel coding basis matrix is a matrix of 68 rows and 46 columns, the fourth channel coding basis matrix is, for example, a matrix of $N_1$ rows and 46 columns. For example, FIG. 3B shows a procedure in which the first device selects the first $N_1$ rows from the second channel coding basis matrix, and in FIG. 3B, $N_1$=22 is used as an example. The first device assigns first 22 rows of the second channel coding basis matrix $H_{sc1\_BG}$ to $H_{sc2\_BG}$, to obtain the fourth channel coding basis matrix.

If the first device needs to prune only rows of the second channel coding basis matrix, and does not need to prune columns, $H_{sc2\_BG}$ is the obtained source coding basis matrix. If needing to prune both rows and columns of the second channel coding basis matrix, the first device may continue to perform the following steps.

The first device may determine a quantity of columns that need to be reserved. For example, the first device may determine, based on the first source coding rate, the quantity of columns that need to be reserved. $N_2$ is used to represent the quantity of columns that need to be reserved, and $N_2$ is a positive integer less than or equal to a total quantity of columns of the second channel coding basis matrix. For example, if $R_{sc}$ represents the first source coding rate, an optional manner of determining $N_2$ based on the first source coding rate is $$N_2 = \frac{N_3}{R_{SC}}.$$

In LDPC coding of 5G, a quantity of columns of a channel coding basis matrix is usually 46. Therefore, optionally, $N_2$ may be less than or equal to 46. In another aspect, because the source code rate is less than 1, if $N_2$ is excessively small, a compression capability of source coding may be excessively low, and actual application significance is lost. Therefore, $N_2$ may be greater than 22. In this case, optionally, in embodiments of this application, $N_2$ is an integer greater than 22 and less than or equal to 46. Alternatively, to improve the compression capability of source coding, $N_2$ may be set to an integer greater than or equal to 27 and less than or equal to 46. Alternatively, $N_2$ may be another value.

If the first device has pruned rows of the second channel coding basis matrix, when the first device prunes columns, the first device prunes the fourth channel coding basis matrix, and $N_3$ represents a quantity of rows of the fourth channel coding basis matrix, that is, $N_3=N_1$. Alternatively, if the first device does not prune rows of the second channel coding basis matrix, for example, the first device does not need to prune rows, or the first device first prunes columns and then prunes rows, when pruning columns, the first device prunes the second channel coding basis matrix, and $N_3$ represents a quantity of rows of the second channel coding basis matrix.

Figure 3C:
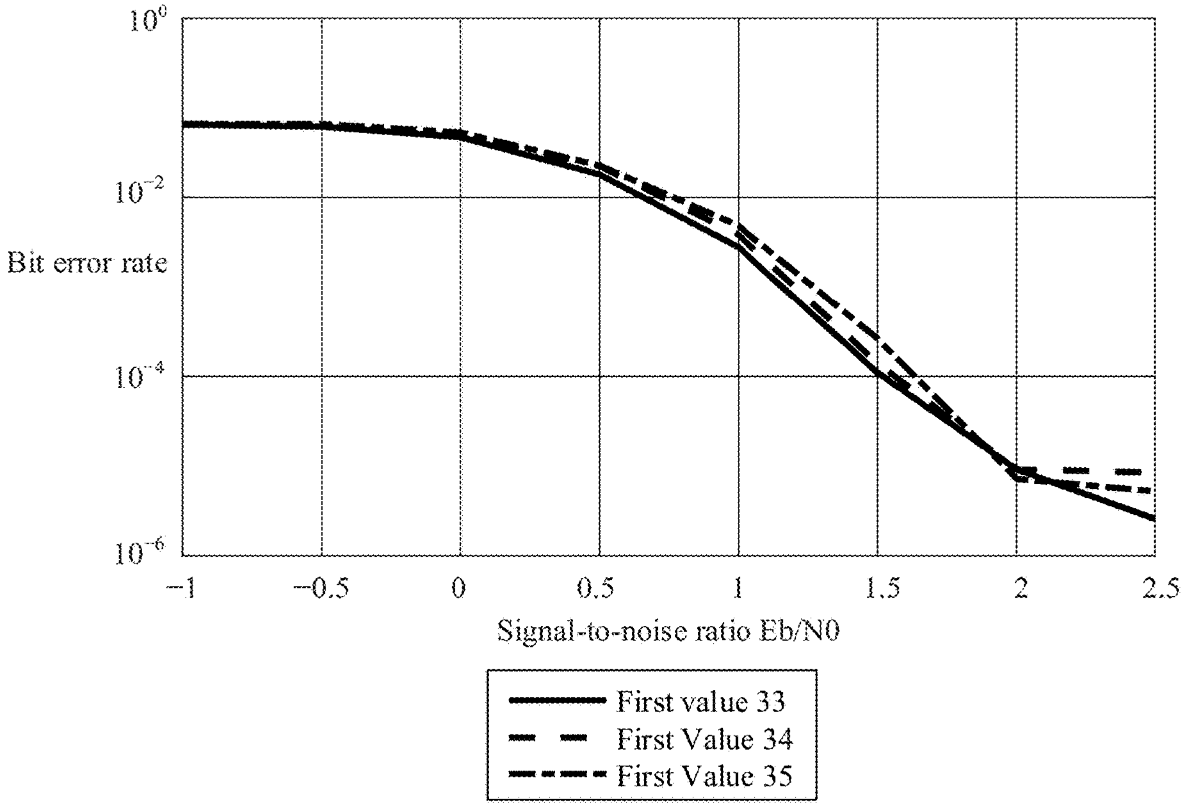
FIG. 3C to FIG. 3H are schematic diagrams of several types of performance when first values are different according to an embodiment of this application.
Figure 3D:
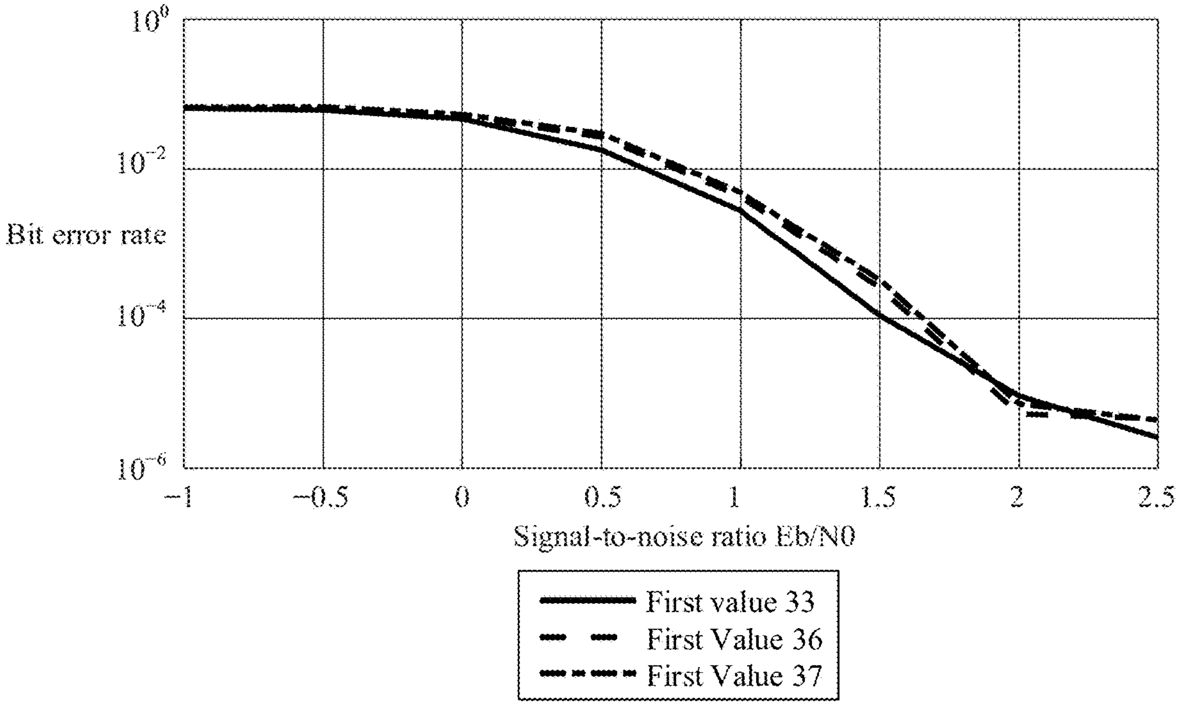
Figure 3E:
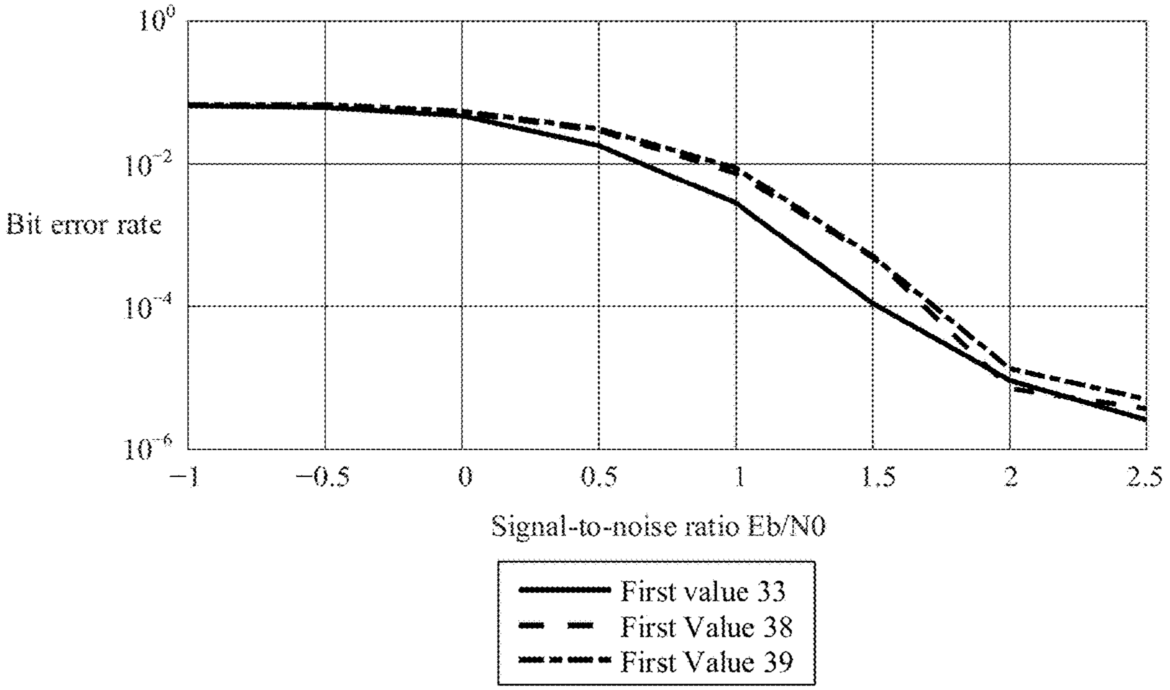
Figure 3F:
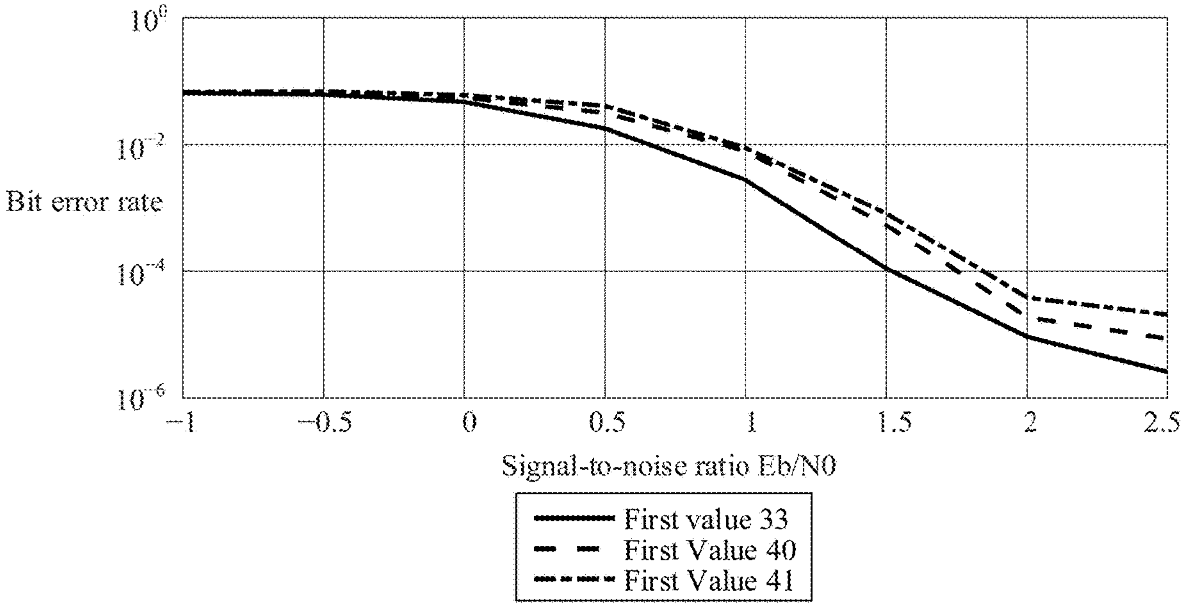
Figure 3G:
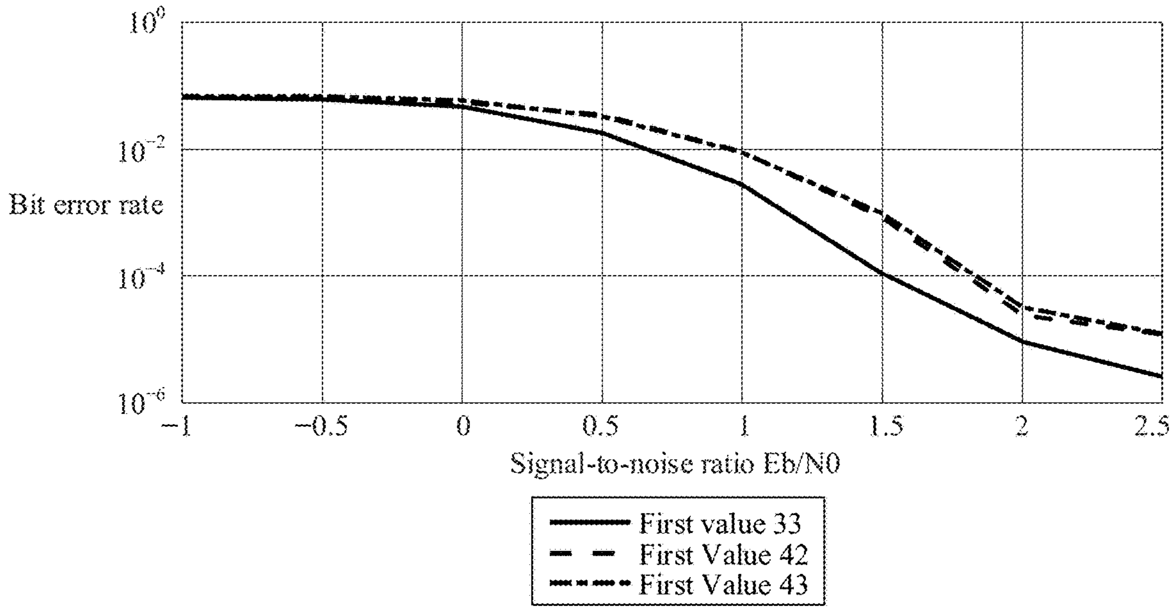
Figure 3H:
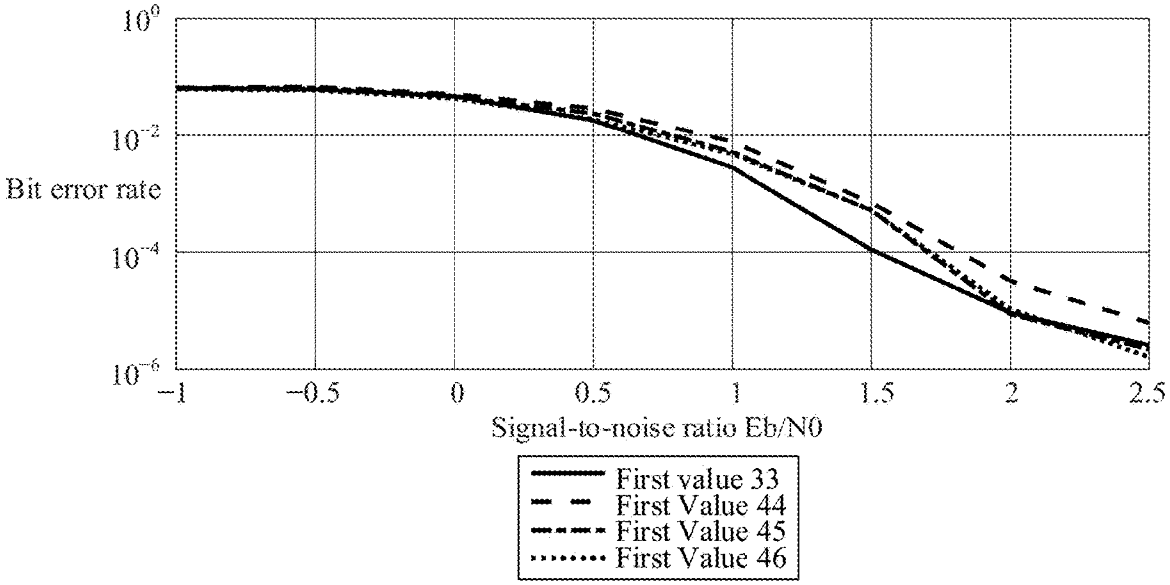

That the first device prunes columns of the second channel coding basis matrix is used as an example. Optionally, if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{th}$ column of the second channel coding basis matrix. Selection of the first value may affect performance of a double LDPC system. Optionally, the first value is an integer greater than or equal to 27 and less than or equal to 46. For example, the first value is 33, or may be another value. Through tests, when the first value is 33, the performance of the double LDPC system provided in embodiments of this application is good; when the first value is 34, 35, 36, or 37, the performance of the double LDPC system provided in embodiments of this application is slightly worse than that when the first value is 33; and when the first value is greater than 37, the performance of the double LDPC system provided in embodiments of this application may be poor. The first value is not supposed to be excessively small. For example, when the first value is less than 33, the first value can only be significant only at a high source code rate. FIG. 3C to FIG. 3H are schematic diagrams of the performance of the double LDPC system provided in embodiments of this application when different first values are used. FIG. 3C includes three lines. A first value corresponding to the solid line is 33, a first value corresponding to the dashed line with a sparse granularity is 34, and a first value corresponding to the dashed line with a dense granularity is 35. FIG. 3D includes three lines. A first value corresponding to the solid line is 33, a first value corresponding to the dashed line with a sparse granularity is 36, and a first value corresponding to the dashed line with a dense granularity is 37. FIG. 3E includes three lines. A first value corresponding to the solid line is 33, a first value corresponding to the dashed line with a sparse granularity is 38, and a first value corresponding to the dashed line with a dense granularity is 39. FIG. 3F includes three lines. A first value corresponding to the solid line is 33, a first value corresponding to the dashed line with a sparse granularity is 40, and a first value corresponding to the dashed line with a dense granularity is 41. FIG. 3G includes three lines. A first value corresponding to the solid line is 33, a first value corresponding to the dashed line with a sparse granularity is 42, and a first value corresponding to the dashed line with a dense granularity is 43. FIG. 3H includes four lines. A first value corresponding to the solid line is 33, a first value corresponding to the dashed line with a sparse granularity is 44, a first value corresponding to the dashed line with a dense granularity is 45, and a first value corresponding to the dotted line is 46. It can be seen from FIG. 3C to FIG. 3H that, the performance of the double LDPC system provided in embodiments of this application is good when the first value is 33.

Figure 3I:
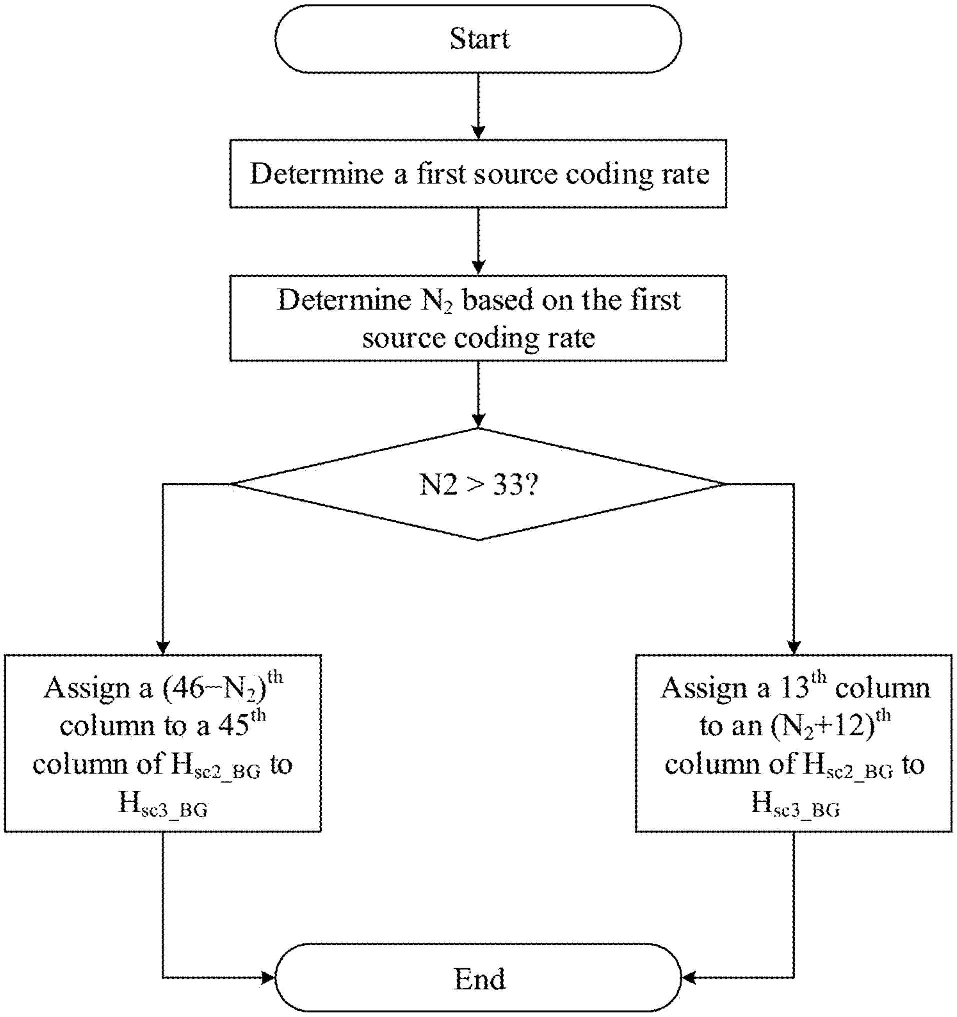
FIG. 3I is a flowchart of pruning, by a first device, a column quantity of a fourth channel coding basis matrix according to an embodiment of this application.

The $N_2$ columns are selected in this manner, so that the performance of a matrix formed by the selected $N_2$ columns is good. Alternatively, the first device may prune columns of the second channel coding basis matrix in another manner. For example, the first device may select the first $N_2$ columns or the last $N_2$ columns of the second channel coding basis matrix, or the first device may randomly select $N_2$ columns from the second channel coding basis matrix. If the first device prunes the fourth channel coding basis matrix, a pruning manner is also similar. A matrix obtained by the first device by pruning columns of the second channel coding basis matrix or columns of the fourth channel coding basis matrix may be referred to as a fifth channel coding basis matrix, and the fifth channel coding basis matrix may be represented as $H_{sc3\_BG}$. FIG. 3I shows a procedure in which the first device prunes columns of the fourth channel coding basis matrix. In FIG. 3I, an example in which the first value is equal to 33 is used. It can be learned from FIG. 3I that, after the first device determines $N_2$, if $N_2>33$, the first device assigns a $(46-N_2)^{th}$ column to a $45^{th}$ column of the fourth channel coding basis matrix $H_{sc2\_BG}$ to $H_{sc3\_BG}$; or if $N_2<33$, the first device assigns a $13^{th}$ column to an $(N_2+12)^{th}$ column of the fourth channel coding basis matrix $H_{sc2\_BG}$ to $H_{sc3\_BG}$.

If the first device only needs to prune columns of the second channel coding basis matrix and does not need to prune rows, or the first device needs to prune rows and columns and prunes rows before columns, $H_{sc3\_BG}$ is the obtained source coding basis matrix. Alternatively, if the first device needs to prune both rows and columns of the second channel coding basis matrix and prunes columns before rows, after obtaining $H_{sc3\_BG}$, the first device may prune rows of $H_{sc3\_BG}$, and a matrix obtained through pruning may be used as the source coding basis matrix.

For example, the second channel coding basis matrix is a matrix of 68 rows and 46 columns. The first device prunes rows of the second channel coding basis matrix to obtain a fourth channel coding basis matrix of $N_1$ rows and 46 columns. The first device then further prunes columns of the fourth channel coding basis matrix to obtain a source coding basis matrix of $N_1$ rows and $N_2$ columns. For example, the source coding basis matrix is represented as $H_{sc\_BG}$.

2. Case 2: To be specific, the first device first prunes the first channel coding basis matrix (for example, prunes rows and/or columns of the first channel coding basis matrix) to obtain the third channel coding basis matrix; and then the first device transposes the third channel coding basis matrix to obtain the source coding basis matrix.

The first device first obtains the first channel coding basis matrix, and then prunes rows and/or columns of the first channel coding basis matrix to obtain the third channel coding basis matrix.

For the pruning of rows and/or columns of the first channel coding basis matrix by the first device, refer to the foregoing descriptions of content of pruning the second channel coding basis matrix by the first device in Case 1. A difference is that in Case 2, when the first device prunes rows of the first channel coding basis matrix, refer to a manner of pruning columns of the second channel coding basis matrix by the first device in Case 1; and when the first device prunes columns of the first channel coding basis matrix, refer to a manner of pruning rows of the second channel coding basis matrix by the first device in Case 1. For example, in Case 2, if the first device prunes rows of the first channel coding basis matrix, the first device needs to select $N_2$ rows from the first channel coding basis matrix. For a selection manner, refer to the descriptions of selecting $N_2$ columns in Case 1. If the first device prunes columns of the first channel coding basis matrix, the first device needs to select $N_1$ columns from the first channel coding basis matrix. For a selection manner, refer to the descriptions of selecting $N_1$ rows in Case 1.

The first device obtains the third channel coding basis matrix after pruning rows and/or columns of the first channel coding basis matrix. The first device then transposes the third channel coding basis matrix to obtain the source coding basis matrix. For example, if the first device prunes both rows and columns of the first channel coding basis matrix, the third channel coding basis matrix is a matrix of $N_2$ rows and $N_1$ columns, and the source coding basis matrix is a matrix of $N_1$ rows and $N_2$ columns. For example, the source coding basis matrix is represented as $H_{sc\_BG}$.

3. Case 3: To be specific, the first device prunes the first channel coding basis matrix (for example, prunes rows and/or columns of the first channel coding basis matrix) to obtain the source coding basis matrix.

For the pruning of rows and/or columns of the first channel coding basis matrix by the first device, refer to the foregoing descriptions of content of pruning the second channel coding basis matrix by the first device in Case 1. Similar to Case 1, in Case 3, if the first device prunes rows of the first channel coding basis matrix, the first device needs to select $N_1$ rows from the first channel coding basis matrix. For a selection manner, refer to the descriptions of selecting $N_1$ rows in Case 1. If the first device prunes columns of the first channel coding basis matrix, the first device needs to select $N_2$ columns from the first channel coding basis matrix. For a selection manner, refer to the descriptions of selecting $N_2$ columns in Case 1. The first device obtains the source coding basis matrix after pruning rows and/or columns of the first channel coding basis matrix. For example, if the first device prunes both rows and columns of the first channel coding basis matrix, the source coding basis matrix is a matrix of $N_1$ rows and $N_2$ columns. For example, the source coding basis matrix is represented as $H_{sc\_BG}$.

In addition to the foregoing three cases, the first device may further obtain the source coding basis matrix in another manner. This is not limited in embodiments of this application.

It can be learned that in embodiments of this application, the first device determines the source coding basis matrix based on the channel coding basis matrix, so that joint source and channel coding is implemented, and a quantity of output bits in a source coding process can match a quantity of input bits in a channel coding process, so that the technical solutions provided in embodiments of this application can be adapted to a 5G NR system.

S2022: The first device determines the source coding matrix based on the source coding basis matrix.

For example, the first device may perform a repetition-interleaving operation based on the source coding basis matrix, to obtain the source coding matrix. The repetition-interleaving refers to a process of generating the source coding matrix based on the source coding basis matrix.

Figure 4:
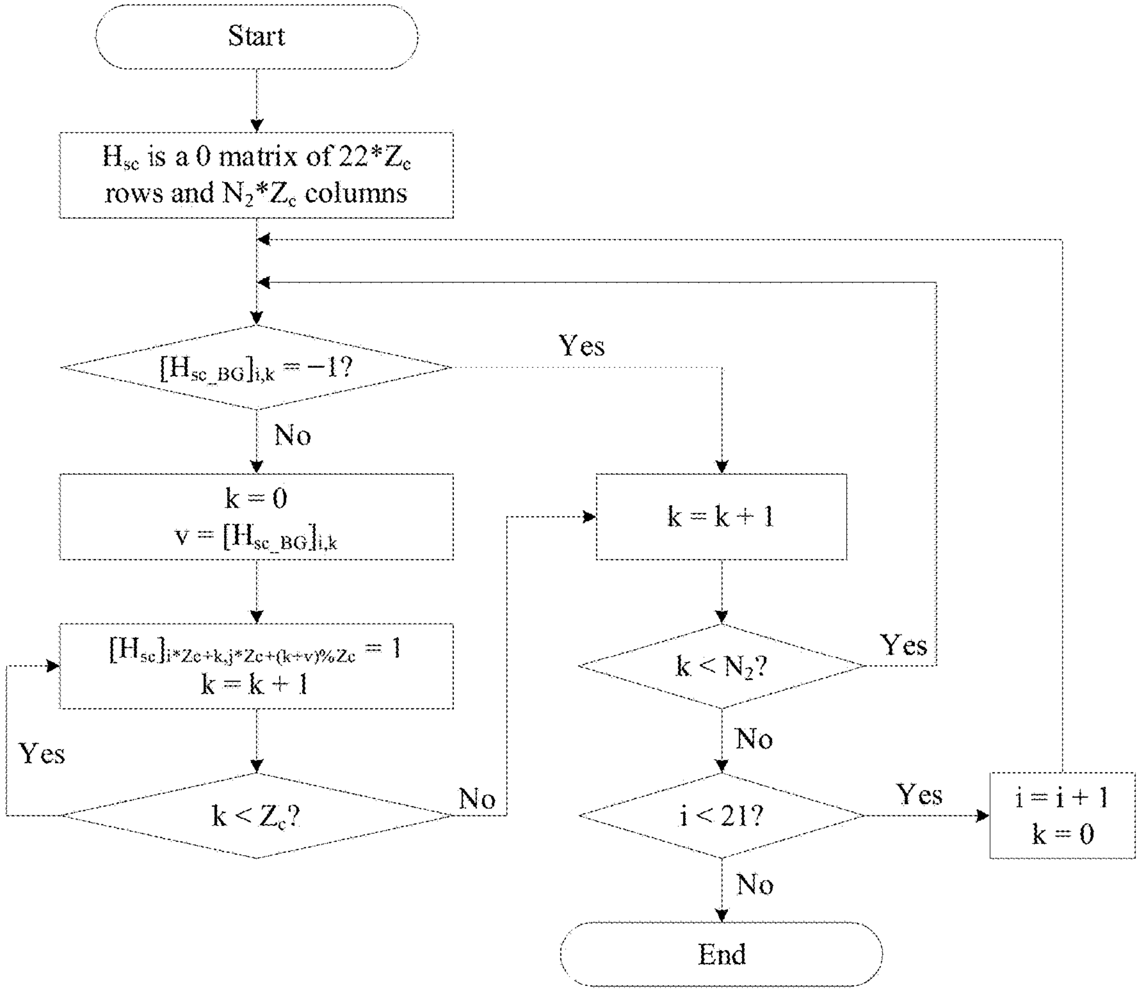
FIG. 4 is a flowchart of a repetition-interleaving process according to an embodiment of this application.

For example, the source coding matrix is represented as $H_{sc}$. A repetition-interleaving process is a process of generating the source coding matrix $H_{sc}$ with a dimension of $(N_1 \times Z_c)$ rows and $(N_2 \times Z_c)$ columns based on a source coding basis matrix $H_{sc\_BG}$ with a dimension of $N_1$ rows and $N_2$ columns. $Z_c$ represents the lifting size corresponding to the first source coding rate. For example, each element in the source coding basis matrix $H_{sc\_BG}$ corresponds to each square matrix with a size of $Z_c \times Z_c$ in the source coding matrix $H_{sc}$. If a value of an element in the source coding basis matrix $H_{sc\_BG}$ is −1, a square matrix corresponding to the element in the source coding matrix $H_{sc}$ is a 0 square matrix. If a value of an element in the source coding basis matrix $H_{sc\_BG}$ is a nonnegative integer v, a square matrix corresponding to the element in the source coding matrix $H_{sc}$ is a square matrix obtained by cyclically shifting an identity matrix right v times. FIG. 4 is a flowchart of a repetition-interleaving process. FIG. 4 uses $N_1=22$ as an example.

As can be learned from FIG. 4, it is assumed that $H_{sc\_BG}$ is initially a 0 matrix of $(22 \times Z_c)$ rows and $(N_2 \times Z_c)$ columns, and values start to be assigned to the 0 matrix subsequently. For a source coding basis matrix $H_{sc\_BG}$ of 22 rows and $N_2$ columns, it may be determined whether a value of an element in an $i^{th}$ row and a kth column of the source coding basis matrix is −1. $[H_{sc\_BG}]_{i,k}$ represents the element in the $i^{th}$ row and the kth column of $H_{sc\_BG}$. If the value of the element is −1, a quantity of columns is increased by 1. If the quantity of columns plus 1 is less than $N_2$, it continues to be determined whether a value of an element in the $i^{th}$ row and a $(k+1)^{th}$ column is −1. If the quantity of columns plus 1 is equal to $N_2$, it is determined whether a quantity of rows is less than 21. If the quantity of rows is less than 21, the quantity of rows is increased by 1, and it continues to be determined whether a value of an element in an $(i+1)^{th}$ row and the $(k+1)^{th}$ column is −1. If the quantity of rows is equal to 21, the procedure ends. In addition, if $[H_{sc\_BG}]_{i,k}$ is not equal to −1, for example, is equal to v, a $0^{th}$ row of the identity matrix corresponding to the square matrix corresponding to $[H_{sc\_BG}]_{i,k}$ in the source coding matrix $H_{sc}$ is cyclically shifted right a total of v times, and then a $1^{st}$ row of the identity matrix is cyclically shifted right v times, and the rest is deduced by analogy, until the last row of the identity matrix is cyclically shifted right v times. After the last row of the identity matrix is cyclically shifted right v times, 1 is added to k. If k plus 1 is less than $N_2$, it continues to be determined whether a value of an element in the $i^{th}$ row and the $(k+_1)^{th}$ column is −1. If k plus 1 is equal to $N_2$, it is determined whether a current quantity of rows is less than 21. If the current quantity of rows is less than 21, the quantity of rows is increased by 1, and it continues to be determined whether a value of an element in the $(i+1)^{th}$ row and the $(k+1)^{th}$ column is −1. If the current quantity of rows is equal to 21, the procedure ends.

S203: The first device inputs a source sequence into the source coding matrix, to perform source coding on the source sequence.

For example, the source sequence is $c_0, c_1, \ldots, c_{N-1}$. After the source coding matrix performs coding compression on the source sequence, the bits output by the source coding matrix are represented as $d_0, d_1, \ldots, d_{S-1}$. A quantity N of input bits of the source coding matrix may be equal to $N_2 \times Z_c$. S represents a quantity of the bits output by the source coding matrix, and is also a quantity of rows of the source coding matrix, in other words, a height of the source coding matrix. For example, $S=N_1 \times Z_c$. The source sequence is processed based on the source coding matrix, and the process may be represented as $[d_0, d_1, \ldots, d_{S-1}]^T=H_{SC}[c_0, c_1, \ldots, c_{N-1}]^T$. T represents the transposition.

The bits output by the source coding matrix may further be used as input bits in a channel coding process, that is, the first device further needs to perform channel coding on the bits output by the source coding matrix. For example, the first device may input the bits output by the source coding matrix into a first matrix, and a process in which the first matrix processes these bits is a process of performing channel coding on these bits. The first matrix may also be referred to as, for example, a channel generator matrix, or a channel coding matrix, or may have another name. The first matrix is, for example, determined based on a channel coding basis matrix (for example, the first channel coding basis matrix) and a lifting size corresponding to the channel coding process. Optionally, during channel coding, the lifting size corresponding to the channel coding process may be the same as a lifting size corresponding to the source coding process (that is, the lifting size corresponding to the first source coding rate). In addition, in embodiments of this application, the source coding matrix is obtained based on the channel coding basis matrix. Therefore, an output dimension of the source coding matrix may be equal to an input dimension of the channel generator matrix. In this way, the technical solutions in embodiments of this application can be applied to a 5G NR system.

Optionally, the first device may directly use the bits output by the source coding matrix as input bits in the channel coding process; or the first device may process, based on a second matrix, the bits output by the source coding matrix, and then use the processed bits as input bits in the channel coding process. For example, the first device shuffles, based on the second matrix, the bits output by the source coding matrix, and then uses the shuffled bits as the input bits in the channel coding process. A manner in which the first device obtains the second matrix is described in the embodiment in FIG. 7. Although the embodiment in FIG. 7 describes the manner in which the second device obtains the second matrix, manners in which the first device and the second device obtain the second matrix may be the same.

For example, information output in the channel coding process is referred to as second information.

S204: The first device sends second information. Correspondingly, the second device receives the second information from the first device.

After obtaining the second information, the first device may send the second information to the second device. Optionally, the first device may further perform processing such as scrambling and constellation mapping on the second information, and then send the second information. This is not limited in embodiments of this application.

In addition, optionally, in addition to sending the second information to the second device, the first device may further send auxiliary information to the second device, to help the second device decode the second information. For example, the auxiliary information includes one or more of the first source coding rate, a channel coding rate (that is, a channel coding rate corresponding to a source sequence of the first device) corresponding to the second information, or the lifting size. For example, the auxiliary information includes the first source coding rate. Optionally, the first device may send the first source coding rate to the second device based on physical layer control information, a media access control (MAC) control element (CE), or radio resource control (RRC) signaling.

For example, the auxiliary information includes the first source coding rate and both the first device and the second device pre-store source coding matrices corresponding to different source coding rates, and/or store channel generator matrices (which may also be referred to as channel coding matrices or the like, and are also referred to as first matrices in embodiments of this application) corresponding to different channel coding rates. When sending data to the second device, the first device may indicate, in the control information for scheduling the data, information related to a source coding rate and/or a channel coding rate. The second device determines, based on the control information, a source coding matrix and/or a channel generator matrix used by the first device, to further obtain a joint check matrix.

Alternatively, a protocol may define a procedure of generating the source coding matrix and/or the channel generator matrix based on the source coding rate. The second device may obtain, based on information related to the source coding rate (for example, indicating the first source coding rate) indicated by the first device and according to a generation procedure, the source coding matrix and/or the channel generator matrix used by the first device.

Alternatively, the first device may send one or more of the source coding matrix, the channel generator matrix, or the joint check matrix to the second device. However, this manner requires high overheads.

S205: The second device decodes the second information to obtain the source sequence. In an ideal case, the source sequence obtained by the second device and the source sequence processed by the first device are supposed to be a same sequence.

For example, the second device performs joint source and channel decoding on the second information. The following briefly describes a decoding process.

When the second information arrives at the second device, due to interference, the second device needs to first determine whether the received information is 0 or 1, in other words, needs to determine a probability of the received information being 0 (P0) and a probability of the received information being 1 (P1).

$$LLR = \ln\frac{P0}{P1} \qquad \text{(Formula 1)}$$

In Formula 1, the log-likelihood ratio (log-likelihood ratio, LLR) is a value obtained by dividing the probability of the received information being 0 by the probability of the received information being 1 and then taking a logarithm of the obtained result. Optionally, in embodiments of this application, for a source variable node, an initial LLR may be set to:

$$LLR = \ln\left(\frac{1-P1}{P1}\right) \qquad \text{(Formula 2)}$$

In Formula 2, P1 is, for example, source prior information.

A process of joint source and channel decoding usually includes a plurality of iterations, and the LLR is updated in each iteration. One iteration includes two sub-processes: LLR update of a check node and LLR update of a variable node. In a subprocess of updating an LLR of the check node, which variable nodes are connected to one check node needs to be specified. In a subprocess of updating an LLR of the variable node, which check nodes are connected to one variable node need to be specified. A connection relationship that needs to be specified between the check node and the variable node may be determined based on the joint check matrix.

Figure 5A:
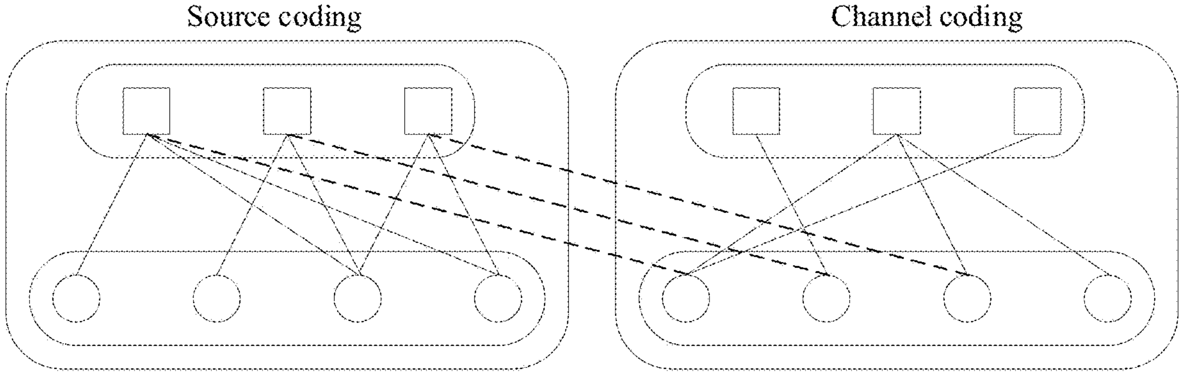
FIG. 5A is a schematic diagram of a connection relationship between a check node and a variable node according to an embodiment of this application.

An element of the joint check matrix includes two values: "0" and "1". The matrix usually has more "0s" than "Is". If a value of an element in the joint check matrix is "1", it indicates that a check node represented by a row in which the element is located is connected to a variable node represented by a column in which the element is located. FIG. 5A is a schematic diagram of a connection relationship between a check node and a variable node. The check node may include a source check node and a channel check node, and the variable node may include a source variable node and a channel variable node. In FIG. 5A, three square nodes shown in the left half represent three source check nodes, four circular nodes shown in the left half represent four source variable nodes, three square nodes shown in the right half represent three channel check nodes, and four circular nodes shown in the right half represent four channel variable nodes. In FIG. 5A, the solid line represents a connection between a source check node and a source variable node, or represents a connection between a channel check node and a channel variable node; and a dashed line represents a connection between a node in a channel coding process and a node in a source coding process. The following briefly describes an iterative process of joint source and channel decoding.

Figure 5B:
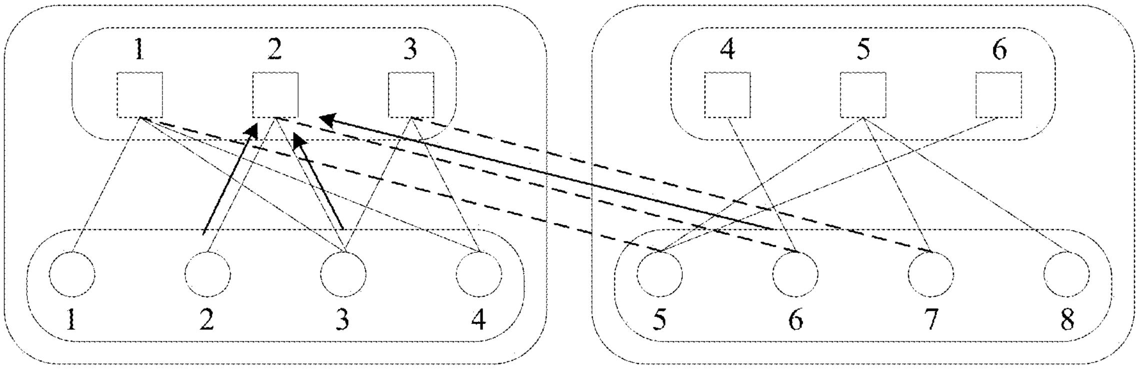
FIG. 5B and FIG. 5C are two schematic diagrams of transferring an LLR between a check node and a variable node according to an embodiment of this application.

When the first iteration starts, the variable node transfers a current LLR to the check node. With reference to FIG. 5B, a dashed arrow represents a transmission path of the LLR. In addition, in FIG. 5B, three square nodes shown in the left half represent source check nodes 1 to 3, four circular nodes shown in the left half represent source variable nodes 1 to 4, three square nodes shown in the right half represent channel check nodes 4 to 6, and four circular nodes shown in the right half represent channel variable nodes 5 to 8. For simplicity, FIG. 5B shows only an LLR transfer process related to the source check node 2. It can be seen that, the source variable node 2, the source variable node 3, and the channel variable node 6 all transfer respective LLRs to the source check node 2 (arrows in FIG. 5B represent LLR transfer). For example, the LLR transferred by the source variable node 2 to the source check node 2 is referred to as an LLR 1, the LLR transferred by the source variable node 3 to the source check node 2 is referred to as an LLR 2, and the LLR transferred by the channel variable node 6 to the source check node 2 is referred to as an LLR 3.

Figure 5C:
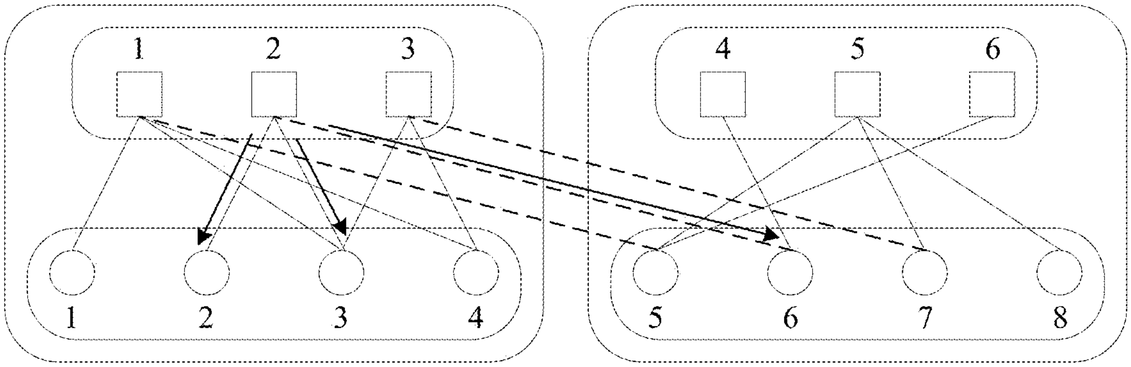

After receiving an LLR from a variable node, a check node calculates a new LLR based on the received LLR and returns the new LLR to the variable node. Still using an example in which the source check node 2 receives an LLR from a variable node, for example, the source check node 2 may calculate a new LLR, for example, referred to as an LLR 4, based on the LLR 1 from the source variable node 2 and the LLR 2 from the source variable node 3. The source check node 2 may transfer the LLR 4 to the channel variable node 6. The source check node 2 may calculate a new LLR, for example, referred to as an LLR 5, based on the LLR 1 from the source variable node 2 and the LLR 3 from the channel variable node 6. The source check node 2 may transfer the LLR 5 to the source variable node 3. The source check node 2 may calculate a new LLR, for example, referred to as an LLR 6, based on the LLR 2 from the source variable node 3 and the LLR 3 from the channel variable node 6. The source check node 2 may transfer the LLR 6 to the source variable node 2. Alternatively, the source check node 2 may obtain a new LLR, for example, referred to as an LLR 8, based on the LLR 1 from the source variable node 2, the LLR 2 from the source variable node 3, and the LLR 3 from the channel variable node 6. The source check node 2 may obtain an LLR 9 by subtracting an impact of the LLR 3 from the LLR 8. The source check node 2 may transfer the LLR 9 to the channel variable node 6. The source check node 2 may obtain an LLR 10 by subtracting an impact of the LLR 2 from the LLR 8. The source check node 2 may transfer the LLR 10 to the source variable node 3. The source check node 2 may obtain an LLR 11 by subtracting an impact of the LLR 1 from the LLR 8. The source check node 2 may transfer the LLR 11 to the source variable node 2. That is, an LLR transferred by a check node i to a variable node j does not include information about an LLR previously transferred by the variable node j to the check node i. For a process in which the check node transfers an LLR to the variable node, refer to FIG. 5C. Arrows in FIG. 5C represent LLR transfer. In addition, in FIG. 5C, three square nodes shown in the left half represent source check nodes 1 to 3, four circular nodes shown in the left half represent source variable nodes 1 to 4, three square nodes shown in the right half represent channel check nodes 4 to 6, and four circular nodes shown in the right half represent channel variable nodes 5 to 8.

A variable node may receive a new LLR from one or more check nodes. The variable node may obtain an LLR based on information such as the received LLR and an LLR from a channel (or based on the received LLR and prior information), and the LLR may participate in a subsequent iteration process. The variable node obtains an LLR based on information such as the received LLR and the LLR from the channel (or based on the received LLR and prior information). For example, in a manner, the variable node adds the received LLR and the LLR (or prior information) from the channel to obtain a new LLR.

In the subsequent iteration process, an LLR transmitted by the variable node to the check node is slightly different. For example, in a subsequent iteration process, the source variable node 2 needs to transfer an LLR to the source check node 2. In this case, the LLR transferred by the source variable node 2 is a difference between an LLR obtained by the source variable node 2 after a previous round of iteration ends and an LLR transferred by the source variable node 2 to the source check node 2 in the previous round. For example, an LLR transferred by the source variable node 2 to the source check node 2 in a previous round is an LLR 1, and an LLR obtained by the source variable node 2 after the previous round of iteration ends, that is, an LLR obtained by the source variable node 2 based on information such as an LLR 6 received in a process of the previous round of iteration and an LLR from a channel (or based on the received LLR and prior information) is, for example, referred to as an LLR 7. In this case, the LLR transferred by the source variable node 2 to the source check node 2 in a process of a current round of iteration is a value obtained by subtracting the LLR 6 from the LLR 7.

After the plurality of iterations are completed, the second device completes joint source and channel decoding on the second information.

FIG. 6 is a schematic diagram of a joint source and channel decoding process. In FIG. 6, a dashed line arrow pointing to "+" represents that a variable node transfers information (for example, transfers an LLR) to a check node in an iteration process, and a solid line arrow pointing to "+" represents that a check node transfers information (for example, transfers an LLR) to a variable node in an iteration process. In FIG. 6, "+" represents an addition operation, a special arrow (that is, an arrow with an interruption in the middle) in FIG. 6 represents a subtraction relationship, and "−" in the middle of the arrow represents a minus sign.

In FIG. 6, a source decoder receives source prior information, and information about the source check node arrives at the source variable node (through the first "+" on the leftmost side of the source decoder and the "+" on the top of the source decoder in FIG. 6). The second device may obtain a channel LLR based on an amplitude of a received radio signal, and the channel LLR may be input into a channel decoder. In the channel decoder, the channel variable node may receive information from the channel check node, and may also receive information from the source check node.

In FIG. 6, "+" and "−" corresponding to a dashed arrow pointing to "+" represent an operation of calculating a difference, and "−" refers to an arithmetic subtraction operation. The foregoing is used as an example. As described above, in a subsequent iteration process, the source variable node 2 needs to transfer an LLR to the source check node 2. In this case, the LLR transferred by the source variable node 2 is a difference between an LLR obtained by the source variable node 2 after a previous round of iteration ends and an LLR transferred by the source variable node 2 to the source check node 2 in the previous round. "−" corresponding to a dashed arrow pointing to "+" in FIG. 6 refers to an operation of calculating the difference between two LLRs.

In FIG. 6, "−" corresponding to a solid line arrow pointing to "+" does not refer to an arithmetic subtraction operation. The foregoing descriptions continue to be used as an example. The foregoing describes a process in which the source check node sends an LLR to the variable node, and the foregoing uses the source check node 2 as an example. For example, the source check node 2 may obtain a new LLR, for example, referred to as an LLR 8, based on the LLR 1 from the source variable node 2, the LLR 2 from the source variable node 3, and the LLR 3 from the channel variable node 6. The source check node 2 may obtain an LLR 9 by subtracting an impact of the LLR 3 from the LLR 8. The source check node 2 may transfer the LLR 9 to the channel variable node 6. "−" corresponding to a solid line arrow pointing to "+" in FIG. 6 refers to an operation that the source check node subtracts an impact of an LLR from a calculated LLR.

The first device does not necessarily send the second information after obtaining the second information. Therefore, S204 and S205 are optional steps.

In embodiments of this application, the first device may determine the first source coding rate from the first information based on the entropy rate and the source code length of the source sequence. The first information includes a large quantity of source coding rates, and flexibility is high during selection. An appropriate source coding rate can be selected based on the entropy rate and the source code length of the source sequence, to improve the flexibility and accuracy of code rate selection. The first device may determine a source coding matrix based on a channel coding basis matrix, which is equivalent to determining source coding information based on channel coding information, to implement joint source and channel coding. Through the joint source and channel coding, a quantity of output bits of source coding can match a quantity of input bits of channel coding, so that the technical solutions in embodiments of this application can be adapted to a 5G NR system.

It can be learned from the embodiment shown in FIG. 2 that the second device needs to use a joint check matrix in a process of decoding second information. In the embodiment shown in FIG. 2, the second device may determine a source coding matrix based on auxiliary information, and then obtain the joint check matrix based on the source coding matrix, a channel check matrix, and an identity matrix. Based on this, embodiments of this application provide that a joint check matrix can be improved to obtain better decoding performance. The following describes a second information processing method provided in an embodiment of this application. A joint check matrix can be improved according to the method. FIG. 7 is a flowchart of the method.

S701: A second device determines a second matrix. In embodiments of this application, it is considered that a joint check matrix can be improved by changing an identity matrix. For example, in the embodiment shown in FIG. 2, the second device obtains a joint check matrix based on a source coding matrix, a channel check matrix, and an identity matrix. In embodiments of this application, the second device may obtain the joint check matrix based on the source coding matrix and the second matrix, to improve decoding performance. Optionally, in embodiments of this application, the second device may obtain the joint check matrix based on the source coding matrix, the channel check matrix, and the second matrix. This is not specifically limited. Optionally, the channel check matrix may correspond to a channel generator matrix. For example, the channel check matrix is in a one-to-one correspondence with the channel generator matrix.

For example, if the joint check matrix is represented as $H_{JSC}$. For an implementation of $H_{JSC}$, refer to FIG. 8. FIG. 8 shows a manner of splicing several matrices to obtain $H_{JSC}$. P represents the second matrix. 0 represents a 0 square matrix. $H_{CC}$ represents the channel check matrix. $H_{SC}$ represents the source coding matrix.

The second matrix may be a matrix obtained based on the identity matrix. The second matrix may also be referred to as a permutation matrix or the like. A symbol used to represent the second matrix, a name of the second matrix, and the like are not limited in embodiments of this application.

Figure 9:
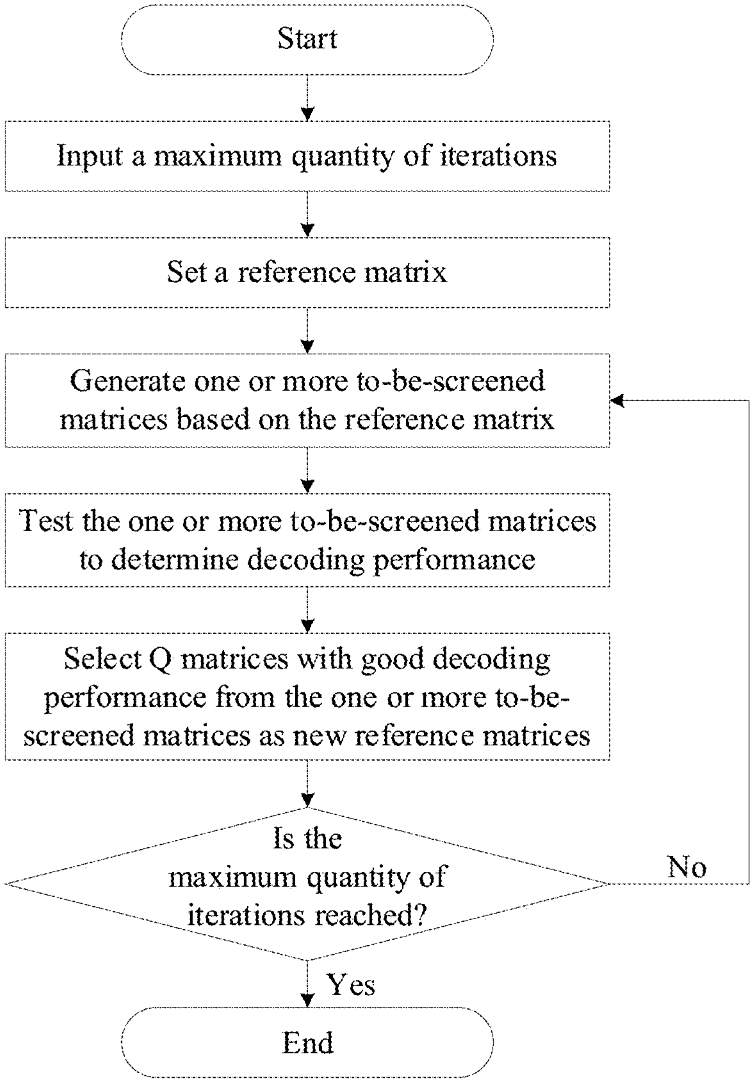
FIG. 9 is a flowchart of obtaining a second matrix according to a search algorithm according to an embodiment of this application.

An optional manner of obtaining the second matrix based on the identity matrix is processing the identity matrix according to a search algorithm to obtain the second matrix. The search algorithm may include a plurality of types such as a simulated annealing algorithm, a Cuckoo algorithm, a genetic algorithm, or the like. The identity matrix is processed according to the search algorithm to obtain the second matrix. For example, for a processing manner, refer to FIG. 9.

First, a maximum quantity of iterations is determined. The maximum quantity of iterations may be specified according to an algorithm or customized. In addition, a reference matrix, or referred to as an initial matrix, needs to be set. For example, the reference matrix is an identity matrix, or another matrix may be used as the reference matrix. After the reference matrix is set, one or more to-be-screened matrices may be obtained based on the reference matrix and by performing some processing (for example, processing such as random combination and/or mutation). The decoding performance of the one or more to-be-screened matrices may be obtained by testing the one or more to-be-screened matrices. Based on the decoding performance of the one or more to-be-screened matrices, Q matrices with good decoding performance may be selected from the one or more to-be-screened matrices, and the Q matrices are set as new reference matrices. Q is a positive integer. At this point, a current iteration is completed, and a quantity of iterations may be increased by 1, or a quantity of iterations may be increased by 1 when the iteration starts. If a current quantity of iterations is equal to the maximum quantity of iterations, an iteration process ends, and the Q matrices are output. Some or all of the Q matrices may be used as the second matrix. Alternatively, if the current quantity of iterations is less than the maximum quantity of iterations, the foregoing iteration process continues to be performed.

The following uses an example in which the search algorithm is a simulated annealing algorithm to describe a process of processing the identity matrix according to the simulated annealing algorithm to obtain the second matrix.

For example, if a source code length is short, for example, the source code length is a short code length described in Table 1, the identity matrix may be processed according to the simulated annealing algorithm to obtain the second matrix. For another example, if a source code length is long, for example, the source code length is a long code length described in Table 1, the identity matrix may also be processed according to the simulated annealing algorithm to obtain the second matrix; or the identity matrix may be first processed according to the simulated annealing algorithm, an obtained matrix is temporarily referred to as a third matrix, and then the second matrix may be obtained based on the third matrix. The source code length corresponding to the second matrix is greater than the source code length corresponding to the third matrix. That is, if a source code length is long, a permutation matrix corresponding to a short code length may be used to generate a permutation matrix corresponding to a long code length. In this case, the permutation matrix corresponding to the short code length may also be referred to as a basic permutation matrix, and the permutation matrix corresponding to the long code length may also be referred to as a derived permutation matrix. The derived permutation matrix is generated based on the basic permutation matrix, and the second matrix does not need to be directly generated in a manner such as the simulated annealing algorithm, so that the generation of the second matrix can be accelerated, and the generation efficiency of the second matrix can be improved.

Figure 10:
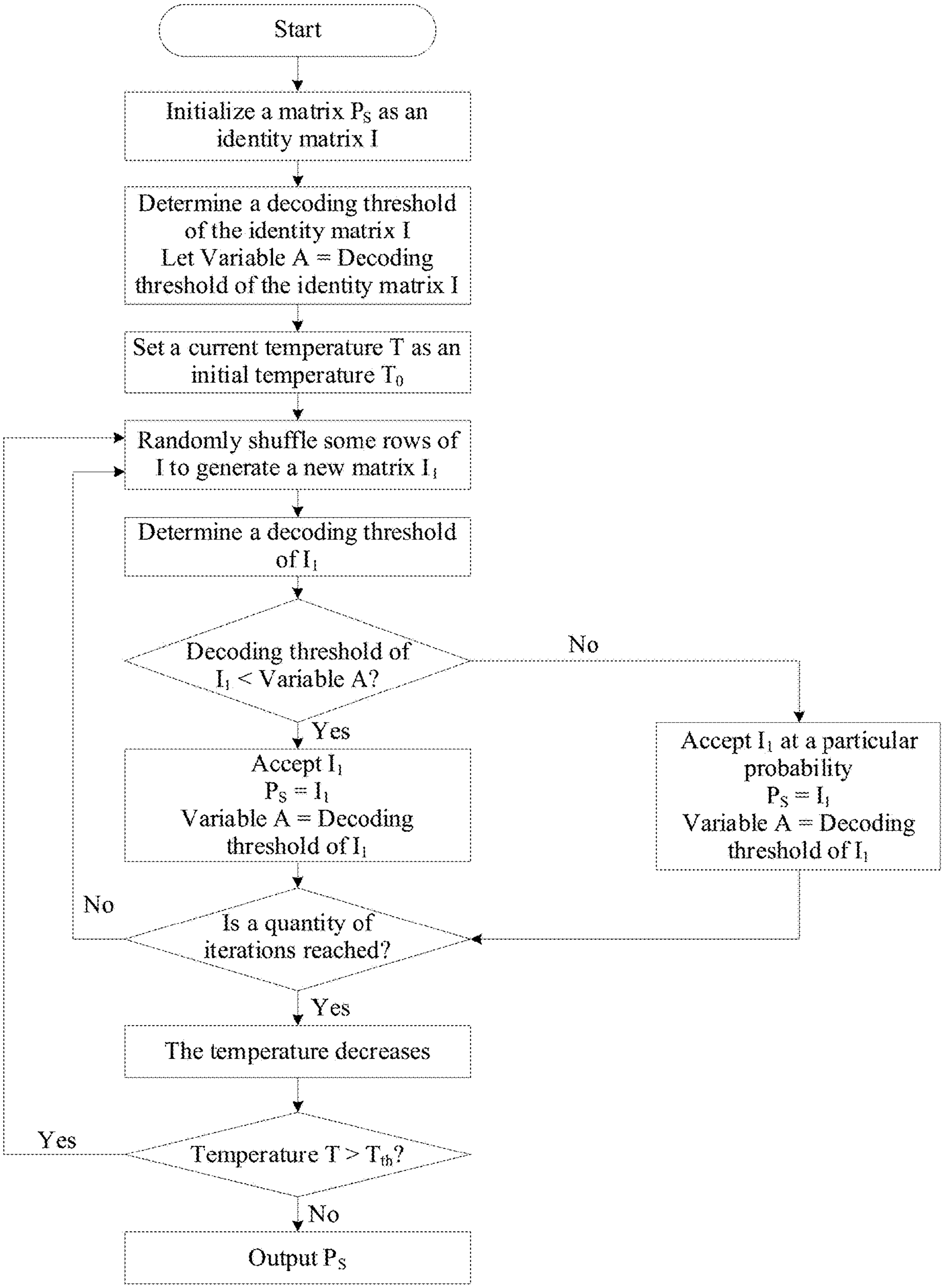
FIG. 10 to FIG. 12 are flowcharts of several manners of generating a permutation matrix according to an embodiment of this application.

FIG. 10 shows a procedure of processing an identity matrix according to a simulated annealing algorithm to obtain a second matrix (or a third matrix). It can be learned from FIG. 10 that, initially, a variable matrix $P_S$ is set as an identity matrix (represented as I). For the identity matrix I, a decoding threshold corresponding to the identity matrix I is determined, that is, a signal-to-noise ratio (signal-to-noise ratio, SNR) corresponding to the identity matrix is determined. The SNR corresponding to the identity matrix is represented as $\delta_0$, and $\delta_1=\delta_0$ is assumed. 61 is a variable A in FIG. 10. A current temperature is set as an initial temperature. The initial temperature is dented as $T_0$. Some rows of the identity matrix I are randomly shuffled to generate a new matrix, which is represented as $I_1$. A decoding threshold corresponding to the matrix $I_1$ is determined, and is represented as $\delta_2$. It is determined whether $\delta_2$ is less than $\delta_1$. If $\delta_2$ is less than 61, the matrix $I_1$ is accepted, $P_S$ is set as the matrix $I_1$, and $\delta_1=\delta_2$ is set. In this case, if the quantity of iterations is reached, the temperature decreases. If the decreased temperature T is less than or equal to a temperature threshold $T_{th}$, the matrix $P_S$ is output. In this case, the matrix $P_S$ is the obtained second matrix (or third matrix), and in addition, a performance gain of 61-60 may be output. Alternatively, after the matrix $I_1$ is accepted, if the quantity of iterations is not reached, some rows of the matrix $I_1$ are randomly shuffled to generate a new matrix, which is represented as $I_2$, and a similar determining process continues to be performed.

In addition, if $\delta_2$ is greater than or equal to 61, a first device may accept the matrix $I_1$ at a particular probability. If the matrix $I_1$ is accepted, $P_S$ is set as the matrix $I_1$, and $\delta_1=\delta_2$ is set. In this case, if the quantity of iterations is reached, the temperature decreases. If the decreased temperature T is less than or equal to a temperature threshold $T_{th}$, the matrix $P_S$ is output. In this case, the matrix $P_S$ is the obtained second matrix (or third matrix), and in addition, a performance gain of $\delta_1$-$\delta_0$ may be output. Alternatively, after the matrix $I_1$ is accepted at a particular probability, if the quantity of iterations is not reached, some rows of the matrix $I_1$ are randomly shuffled to generate a new matrix, which is represented as 12, and a similar determining process continues to be performed.

A matrix output through FIG. 10 is, for example, a basic permutation matrix, and the basic permutation matrix is, for example, an S×S square matrix.

The quantity of iterations is preconfigured according to a simulated annealing algorithm, and may be greater than or equal to 1. The first device receives a matrix at a particular probability, and there may be a plurality of acceptance manners. For example, if the current temperature is high, an acceptance probability is high, and if the current temperature is low, it indicates that the system is stable, and a matrix with a larger decoding threshold may not be expected to be accepted. When the decoding threshold is larger, the performance may be poorer. Therefore, if the current temperature is low, the acceptance probability is low. Alternatively, if a difference between decoding thresholds corresponding to two adjacent matrices is small, for example, a difference between $\delta_2$ and $\delta_1$ is less than a first threshold, the acceptance probability is large. If the difference is large, the acceptance probability is small. A specific acceptance probability can be specified according to the simulated annealing algorithm.

Figure 11:
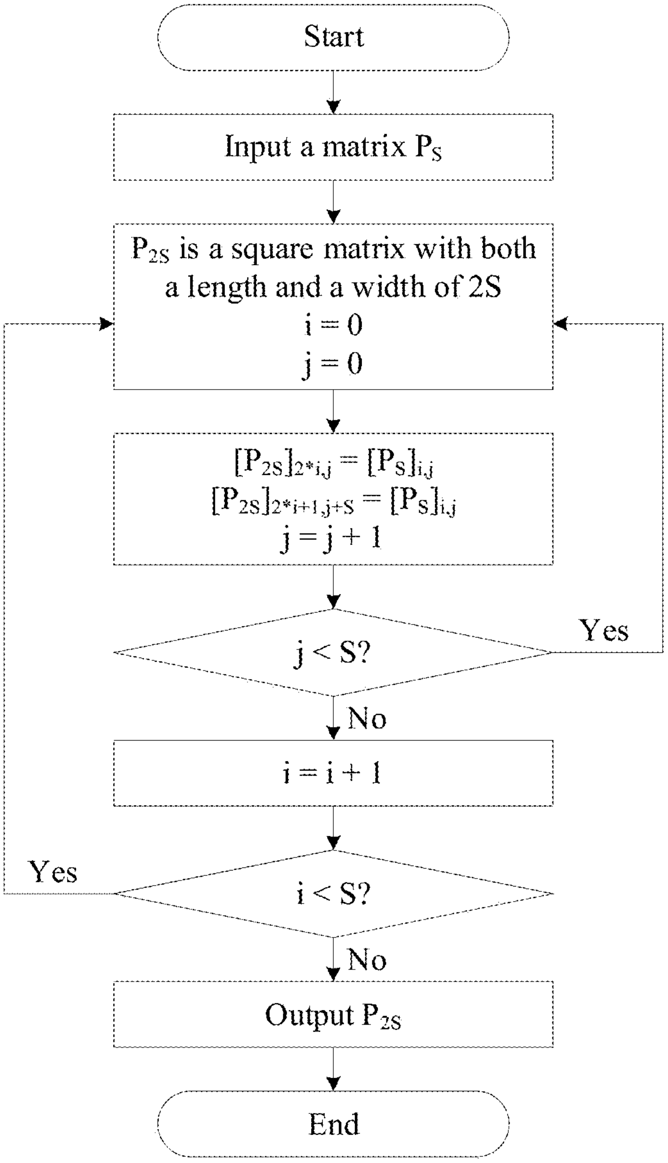

As described above, if the source code length is long, a derived permutation matrix corresponding to the long source code length may be generated based on a basic permutation matrix corresponding to a short source code length. FIG. 11 shows a procedure of generating a derived permutation matrix corresponding to a long source code length based on a basic permutation matrix corresponding to a short source code length. FIG. 11 uses an example in which the source code length corresponding to the derived permutation matrix is twice the source code length corresponding to the basic permutation matrix. The basic permutation matrix is, for example, a matrix obtained according to the procedure shown in FIG. 10.

It can be learned from FIG. 11 that a 2S×2S square matrix is first assumed, which is denoted as $P_{2S}$, and a basic permutation matrix is represented as $P_S$. For example, $P_S$ is obtained by performing the procedure shown in FIG. 10. For an element in a $(2i)^{th}$ row and a $j^{th}$ column of $P_{2S}$, a value of an element in an $i^{th}$ row and the $j^{th}$ column of $P_S$ is assigned to the element. For an element in a $(2i+1)^{th}$ row and a $(j+S)^{th}$ column of $P_{2S}$, a value of the element in the $i^{th}$ row and the $j^{th}$ column of $P_S$ is assigned to the element. Next, j is increased by 1. If a value obtained by increasing j by 1 is less than S, the foregoing assignment process continues to be performed. If the value obtained by increasing j by 1 is greater than or equal to S, i is increased by 1. If a value obtained by increasing i by 1 is less than S, the foregoing assignment process continues to be performed. If the value obtained by increasing i by 1 is greater than or equal to S, the matrix $P_{2S}$ is output. In this case, the output matrix $P_{2S}$ is the obtained derived permutation matrix.

It is also possible that the source code length corresponding to the derived permutation matrix is k times the source code length corresponding to the basic permutation matrix, and the derived permutation matrix may be generated by repeatedly performing the procedure shown in FIG. 11. That is, if a basic permutation matrix $P_S$ corresponding to a source code length m is obtained based on the identity matrix, a derived permutation matrix corresponding to a source code length $2^k$m may be generated accordingly. For example, the derived permutation matrix is represented as $P_{2^k m}$. The basic permutation matrix is, for example, a matrix obtained according to the procedure shown in FIG. 10.

Figure 12:
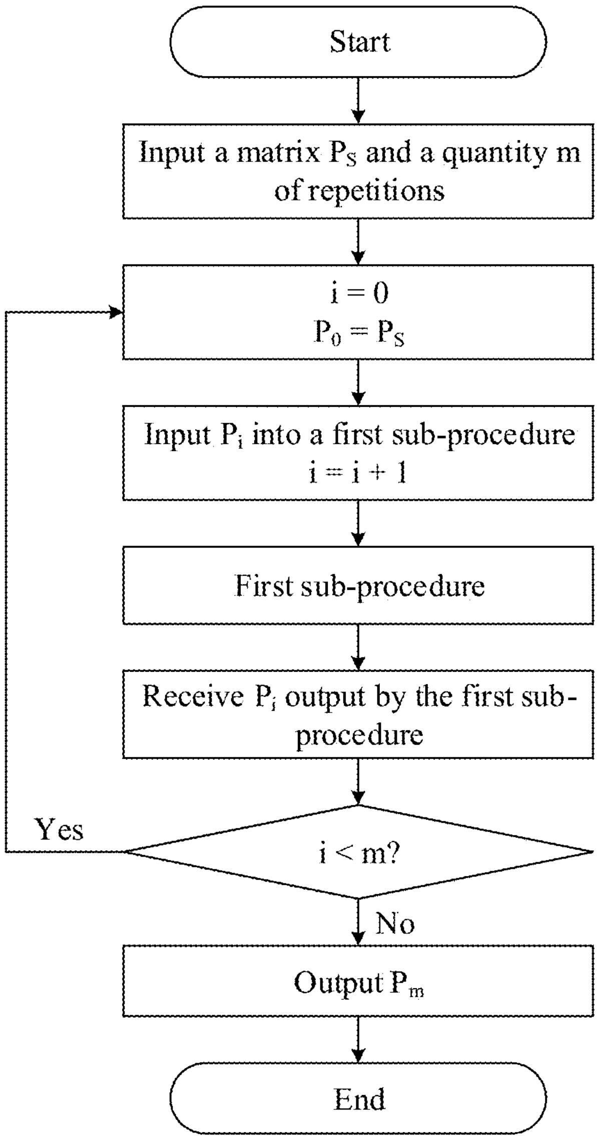

For example, FIG. 12 shows a procedure of generating a derived permutation matrix based on a basic permutation matrix. FIG. 12 uses an example in which the source code length corresponding to the derived permutation matrix is m times the source code length corresponding to the basic permutation matrix. In FIG. 12, i is used as a quantity of repetitions. Initially, i=0, and the basic permutation matrix input initially is represented as $P_0$. Because a derived permutation matrix is generated based on the basic permutation matrix $P_S$, $P_0=P_S{\cdot}P_i$ is input into the procedure shown in FIG. 11 (that is, a first sub-procedure shown in FIG. 12), for example, initially $P_i=P_0$. After the procedure shown in FIG. 11 is performed, $P_i'$ may be output. In this case, if i is less than m, $P_i'$ continues to be input into the procedure shown in FIG. 11 to perform similar processing. If i is equal to m, an obtained matrix, for example, represented as $P_m$, is output. In this case, $P_m$ is the obtained derived permutation matrix.

In embodiments of this application, if the source code length is long, the derived permutation matrix may be generated based on the basic permutation matrix. In this case, the first device or the second device only needs to store the basic permutation matrix, but does not need to store the derived permutation matrix, which helps save storage space.

In embodiments of this application, for example, if the search algorithm is a simulated annealing algorithm, the second matrix may be a matrix obtained based on the procedure shown in FIG. 10, or a matrix obtained based on the procedure shown in FIG. 11, or a matrix obtained based on the procedure shown in FIG. 12.

Table 4 shows some optional permutation matrices and lifting sizes and performance gains corresponding to the permutation matrices. In embodiments of this application, any permutation matrix in Table 4 may be used as the second matrix, or in embodiments of this application, another matrix than the matrix shown in Table 4 may be used as the second matrix. The permutation matrix used in Table 4 may be a basic permutation matrix, or may be a derived permutation matrix.

TABLE 4

| $Z_c$ | Permutation matrix | Performance gain (dB) |
|---|---|---|
| 20 | Permutation matrix $A_1$ | 0.21 |
| 16 | Permutation matrix $A_2$ | 0.17 |
| 24 | Permutation matrix $A_3$ | 0.19 |
| 18 | Permutation matrix $A_4$ | 0.22 |
| 28 | Permutation matrix $A_5$ | 0.23 |
| 22 | Permutation matrix $A_6$ | 0.20 |
| 26 | Permutation matrix $A_7$ | 0.21 |
| 30 | Permutation matrix $A_8$ | 0.23 |

$Z_c$ represents a lifting size. $Z_c$ of each row in Table 4 represents a lifting size corresponding to a permutation matrix of the row. The following describes eight permutation matrices $A_1$ to $A_8$ used in Table 4.

(1) Transform Matrix $A_1$.

[367, 384, 63, 202, 270, 95, 353, 352, 268, 76, 75, 273, 146, 250, 3, 407, 237, 400, 56, 113, 216, 139, 267, 129, 272, 18, 401, 104, 165, 135, 217, 371, 196, 203, 45, 145, 405, 150, 166, 155, 147, 124, 161, 383, 278,
364, 324, 304, 365, 137, 287, 141, 183, 35, 238, 162, 236, 318, 44, 54, 418, 107, 194, 395, 347, 375, 174, 218, 85, 181, 198, 207, 274, 112, 355, 199, 86, 46, 298, 115, 234, 317, 439, 240, 5, 266, 121, 12, 133, 151, 262, 26,
299, 179, 37, 142, 34, 331, 322, 73, 192, 10, 223, 7, 302, 333, 177, 21, 245, 378, 125, 61, 100, 243, 134, 91,
330, 431, 36, 6, 263, 14, 1, 98, 118, 219, 43, 182, 426, 255, 346, 119, 128, 258, 144, 360, 231, 59, 74, 427, 191, 57, 66, 246, 399, 291, 305, 87, 206, 80, 94, 380, 81, 244, 349, 437, 58, 157, 83, 227, 33, 300, 276, 416, 369,
396, 153, 126, 362, 143, 406, 312, 419, 92, 158, 106, 363, 381, 354, 429, 252, 173, 201, 241, 108, 200, 319,
386, 176, 69, 103, 136, 311, 433, 117, 28, 297, 64, 344, 24, 114, 16, 233, 88, 68, 372, 65, 62, 282, 279, 373, 9,
264, 359, 392, 366, 235, 101, 228, 408, 48, 31, 281, 89, 295, 224, 361, 102, 79, 261, 132, 350, 397, 175, 84,
432, 280, 168, 420, 436, 47, 313, 308, 320, 122, 127, 8, 152, 332, 424, 214, 423, 188, 345, 358, 336, 376, 323, 391, 409, 321, 292, 303, 296, 2, 294, 422, 314, 148, 438, 413, 99, 309, 342, 210, 19, 208, 247, 326, 232, 357,
415, 96, 77, 385, 394, 164, 229, 187, 204, 404, 131, 154, 82, 417, 341, 29, 149, 435, 269, 169, 289, 205, 90,
189, 123, 160, 197, 212, 120, 71, 130, 23, 78, 377, 116, 382, 335, 277, 271, 379, 306, 434, 284, 288, 356, 283, 425, 222, 140, 184, 249, 70, 402, 257, 412, 301, 370, 15, 251, 190, 67, 185, 156, 0, 430, 286, 310, 50, 256, 171, 339, 220, 13, 180, 213, 398, 374, 275, 49, 254, 368, 259, 226, 172, 253, 20, 242, 40, 110, 403, 11, 293, 17, 393, 328, 215, 195, 351, 290, 410, 340, 343, 248, 390, 348, 307, 109, 38, 170, 51, 53, 27, 260, 325, 387, 41, 163,
105, 230, 239, 329, 93, 42, 72, 52, 338, 193, 421, 111, 178, 159, 428, 337, 138, 60, 22, 167, 39, 186, 414, 209,
30, 315, 25, 265, 334, 211, 221, 285, 327, 388, 32, 55, 389, 225, 316, 97, 411, 4].

(2) Transform Matrix $A_2$.

[335, 248, 31, 68, 154, 271, 81, 202, 76, 161, 241, 255, 234, 132, 155, 99, 134, 342, 207, 63, 338, 9, 206,
180, 65, 286, 96, 185, 158, 277, 328, 178, 30, 89, 23, 268, 210, 315, 217, 203, 104, 124, 53, 347, 322, 317, 235, 260, 157, 171, 52, 251, 302, 318, 192, 177, 224, 246, 327, 179, 336, 122, 218, 237, 259, 174, 50, 289, 343,
351, 195, 175, 339, 186, 91, 298, 253, 148, 193, 59, 29, 170, 27, 58, 75, 245, 295, 0, 100, 194, 95, 222, 121, 62, 1, 300, 47, 182, 308, 71, 143, 60, 56, 118, 291, 110, 263, 77, 94, 313, 227, 281, 280, 292, 189, 106, 61, 19, 151, 40, 223, 18, 321, 33, 54, 236, 39, 169, 231, 3, 270, 36, 14, 98, 225, 22, 307, 334, 88, 187, 113, 350, 305, 51, 262, 21, 240, 250, 256, 290, 346, 288, 341, 314, 243, 70, 120, 140, 176, 301, 166, 319, 66, 197, 79, 345, 5, 159, 127, 25, 150, 230, 238, 55, 333, 220, 34, 163, 125, 28, 323, 320, 284, 196, 266, 221, 297, 215, 107, 57, 11, 214, 116, 26, 73, 12, 97, 205, 188, 167, 42, 138, 325, 340, 232, 108, 135, 287, 41, 311, 78, 331, 7, 80, 276, 152, 273, 184, 204, 10, 219, 212, 160, 90, 199, 293, 8, 191, 233, 326, 316, 329, 296, 244, 309, 126, 249, 6, 168, 299, 306, 239, 183, 92, 228, 49, 164, 72, 165, 201, 156, 181, 303, 209, 324, 87, 330, 261, 278, 101, 162, 172, 149, 141, 133, 2, 304, 111, 86, 264, 139, 35, 17, 16, 147, 43, 129, 274, 74, 211, 216, 144, 136, 38, 257, 85, 247, 44, 242, 82,
123, 344, 153, 145, 348, 64, 105, 67, 252, 32, 349, 69, 190, 93, 4, 310, 294, 337, 272, 146, 83, 332, 48, 229, 112, 258, 265, 173, 37, 114, 269, 282, 109, 200, 254, 131, 312, 13, 283, 103, 208, 267, 130, 275, 198, 285, 213,
128, 115, 46, 84, 279, 45, 117, 24, 226, 20, 137, 102, 119, 142, 15].

(3) Transform Matrix $A_3$.

[356, 378, 44, 281, 22, 42, 333, 482, 436, 414, 417, 353, 228, 107, 71, 234, 493, 411, 220, 164, 61, 270,
303, 55, 30, 109, 447, 487, 157, 335, 227, 388, 272, 400, 215, 350, 313, 49, 39, 25, 100, 18, 521, 420, 363, 300, 84, 190, 523, 237, 150, 497, 242, 118, 483, 450, 153, 250, 200, 307, 261, 254, 383, 191, 361, 50, 293, 311, 31, 7, 357, 486, 246, 265, 283, 475, 221, 59, 266, 381, 466, 198, 117, 199, 69, 285, 385, 401, 172, 287, 465, 2, 130,
166, 393, 513, 525, 391, 259, 516, 526, 320, 322, 331, 93, 23, 239, 121, 376, 212, 128, 503, 135, 342, 379,
519, 387, 243, 258, 489, 474, 305, 205, 186, 501, 301, 110, 522, 418, 87, 78, 419, 294, 263, 178, 140, 101, 185, 5, 51, 158, 517, 394, 392, 28, 432, 372, 284, 431, 275, 297, 85, 148, 136, 9, 435, 362, 326, 491, 184, 146, 430,
230, 70, 208, 288, 506, 485, 327, 478, 373, 165, 396, 382, 520, 330, 52, 86, 395, 89, 105, 308, 280, 336, 340,
125, 351, 461, 321, 399, 179, 332, 289, 122, 370, 113, 225, 404, 17, 156, 36, 442, 456, 355, 29, 302, 143, 13,
96, 366, 476, 72, 183, 410, 429, 312, 68, 127, 252, 147, 58, 138, 106, 45, 386, 123, 38, 108, 33, 323, 375, 47,
494, 233, 299, 91, 169, 83, 291, 421, 64, 439, 256, 484, 500, 495, 24, 15, 112, 257, 349, 455, 65, 367, 111, 295,
354, 470, 82, 217, 10, 344, 134, 260, 120, 174, 316, 315, 334, 276, 490, 496, 40, 433, 405, 460, 92, 35, 390,
236, 79, 408, 241, 88, 131, 459, 77, 56, 98, 514, 415, 203, 515, 21, 314, 32, 454, 488, 189, 74, 229, 464, 149,
180, 235, 359, 398, 60, 103, 341, 159, 193, 80, 469, 181, 151, 224, 54, 214, 124, 249, 139, 204, 194, 46, 471,
3, 279, 41, 163, 248, 473, 338, 137, 48, 440, 510, 463, 304, 232, 1, 155, 269, 213, 290, 397, 171, 424, 206, 505, 63, 365, 267, 347, 329, 268, 6, 73, 14, 451, 154, 402, 26, 102, 452, 324, 371, 296, 162, 358, 94, 99, 12, 443, 409, 479, 196, 518, 377, 141, 271, 222, 133, 226, 444, 462, 423, 317, 188, 223, 216, 360, 480, 152, 177, 218, 384, 309, 368, 507, 182, 457, 255, 244, 240, 37, 97, 95, 319, 81, 167, 168, 508, 492, 472, 458, 282, 129, 426, 453, 441, 116, 328, 161, 468, 389, 76, 201, 104, 132, 219, 247, 337, 4, 318, 210, 251, 19, 422, 425, 445, 512, 119, 416, 57, 524, 446, 264, 62, 306, 286, 511, 160, 192, 346, 173, 145, 438, 195, 238, 343, 273, 170, 498, 67, 403, 427, 231, 253, 467, 374, 292, 209, 53, 509, 434, 114, 277, 369, 449, 339, 499, 90, 413, 504, 278, 298, 34, 380, 412, 175, 211, 477, 428, 325, 202, 187, 406, 75, 27, 176, 262, 144, 352, 142, 348, 481, 502, 16, 197, 245, 527, 345, 0, 437, 448, 364, 126, 66, 11, 115, 310, 274, 43, 407, 207, 20, 8].

(4) Transform Matrix $A_4$.

[308, 241, 267, 153, 60, 291, 37, 240, 372, 273, 72, 356, 68, 307, 243, 344, 221, 386, 314, 105, 179, 22,
338, 92, 197, 58, 315, 137, 367, 20, 277, 7, 44, 325, 162, 268, 219, 47, 142, 271, 334, 285, 305, 222, 353, 202,
326, 73, 191, 368,261, 54, 352, 76, 242, 5, 165, 265, 358, 331, 149, 276, 196, 98, 190, 108, 176, 118, 87, 245,
350, 48, 376, 183, 9, 377, 214, 2, 39, 212, 200, 75, 373, 195, 257, 300, 101, 198, 388, 185, 330, 35, 6, 174, 34,
132, 85, 157, 40, 229, 272, 57, 231, 30, 27, 104, 63, 110, 152, 362, 247, 71, 97, 192, 252, 150, 303, 38, 127, 355,
13, 282, 393, 387, 270, 77, 51, 323, 337, 253, 328, 133, 223, 312, 42, 124, 29, 15, 354, 287, 11, 324, 81, 359,
224, 390, 280, 288, 146, 332, 66, 117, 56, 107, 59, 340, 64, 318, 385, 18, 100, 52, 121, 218, 299, 88, 61, 292,
95, 211, 301, 345, 363, 217, 380, 53, 322, 216, 50, 25, 266, 302, 210, 259, 290, 206, 188, 19, 244, 131, 333, 103,
138, 134, 366, 342, 250, 189, 177, 298, 193, 94, 180, 83, 233, 155, 304, 65, 227, 163, 167, 160, 208, 283, 343,
28, 281, 113, 260, 394, 278, 33, 207, 284, 129, 306, 371, 199, 205, 320, 8, 86, 164, 226, 357, 74, 14, 79, 346,
289, 319, 140, 275, 395, 254, 381, 80, 379, 102, 23, 21, 112, 156, 225, 335, 383, 297, 41, 82, 0, 115, 215, 269,
114, 279, 111, 327, 144, 294, 173, 45, 161, 17, 55, 204, 348, 46, 130, 181, 175, 89, 78, 184, 3, 213, 69, 351,
336, 158, 16, 109, 126, 321, 256, 375, 258, 12, 251, 361, 90, 147, 370, 235, 187, 1, 151, 230, 128, 203, 236, 239,
159, 84, 122, 166, 382, 4, 249, 96, 341, 384, 135, 194, 123, 309, 148, 119, 70, 329, 374, 339, 369, 169, 178,
136, 389, 238, 201, 67, 32, 220, 62, 145, 10, 49, 171, 228, 293, 274, 234, 116, 295, 182, 317, 93, 316, 168, 99,
349, 120, 310, 170, 106, 391, 378, 246, 91, 31, 263, 232, 209, 139, 248, 36, 296, 313, 262, 264, 360, 186, 364,
311, 26, 141, 365, 143, 347, 255, 43, 154, 24, 125, 286, 172, 392, 237].

(5) Transform Matrix $A_5$.

[252, 308, 254, 546, 593, 320, 402, 85, 366, 577, 604, 122, 102, 358, 119, 193, 512, 433, 290, 36, 422,
586, 33, 340, 230, 276, 611, 610, 103, 285, 100, 601, 478, 405, 547, 270, 569, 374, 516, 93, 403, 590, 84, 144,
210, 241, 269, 545, 440, 123, 482, 411, 498, 108, 393, 466, 110, 179, 26, 181, 303, 501, 109, 372, 368, 431,
525, 615, 480, 481, 490, 348, 95, 191, 606, 237, 322, 587, 453, 161, 148, 326, 51, 555, 450, 574, 13, 166, 511,
553, 441, 281, 141, 401, 295, 362, 238, 427, 82, 505, 544, 520, 369, 596, 356, 375, 195, 9, 572, 514, 87, 477,
81, 602, 315, 217, 214, 55, 536, 20, 54, 417, 562, 136, 170, 200, 265, 261, 218, 3, 392, 532, 341, 352, 502, 77,
94, 127, 126, 448, 177, 359, 442, 15, 242, 563, 32, 260, 493, 245, 378, 412, 415, 215, 530, 72, 38, 35, 565, 296,
513, 30, 552, 274, 410, 486, 57, 194, 271, 37, 227, 515, 183, 128, 205, 522, 509, 384, 24, 188, 169, 533, 86,
121, 111, 578, 219, 222, 165, 139, 129, 537, 527, 317, 75, 240, 529, 96, 223, 176, 250, 570, 452, 518, 299, 605, 418, 23, 292, 457, 132, 306, 591, 60, 294, 301, 206, 4, 589, 432, 78, 612, 199, 353, 420, 343, 58, 226, 339, 18, 6, 377, 196, 184, 159, 484, 487, 99, 298, 16, 282, 394, 203, 582, 73, 76, 594, 573, 310, 559, 469, 142, 328, 524, 323, 329, 264, 221, 528, 40, 10, 613, 473, 114, 331, 476, 367, 346, 34, 370, 189, 454, 531, 451, 386, 554, 147,
407, 2, 444, 382, 428, 523, 192, 496, 436, 146, 243, 332, 335, 39, 59, 576, 155, 118, 138, 113, 256, 607, 609,
510, 167, 289, 48, 88, 500, 307, 491, 336, 0, 568, 149, 135, 244, 438, 312, 464, 551, 150, 80, 41, 286, 202, 83, 11, 414, 357, 342, 233, 597, 174, 389, 201, 160, 120, 288, 255, 106, 125, 506, 19, 90, 28, 542, 503, 535, 313,
538, 566, 272, 105, 29, 557, 309, 581, 383, 92, 449, 101, 47, 273, 207, 62, 98, 21, 430, 380, 198, 259, 351, 304, 381, 133, 91, 584, 413, 398, 558, 263, 599, 31, 423, 71, 424, 429, 497, 212, 460, 64, 598, 539, 406, 61, 363,
156, 130, 277, 355, 399, 253, 467, 395, 408, 239, 187, 266, 45, 74, 67, 180, 360, 232, 151, 409, 247, 235, 228, 447, 334, 236, 302, 65, 580, 338, 63, 365, 321, 474, 280, 66, 27, 152, 462, 287, 435, 446, 154, 571, 468, 89,
603, 1, 190, 583, 284, 325, 404, 216, 279, 50, 297, 311, 157, 371, 556, 495, 534, 25, 178, 461, 508, 507, 116,
112, 479, 549, 492, 437, 421, 400, 376, 131, 485, 248, 69, 318, 488, 472, 293, 234, 185, 42, 517, 211, 543, 585, 567, 475, 283, 397, 349, 499, 564, 70, 225, 68, 541, 224, 345, 53, 140, 463, 197, 540, 519, 396, 164, 443, 388, 5, 419, 319, 327, 153, 455, 337, 46, 52, 426, 361, 314, 22, 251, 425, 434, 134, 168, 379, 347, 579, 561, 14, 8,
316, 143, 186, 56, 333, 163, 354, 592, 115, 258, 162, 330, 137, 456, 275, 249, 229, 471, 262, 44, 465, 526, 416, 43, 550, 145, 208, 439, 220, 267, 614, 521, 458, 575, 12, 324, 49, 209, 175, 560, 104, 387, 300, 350, 588, 246, 278, 117, 504, 79, 124, 257, 231, 548, 608, 7, 470, 391, 494, 600, 364, 173, 172, 385, 158, 17, 483, 305, 107,
182, 373, 344, 489, 291, 204, 97, 213, 445, 459, 171, 595, 390, 268].

(6) Transform Matrix $A_6$.

[189, 372, 325, 155, 5, 363, 202, 256, 207, 435, 427, 194, 378, 146, 469, 343, 208, 250, 473, 374, 171,
160, 180, 398, 245, 294, 8, 354, 16, 246, 419, 278, 404, 164, 73, 396, 80, 40, 35, 115, 36, 112, 61, 228, 267, 78,
277, 269, 231, 52, 206, 432, 444, 292, 355, 476, 440, 111, 241, 411, 366, 126, 50, 181, 65, 222, 56, 416, 336,
315, 299, 32, 137, 403, 373, 55, 314, 407, 77, 334, 358, 346, 2, 333, 434, 229, 370, 109, 10, 248, 37, 364, 209,
303, 481, 26, 342, 205, 125, 51, 106, 462, 408, 413, 130, 453, 169, 141, 13, 59, 30, 345, 468, 60, 223, 319, 422, 204, 335, 263, 150, 290, 89, 45, 4, 92, 143, 477, 445, 74, 298, 210, 121, 233, 175, 227, 379, 449, 14, 442, 390,
338, 157, 382, 441, 459, 470, 260, 70, 98, 327, 54, 133, 69, 20, 139, 88, 211, 147, 113, 414, 436, 24, 322, 156,
132, 7, 203, 455, 240, 465, 193, 43, 275, 95, 339, 437, 242, 6, 258, 97, 84, 324, 163, 420, 271, 321, 29, 340, 19,
391, 381, 230, 341, 217, 409, 387, 238, 351, 103, 456, 389, 262, 215, 309, 85, 454, 360, 220, 282, 349, 200,
138, 117, 96, 323, 297, 318, 108, 305, 474, 195, 386, 82, 287, 153, 463, 291, 190, 114, 218, 41, 244, 380, 87, 270, 311, 393, 236, 400, 219, 86, 450, 197, 310, 471, 212, 466, 425, 185, 49, 124, 268, 439, 83, 214, 44, 352, 57, 58, 401, 410, 63, 328, 104, 284, 158, 384, 304, 302, 483, 118, 395, 243, 368, 23, 289, 91, 165, 424, 433, 42, 159, 131, 135, 429, 402, 152, 75, 100, 136, 332, 249, 331, 102, 27, 162, 461, 142, 261, 67, 161, 475, 421, 288, 252, 53, 371, 3, 312, 446, 259, 344, 21, 362, 265, 18, 350, 348, 283, 239, 170, 39, 72, 376, 388, 431, 119, 280, 66, 405, 177, 357, 46, 128, 472, 253, 438, 406, 226, 266, 144, 123, 134, 367, 216, 377, 225, 184, 224, 306, 151, 394, 383, 191, 353, 281, 457, 15, 430, 68, 173, 154, 426, 316, 9, 31, 443, 235, 99, 71, 145, 423, 174, 361, 237, 326, 279, 38, 369, 28, 47, 122, 320, 479, 301, 167, 478, 286, 183, 127, 140, 182, 399, 178, 365, 347, 17, 418, 201, 359, 25, 234, 251, 317, 428, 166, 264, 447, 417, 274, 22, 105, 285, 129, 412, 0, 464, 76, 300, 255, 1, 232, 257, 81, 482, 330, 48, 176, 480, 186, 296, 79, 64, 375, 452, 467, 273, 110, 11, 198, 12, 356, 120, 93, 188, 168, 34, 101, 192, 90, 148, 448, 62, 385, 213, 308, 196, 247, 199, 458, 451, 221, 329, 307, 397, 460, 187, 179, 337, 272, 313, 254, 94, 149, 392, 33, 276, 116, 415, 172, 295, 107, 293].

(7) Transform Matrix $A_7$.

[527, 259, 416, 280, 291, 195, 333, 122, 132, 509, 143, 191, 271, 57,352, 538, 328, 316, 314, 245, 401, 48, 375, 370, 18, 181, 307, 234, 30, 337, 513, 13, 176, 182, 510, 485, 326, 163, 244, 368, 101, 487, 517, 360, 177, 42, 305, 185, 117, 103, 442, 525, 98, 187, 24, 285, 504, 556, 559, 153, 240, 321, 232, 450, 446, 133, 469, 79, 10, 406, 266, 142, 17, 156, 71, 76, 77, 410, 138, 417, 159, 27, 113, 290, 318, 180, 99, 570, 179, 65, 424, 460, 568, 82, 15, 146, 457, 218, 216, 478, 12, 494, 571, 40, 516, 128, 38, 390, 7, 203, 35, 43, 381, 303, 188, 242, 70, 521, 217, 255, 278, 145, 151, 14, 22, 44, 320, 286, 325, 443, 52, 541, 287, 539, 109, 292, 565, 369, 465, 100, 102, 351, 474, 566, 282, 359, 332, 172, 55, 458, 366, 149, 448, 239, 475, 444, 88, 427, 440, 134, 204, 111, 299, 84, 19, 47, 89, 356, 233, 105, 165, 28, 489, 225, 274, 354, 235, 373, 288, 498, 155, 434, 481, 532, 414, 309, 558, 399, 257, 317, 371, 194, 342, 477, 537, 221, 121, 322, 365, 50, 92, 361, 23, 514, 451, 75, 226, 31, 263, 453, 438, 260, 152, 540, 4, 265, 231, 555, 447, 224, 173, 25, 198, 530, 345, 413, 268, 472, 241, 46, 343, 398, 157, 104, 85, 340, 367, 488, 136, 564, 435, 508, 36, 377, 53, 114, 269, 553, 83, 569, 219, 503, 542, 561, 500, 54, 249, 429, 543, 124, 148, 445, 41, 357, 430, 106, 253, 171, 61, 534, 493, 385, 168, 415, 433, 506, 60, 166, 496, 486, 93, 186, 8, 178, 154, 68, 374, 130, 339, 310, 497, 419, 229, 273, 137, 58, 403, 297, 473, 227, 364, 544, 395, 464, 298, 164, 392, 400, 557, 402, 206, 141, 33, 32, 560, 212, 96, 123, 423, 228, 350, 162, 196, 247, 108, 207, 329, 490, 295, 302, 80, 236, 315, 59, 277, 72, 495, 324, 63, 296, 405, 281, 6, 87, 388, 135, 529, 491, 237, 202, 78, 174, 346, 549, 425, 397, 66, 283, 358, 536, 452, 116, 293, 69, 441, 483, 5, 275, 376, 436, 34, 418, 323, 304, 461, 306, 552, 505, 74, 270, 331, 341, 562, 389, 412, 213, 251, 301, 391, 531, 126, 528, 563, 144, 62, 1, 355, 192, 170, 39, 201, 484, 81, 384, 363, 454, 426, 158, 26, 338, 16, 512, 215, 535, 524, 335, 115, 205, 51, 127, 0, 431, 254, 456, 250, 86, 548, 67, 407, 408, 379, 449, 526, 396, 161, 311, 300, 550, 480, 522, 344, 211, 3, 502, 523, 243, 284, 308, 193, 520, 387, 94, 220, 112, 380, 471, 482, 238, 511, 262, 45, 160, 353, 463, 147, 20, 91, 439, 362, 467, 349, 470, 319, 455, 468, 437,2, 118, 199, 466, 330, 334, 312, 519, 276, 107, 222, 56, 209, 90, 394, 545, 294, 210, 95, 421, 49, 272, 462, 264, 230, 313, 533, 110, 252, 382, 29, 167, 150, 9, 139, 183, 476, 479, 21, 169, 378, 258, 546, 404, 499, 64, 200, 428, 420, 551, 409, 223, 208, 554, 73, 518, 246, 411, 129, 348, 11, 327, 383, 507, 120, 197, 119, 97, 393, 279, 37, 386, 256, 347, 492, 515, 248, 189, 422, 289, 184, 261, 501, 547, 372, 190, 459, 567, 131, 140, 214, 432, 336, 267, 125, 175].

(8) Transform Matrix $A_8$.

[144, 587, 283, 30, 513, 618, 197, 417, 540, 241, 191, 640, 470, 485, 573, 360, 421, 96, 517, 561, 467, 450, 49, 40, 325, 239, 60, 438, 659, 181, 488, 288, 158, 424, 136, 607, 568, 187, 314, 359, 77, 529, 583, 308, 32, 319, 425, 537, 442, 579, 435, 576, 207, 388, 564, 128, 130, 174, 256, 339, 216, 415, 304, 21, 199, 145, 445, 548, 365, 300, 558, 100, 46, 11, 476, 493, 479, 354, 609, 473, 343, 499, 427, 356, 578, 203, 635, 52, 373, 374, 580, 577, 605, 287, 306, 20, 657, 250, 110, 22, 23, 550, 641, 14, 459, 468, 243, 474, 69, 66, 26, 310, 449, 264, 581, 526, 316, 42, 309, 552, 38, 536, 224, 119, 623, 279, 340, 637, 115, 120, 105, 397, 494, 566, 511, 155, 653, 190, 213, 357, 600, 323, 369, 150, 294, 85, 277, 584, 117, 565, 180, 315, 462, 599, 539, 282, 630, 220, 394, 586, 567, 284, 386, 10, 544, 376, 400, 194, 611, 92, 458, 173, 177, 650, 101, 569, 307, 615, 482, 112, 460, 317, 353, 406, 480, 186, 25, 198, 5, 227, 428, 154, 496, 37, 59, 524, 218, 311, 585, 521, 179, 132, 402, 212, 557, 423, 341, 622, 93, 327, 370, 252, 211, 139, 43, 94, 503, 471, 632, 342, 563, 430, 329, 518, 232, 525, 371, 509, 114, 551, 444, 266, 478, 364, 278, 204, 188, 147, 210, 420, 481, 326, 351, 165, 395, 291, 510, 2, 1, 89, 534, 247, 384, 582, 245, 172, 338, 103, 157, 246, 456, 70, 48, 293, 142, 453, 610, 633, 67, 123, 492, 412, 39, 335, 634, 404, 162, 624, 286, 401, 303, 349, 182, 627, 487, 124, 299, 127, 175, 248, 156, 129, 409, 396, 215, 410, 399, 454, 466, 508, 334, 313, 636, 500, 486, 604, 501, 195, 34, 463, 461, 556, 201, 535, 433, 422, 27, 419, 451, 87, 270, 222, 106, 75, 403, 235, 571, 333, 217, 443, 280, 361, 153, 648, 137, 17, 562, 72, 73, 160, 387, 408, 596, 6, 549, 275, 140, 41, 236, 324, 407, 603, 71, 98, 78, 164, 522, 472, 29, 55, 418, 88, 183, 483, 54, 608, 392, 141, 76, 152, 375, 345, 122, 649, 606, 366, 0, 436, 318, 91, 381, 515, 36, 642, 382, 12, 489, 125, 328, 377, 219, 547, 269, 437, 352, 629, 159, 520, 638, 491, 533, 268, 411, 193, 559, 111, 15, 301, 336, 434, 530, 541, 272, 390, 440, 254, 385, 368, 595, 146, 50, 133, 597, 104, 512, 226, 200, 378, 118, 347, 464, 447, 253, 617, 249, 47, 545, 230, 99, 290, 448, 167, 265, 490, 3, 274, 260, 505, 379, 645, 646, 355, 9, 255, 251, 331, 446, 126, 393, 214, 330, 138, 51, 531, 237, 348, 267, 589, 322, 131, 13, 79, 18, 151, 619, 528, 484, 81, 273, 97, 616, 223, 83, 305, 414, 259, 383, 44, 228, 405, 64, 86, 572, 497, 61, 206, 295, 429, 121, 8, 542, 261, 416, 231, 113, 102, 134, 192, 68, 95, 593, 532, 189, 543, 431, 229, 171, 281, 178, 362, 289, 53, 80, 538, 652, 271, 621, 516, 240, 302, 546, 31, 477, 380, 62, 519, 439, 238, 601, 28, 612, 276, 560, 176, 242, 298, 346, 523, 257, 658, 363, 90, 498, 504, 594, 344, 148, 358, 143, 244, 35, 196, 209, 84, 163, 19, 574, 33, 495, 626, 296, 45, 169, 432, 554, 591, 74, 170, 570, 185, 234, 644, 647, 639, 57, 337, 184, 221, 602, 258, 149, 391, 65, 588, 457, 654, 24,506, 413, 116, 332, 350, 107, 590, 135, 598, 372, 202, 553, 321, 292, 58, 166, 168, 643, 7, 263, 655, 613, 398, 312, 465, 592, 656, 161, 620, 507, 56, 631, 475, 109, 208, 297, 262, 575, 502, 82, 320, 233, 441, 285, 469, 426, 452, 455, 514, 367, 625, 628, 389, 651, 205, 108, 63, 555, 527, 16, 4, 614, 225].

The permutation matrix provided above is not a complete matrix, and only positions of elements with a value being "1" in the permutation matrix are provided. For example, the foregoing values are used to sequentially represent rows of the permutation matrix, the first value represents a $0^{th}$ row, the second value represents a $1^{st}$ row, and the rest is deduced by analogy. The foregoing specific value represents a position of an element with a value being "1" in a row corresponding to the value, and in the row, values of elements at other positions than the position are all 0. For example, for the permutation matrix $A_8$, the first value is 144, indicating that a value of a $144^{th}$ element in the $0^{th}$ row of the permutation matrix $A_8$ is 1, and values of other elements in the $0^{th}$ row are all 0; the second value is 587, indicating that a value of a $587^{th}$ element in the $1^{st}$ row of the permutation matrix $A_8$ is 1, and values of other elements in the $1^{st}$ row are all 0; the third value is 283, indicating that a value of a $283^{rd}$ element in a $2^{nd}$ row of the permutation matrix $A_8$ is 1, and values of other elements in the $2^{nd}$ row are all 0; and the rest is deduced by analogy. The understanding of the foregoing permutation matrices $A_1$ to $A_7$ is also similar.

In a double LDPC system, a connection matrix between source code and channel code needs to be a permutation matrix. In a case of a fixed code length, a quantity of permutation matrices is limited. Therefore, in embodiments of this application, an appropriate permutation matrix may be found according to a search algorithm, to improve a connection between source code and channel code. In this way, the performance of the double LDPC system provided in embodiments of this application can be effectively improved. In addition, because a source coding basis matrix is obtained based on a channel coding basis matrix, an association exists between the source coding matrix and the channel check matrix. An appropriate interleaving matrix (for example, the second matrix) is searched for and screened out according to an appropriate search algorithm, so that the association between the source coding matrix and the channel check matrix can also be effectively removed.

S702: The second device obtains a joint check matrix based on the second matrix. Optionally, the second device may obtain the joint check matrix based on the source coding matrix, the channel check matrix, and the second matrix. For the joint check matrix, refer to FIG. 8.

After obtaining the joint check matrix, the second device may perform decoding based on the joint check matrix. The embodiment shown in FIG. 7 and the embodiment shown in FIG. 2 may be applied in combination. In this case, the second device may decode second information based on the joint check matrix, that is, the joint check matrix in the embodiment shown in FIG. 2 may be replaced with the joint check matrix in the embodiment shown in FIG. 7. Alternatively, the embodiment shown in FIG. 7 and the embodiment shown in FIG. 2 may be separately applied. In this case, the information decoded by the second device based on the joint check matrix may be obtained according to the method provided in the embodiment shown in FIG. 2, or may be obtained according to a conventional method (for example, an existing double LDPC coding method). This is not limited in embodiments of this application.

In addition to a process of obtaining the second matrix, for a decoding process by the second device in embodiments of this application, refer to the descriptions of the decoding process in the embodiment shown in FIG. 2.

In embodiments of this application, the second device may correspondingly process an identity matrix to obtain a joint check matrix, and perform decoding based on the joint check matrix, so that a decoding threshold can be effectively reduced, to improve decoding performance.

Figure 13:
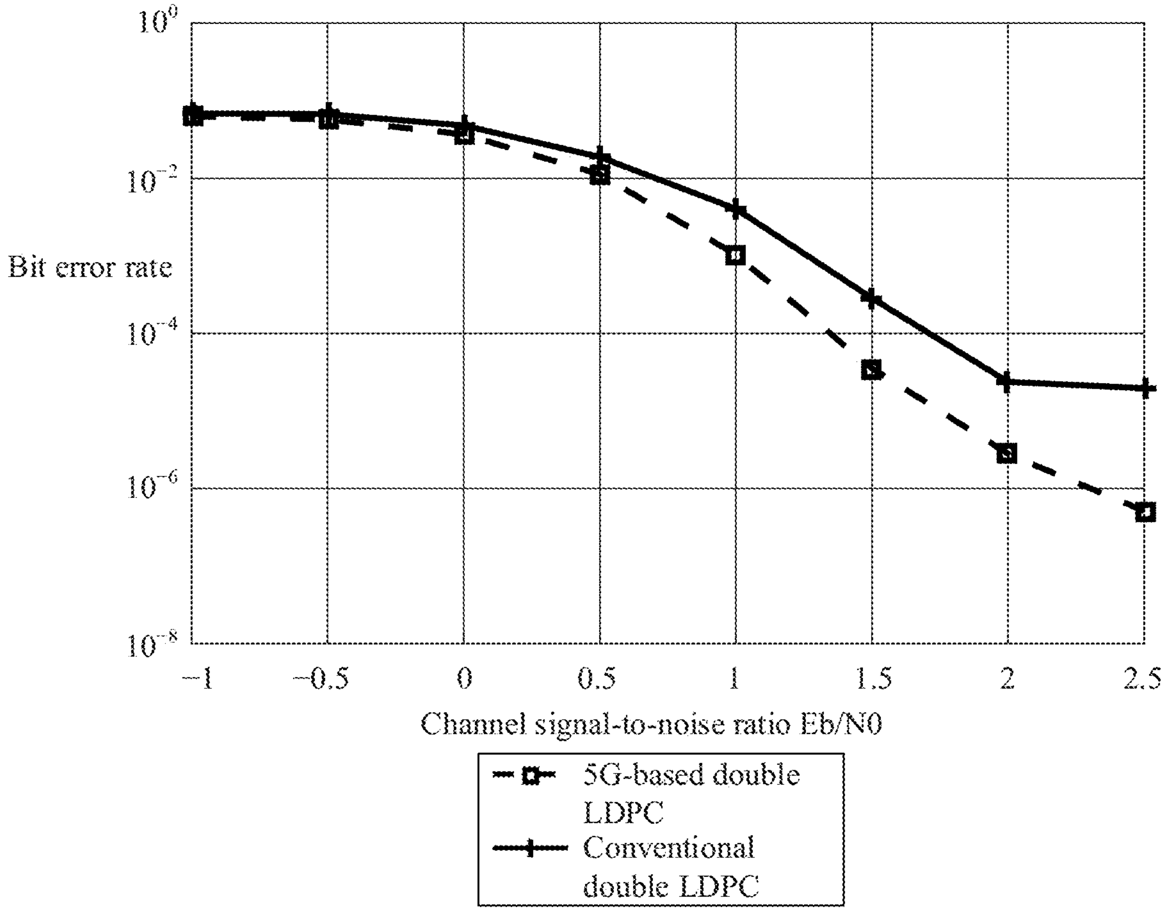
FIG. 13 and FIG. 14 are schematic diagrams of performance comparison between an embodiment of this application and a conventional scheme.

To better describe effects brought by the technical solutions provided in embodiments of this application, FIG. 13 is a schematic diagram of performance comparison between a coding/decoding method provided in the embodiment shown in FIG. 2 and an existing double LDPC system scheme. In FIG. 13, an example in which a source entropy rate is 0.4 is used. In addition, in FIG. 13, in embodiments of this application, a double LDPC with a code length of 880 is used, and a decoding manner is joint source and channel decoding. In the existing double LDPC system, a scheme in which R4JA and AR4JA are respectively used as source code and channel code is used, and a code length is 1024. A solid line curve in FIG. 13 represents a scheme (referred to as a 5G-based double LDPC in FIG. 13) in the embodiment of this application, and a dashed curve represents a scheme of the existing double LDPC system (referred to as a conventional double LDPC in FIG. 13). A vertical axis represents a bit error rate, and a horizontal axis represents $$\frac{E_b}{N_0}.$$

$E_b$ represents bit energy. $N_0$ represents channel noise energy. When a value of $$\frac{E_b}{N_0}$$

is larger, the performance is better. It can be seen from FIG. 13 that, a coding/decoding scheme provided in embodiments of this application can bring about a performance gain of 0.5 dB, and problems such as an error floor can also be suppressed at the same time.

Figure 14:
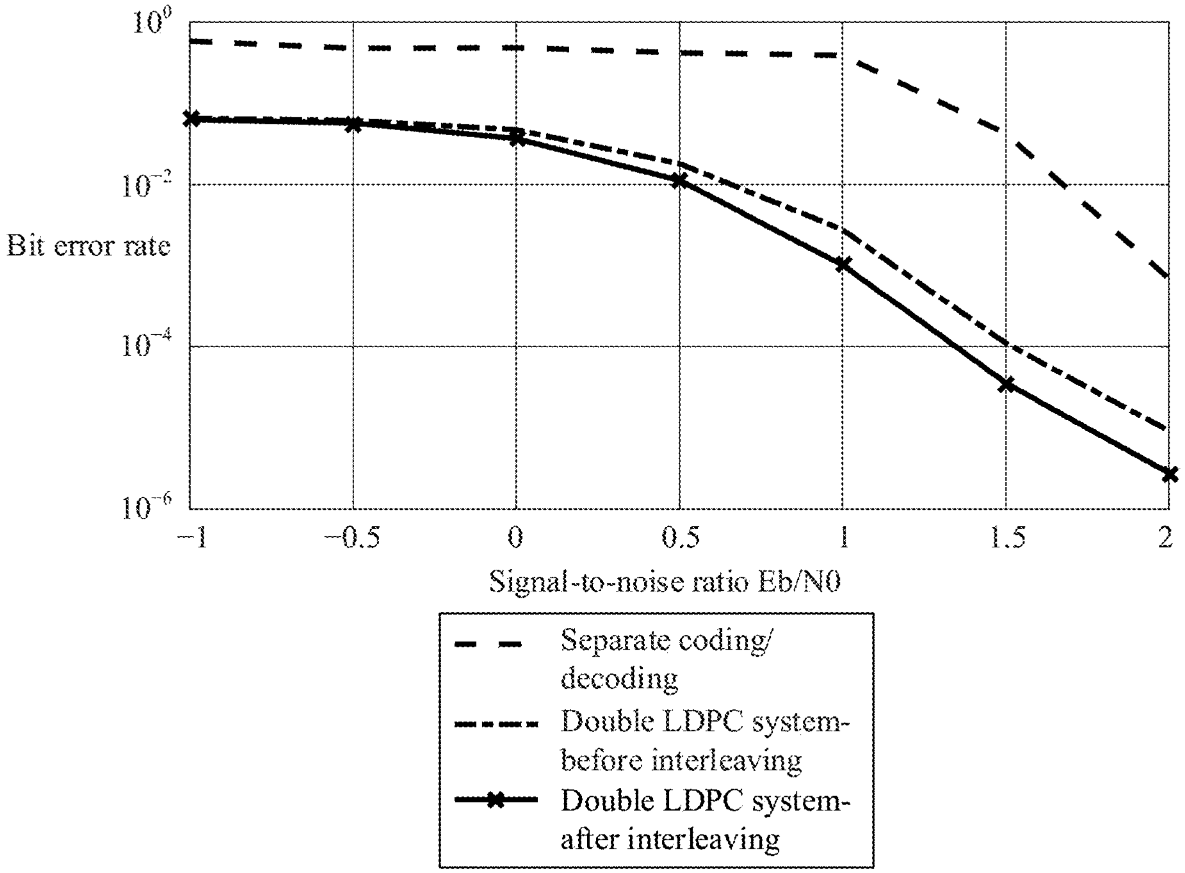

In addition, further, FIG. 14 is a schematic diagram of performance comparison between a coding/decoding method provided in the embodiment shown in FIG. 2 and an existing separate coding/decoding system scheme. A separate coding/decoding system is a single LDPC system, an LDPC is used as channel code, and an LDPC is not used as source code. In FIG. 14, an example which a source entropy rate is 0.4 is used, and an example in which the embodiment shown in FIG. 2 is separately applied and an example in which the embodiment shown in FIG. 2 is applied in combination with the embodiment shown in FIG. 7 is used. In addition, in FIG. 14, in embodiments of this application, a double LDPC with a code length of 880 is used, and a decoding manner is joint source and channel decoding. In the existing separate coding/decoding system, a scheme in which context-based adaptive binary arithmetic coding (context-based adaptive binary arithmetic coding, CABAC) and a 5G NR LDPC are respectively used as source code and channel code is used. A code length of the 5G NR LDPC is 1024, and an input bit length of the CABAC is $2\times10^7$ bits. In FIG. 14, a curve at the top represents the existing separate coding/decoding system scheme (referred to as separate coding/decoding in FIG. 14). A dashed curve in the middle represents a scheme that is separately applied in the embodiment shown in FIG. 2 (referred to as "before interleaving of a double LDPC system in FIG. 14"), that is, an identity matrix is used to obtain a joint check matrix. A dashed curve at the bottom represents a scheme (referred to as "after interleaving of a double LDPC system" in FIG. 14) in which the embodiment shown in FIG. 2 is applied in combination with the embodiment shown in FIG. 7, that is, the second matrix is used to obtain the joint check matrix. A vertical axis represents a bit error rate, and a horizontal axis represents $$\frac{E_b}{N_0}.$$

As shown in FIG. 14, if the joint check matrix is obtained based on the identity matrix, compared with a conventional coding/decoding system, the technical solutions in embodiments of this application bring about a performance gain of 0.8 dB. If the joint check matrix is obtained based on the second matrix, compared with a conventional coding/decoding system, the technical solutions in embodiments of this application bring about a performance gain of 1 dB. It can be learned that a permutation matrix (a basic permutation matrix, a derived permutation matrix, or the like) is generated based on an identity matrix, so that a decoding threshold can be effectively reduced, to improve performance.

Figure 15:
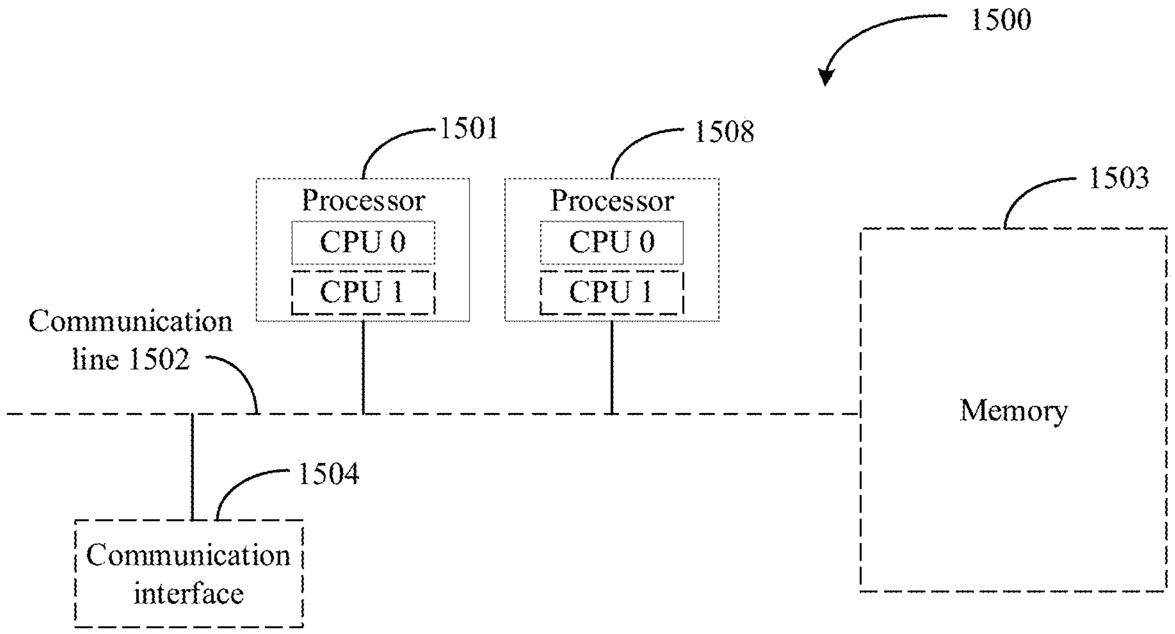
FIG. 15 is a schematic diagram of an apparatus according to an embodiment of this application.

FIG. 15 is a schematic diagram of a structure of a communication apparatus according to an embodiment of this application. The communication apparatus 1500 may also be referred to as an information processing apparatus 1500. The communication apparatus 1500 may be the first device or a circuit system of the first device in the embodiment shown in FIG. 2 or the embodiment shown in FIG. 7, and is configured to implement the method corresponding to the first device in the foregoing method embodiments. Alternatively, the communication apparatus 1500 may be the second device or a circuit system of the second device in the embodiment shown in FIG. 2 or the embodiment shown in FIG. 7, and is configured to implement the method corresponding to the second device in the foregoing method embodiments. For a specific function, refer to the descriptions in the foregoing method embodiments. For example, a circuit system is a chip system.

The communication apparatus 1500 includes at least one processor 1501. The processor 1501 may be configured to perform internal processing of the apparatus, to implement a specific control processing function. Optionally, the processor 1501 includes instructions. Optionally, the processor 1501 may store data. Optionally, different processors may be independent components, may be located at different physical positions, or may be located on different integrated circuits. Optionally, different processors may be integrated into one or more processors, for example, integrated into one or more integrated circuits.

Optionally, the communication apparatus 1500 includes one or more memories 1503, configured to store instructions. Optionally, the memory 1503 may further store data. The processor and the memory may be separately disposed, or may be integrated together.

Optionally, the communication apparatus 1500 includes a communication line 1502 and at least one communication interface 1504. Because the memory 1503, the communication line 1502, and the communication interface 1504 are all optional, they are all represented by dashed lines in FIG. 15.

Optionally, the communication apparatus 1500 may further include a transceiver and/or an antenna. The transceiver may be configured to send information to another apparatus or receive information from the another apparatus. The transceiver may be referred to as a transceiver, a transceiver circuit, an input/output interface, or the like, and is configured to implement a receiving and sending function of the communication apparatus 1500 through an antenna. Optionally, the transceiver includes a transmitter (transmitter) and a receiver (receiver). For example, the transmitter may be configured to generate a radio frequency (radio frequency) signal based on a baseband signal, and the receiver may be configured to convert the radio frequency signal into the baseband signal.

The processor 1501 may include a general-purpose central processing unit (CPU), a microprocessor, an application-specific integrated circuit (ASIC), or one or more integrated circuits for controlling program execution for the solutions of this application.

The communication line 1502 may include a path for transferring information between the foregoing components.

The communication interface 1504 is configured to communicate with another device or a communication network such as an ethernet, a radio access network (RAN), a wireless local area network (WLAN) or a wired access network through any apparatus such as a transceiver.

The memory 1503 may be a read-only memory (ROM) or another type of static storage device that can store static information and instructions, or a random access memory (RAM) or another type of dynamic storage device that can store information and instructions, or may be an electrically erasable programmable read-only memory (EEPROM), a compact disc read-only memory (CD-ROM) or another compact disc storage, an optical disc storage (including a compact disc, a laser disc, an optical disc, a digital versatile disc, a Blu-ray disc, or the like), a magnetic disk storage medium or another magnetic storage device, or any other medium that can be used to carry or store expected program code in a form of an instruction or a data structure and that can be accessed by a computer, but is not limited thereto. The memory 1503 may exist independently, and is connected to the processor 1501 through the communication line 1502. Alternatively, the memory 1503 may be integrated with the processor 1501.

The memory 1503 is configured to store computer-executable instructions for executing the solutions of this application, and execution of the computer-executable instructions is controlled by the processor 1501. The processor 1501 is configured to execute the computer-executable instructions stored in the memory 1503, to implement the information processing method provided in the foregoing embodiments of this application.

Optionally, the computer-executable instructions in embodiments of this application may also be referred to as application code. This is not specifically limited in embodiments of this application.

During specific implementation, in an embodiment, the processor 1501 may include one or more CPUs, for example, a CPU 0 and a CPU 1 in FIG. 15.

During specific implementation, in an embodiment, the communication apparatus 1500 may include a plurality of processors, for example, the processor 1501 and a processor 1508 in FIG. 15. Each of these processors may be a single-core (single-CPU) processor, or may be a multi-core (multi-CPU) processor. The processor herein may be one or more devices, circuits, and/or processing cores configured to process data (for example, computer program instructions).

When the apparatus shown in FIG. 15 is a chip, for example, a chip of an access network device, a chip of a UPF, a chip of an SMF, or a chip of a terminal device, the chip includes a processor 1501 (and may further include a processor 1508), a communication line 1502, a memory 1503, and a communication interface 1504. Specifically, the communication interface 1504 may be an input interface, a pin, a circuit, or the like. The memory 1503 may be a register, a buffer, or the like. The processor 1501 and the processor 1508 each may be a general-purpose CPU, a microprocessor, an ASIC, or one or more integrated circuits configured to control program execution of the information processing method in any one of the foregoing embodiments.

In a first implementation, the communication apparatus 1500 may be configured to implement the method corresponding to the terminal device in the foregoing embodiment of this application. For a specific function, refer to the descriptions in the foregoing embodiment.

For example, the communication apparatus 1500 includes a processor 1501. The processor 1501 is configured to execute a computer program or instructions, so that the method corresponding to the first device in the foregoing embodiments of this application is performed. For example, the method corresponding to the first device in the foregoing embodiments of this application includes: determining a first source coding rate; determining a source coding matrix based on the first source coding rate and a channel coding basis matrix; and inputting a source sequence into the source coding matrix, to perform source coding on the source sequence.

In a second implementation, the communication apparatus 1500 may be configured to implement the method corresponding to the second device in the foregoing embodiment of this application. For a specific function, refer to the descriptions in the foregoing embodiment.

For example, the communication apparatus 1500 includes a processor 1501. The processor 1501 is configured to execute a computer program or instructions, so that the method corresponding to the second device in the foregoing embodiments of this application is performed. For example, the method corresponding to the second device in the foregoing embodiments of this application includes: obtaining a joint check matrix based on a second matrix, where the second matrix is a matrix obtained based on an identity matrix; and decoding received second information based on the joint check matrix.

For another example, the method corresponding to the second device in the foregoing embodiments of this application includes: determining a first source coding rate; determining a source coding matrix based on the first source coding rate; and decoding received second information based on the source coding matrix.

Figure 16:
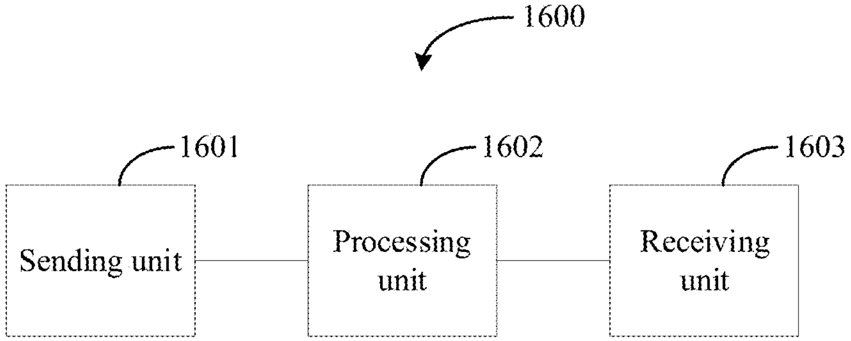
FIG. 16 is a schematic diagram of another apparatus according to an embodiment of this application.

In embodiments of this application, the apparatus may be divided into functional modules based on the foregoing method examples. For example, each functional module may be obtained through division based on each corresponding function, or two or more functions may be integrated into one processing module. The integrated module may be implemented in a form of hardware, or may be implemented in a form of a software functional module. It is to be noted that, in embodiments of this application, module division is an example, and is merely logical function division. In an actual implementation, another division manner may be used. For example, when functional modules are obtained through division based on corresponding functions, FIG. 16 is a schematic diagram of an apparatus. The apparatus 1600 may be the access network device or the terminal device in the foregoing method embodiments, or may be a chip in the access network device or a chip in the terminal device. The apparatus 1600 includes a sending unit 1601, a processing unit 1602, and a receiving unit 1603.

It is to be understood that the apparatus 1600 may be configured to implement the steps performed by the access network device or the terminal device in the methods in embodiments of this application. For related features, refer to the foregoing embodiments. Details are not described herein again.

Optionally, functions/implementation processes of the sending unit 1601, the receiving unit 1603, and the processing unit 1602 in FIG. 16 may be implemented by the processor 1501 in FIG. 15 by invoking the computer-executable instructions stored in the memory 1503. Alternatively, a function/an implementation process of the processing unit 1602 in FIG. 16 may be implemented by the processor 1501 in FIG. 15 by invoking the computer-executable instructions stored in the memory 1503, and functions/implementation processes of the sending unit 1601 and the receiving unit 1603 in FIG. 16 may be implemented through the communication interface 1504 in FIG. 15.

Optionally, when the apparatus 1600 is a chip or a circuit, functions/implementation processes of the sending unit 1601 and the receiving unit 1603 may be alternatively implemented by a pin, a circuit, or the like.

This application further provides a computer-readable storage medium. The computer-readable storage medium stores a computer program or instructions. When the computer program or the instructions are run, the method performed by the access network device or the terminal device in the foregoing method embodiments is implemented. In this way, the functions in the foregoing embodiments may be implemented in a form of a software functional unit and sold or used as an independent product. Based on such an understanding, the technical solutions of this application essentially, or the contributing part, or some of the technical solutions may be implemented in a form of a software product. The computer software product is stored in a storage medium and includes several instructions for instructing a computer device (which may be a personal computer, a server, a network device, or the like) to perform all or some of the steps of the methods described in embodiments of this application. The storage medium includes any medium that can store program code, such as a USB flash drive, a removable hard disk, a ROM, a RAM, a magnetic disk, an optical disc, or the like.

This application further provides a computer program product. The computer program product includes computer program code. When the computer program code is run on a computer, the computer is enabled to perform the method performed by the terminal device or the access network device in any one of the foregoing method embodiments.

An embodiment of this application further provides a processing apparatus, including a processor and an interface. The processor is configured to perform the method performed by the terminal device or the access network device in any one of the foregoing method embodiments.

All or some of the foregoing embodiments may be implemented by software, hardware, firmware, or any combination thereof. When software is used to implement embodiments, all or some of embodiments may be implemented in a form of a computer program product. The computer program product includes one or more computer instructions. When the computer program instructions are loaded and executed on a computer, the procedure or functions according to embodiments of this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

Various illustrative logical units and circuits described in embodiments of this application may implement or operate the described functions through a general-purpose processor, a digital signal processor (DSP), an application-specific integrated circuit (ASIC), a field-programmable gate array (FPGA), or another programmable logic apparatus, discrete gate or transistor logic, discrete hardware components, or any combination of the foregoing designs. The general-purpose processor may be a microprocessor. Optionally, the general-purpose processor may be alternatively any conventional processor, controller, microcontroller, or state machine. The processor may also be achieved through the combination of computing apparatuses, such as combination of a digital signal processor and a microprocessor, a plurality of microprocessors, one or more microprocessors and one digital signal processor, or any other similar configurations.

Steps of the methods or algorithms described in embodiments of this application may be directly embedded into hardware, a software unit executed by the processor, or a combination thereof. The software unit may be stored in a RAM, a flash memory, a ROM, an erasable programmable read-only memory (EPROM), an EEPROM, a register, a hard disk, a removable disk, a CD-ROM, or a storage medium in any other form in the art. For example, storage media may be connected to the processor, so that the processor can read information from the storage media and may save the information in the storage media. Optionally, the storage media may be alternatively integrated into the processor. The processor and the storage media may be disposed in an ASIC, and the ASIC may be disposed in a terminal device. Optionally, the processor and the storage media may be alternatively disposed in different components in the terminal device.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although embodiments of this application are described with reference to specific features and embodiments thereof, it is clear that various modifications and combinations may be made to embodiments of this application without departing from the scope of embodiments of this application. Correspondingly, embodiments and the accompanying drawings are merely example descriptions of embodiments of this application that are defined by the appended claims, and are considered to cover any or all of modifications, variations, combinations, or equivalents in the scope of embodiments of this application. It is clearly that a person skilled in the art may make various modifications and variations to embodiments of this application without departing from the scope of embodiments of this application. In this way, embodiments of this application are also intended to cover these modifications and variations provided that they fall within the scope of the claims of embodiments of this application and equivalent technologies thereof.

Embodiment 1. An information processing method, including:

- determining a first source coding rate;
- determining a source coding matrix based on the first source coding rate and a channel coding basis matrix; and
- inputting a source sequence into the source coding matrix, to perform source coding on the source sequence.

Embodiment 2. The method according to Embodiment 1, where the method further includes:

- determining the first source coding rate from first information based on an entropy rate and a source code length of the source sequence, where the first information includes a correspondence among a source coding rate, a source code length, and an entropy rate, and a quantity of source coding rates included in the first information is greater than 6.

Embodiment 3. The method according to Embodiment 1 or 2, where the determining a source coding matrix based on the first source coding rate and a channel coding basis matrix includes:

- determining a source coding basis matrix based on the first source coding rate and the channel coding basis matrix; and
- determining the source coding matrix based on the source coding basis matrix.

Embodiment 4. The method according to Embodiment 3, where the determining a source coding basis matrix based on the first source coding rate and the channel coding basis matrix includes:

- determining a set index to which a lifting size corresponding to the first source coding rate belongs;
- determining a first channel coding basis matrix corresponding to the set index;
- transposing the first channel coding basis matrix to obtain a second channel coding basis matrix; and
- pruning rows and/or columns of the second channel coding basis matrix to obtain the source coding basis matrix.

Embodiment 5. The method according to Embodiment 4, where the pruning rows and/or columns of the second channel coding basis matrix includes:

- reserving the first $N_1$ rows of the second channel coding basis matrix, where $N_1$ is a positive integer less than or equal to a total quantity of rows of the second channel coding basis matrix; and/or
- reserving $N_2$ columns of the second channel coding basis matrix, where $N_2$ is a positive integer less than or equal to a total quantity of columns of the second channel coding basis matrix.

Embodiment 6. The method according to Embodiment 5, where $N_1$=22.

Embodiment 7. The method according to Embodiment 5 or 6, where if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{th}$ column of the second channel coding basis matrix.

Embodiment 8. The method according to any one of Embodiments 1 to 7, where the method further includes:

performing, based on a first matrix, channel coding on bits output by the source coding matrix, where an output dimension of the source coding matrix is equal to an input dimension of the first matrix.

Embodiment 9. The method according to Embodiment 8, where the performing, based on a first matrix, channel coding on bits output by the source coding matrix includes:

shuffling, based on a second matrix, the bits output by the source coding matrix; and performing the channel coding on the shuffled bits based on the first matrix.

Embodiment 10. An information processing method, including:

obtaining a joint check matrix based on a second matrix, where the second matrix is a matrix obtained based on an identity matrix; and decoding received second information based on the joint check matrix.

Embodiment 11. The method according to Embodiment 10, where the second matrix is obtained by processing the identity matrix according to a search algorithm.

Embodiment 12. The method according to Embodiment 11, where the method further includes:

processing the identity matrix according to the search algorithm to obtain a third matrix; and obtaining the second matrix based on the third matrix, where a source code length corresponding to the second matrix is greater than a source code length corresponding to the third matrix.

Embodiment 13. The method according to any one of Embodiments 10 to 12, where the obtaining a joint check matrix based on a second matrix includes:

obtaining the joint check matrix based on a source coding matrix and the second matrix.

Embodiment 14. The method according to Embodiment 13, where the method further includes:

determining a first source coding rate; and determining the source coding matrix based on the first source coding rate.

Embodiment 15. The method according to Embodiment 14, where the method further includes:

determining the first source coding rate from first information based on an entropy rate and a source code length of a source sequence, where the first information includes a correspondence among a source coding rate, a source code length, and an entropy rate, and a quantity of source coding rates included in the first information is greater than 6.

Embodiment 16. The method according to Embodiment 14 or 15, where the determining the source coding matrix based on the first source coding rate includes:

determining a source coding basis matrix based on the first source coding rate and a channel coding basis matrix; and determining the source coding matrix based on the source coding basis matrix.

Embodiment 17. The method according to Embodiment 16, where the determining the source coding basis matrix based on the first source coding rate and a channel coding basis matrix includes:

determining a set index to which a lifting size corresponding to the first source coding rate belongs;

determining a first channel coding basis matrix corresponding to the set index;

transposing the first channel coding basis matrix to obtain a second channel coding basis matrix; and pruning rows and/or columns of the second channel coding basis matrix to obtain the source coding basis matrix.

Embodiment 18. The method according to Embodiment 17, where the pruning rows and/or columns of the second channel coding basis matrix includes:

reserving the first $N_1$ rows of the second channel coding basis matrix, where $N_1$ is a positive integer less than or equal to a total quantity of rows of the second channel coding basis matrix; and/or reserving $N_2$ columns of the second channel coding basis matrix, where $N_2$ is a positive integer less than or equal to a total quantity of columns of the second channel coding basis matrix.

Embodiment 19. The method according to Embodiment 18, where $N_1$=22.

Embodiment 20. The method according to Embodiment 18 or 19, where if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{th}$ column of the second channel coding basis matrix.

Embodiment 21. An information processing method, including:

determining a first source coding rate;

determining a source coding matrix based on the first source coding rate; and decoding received second information based on the source coding matrix.

Embodiment 22. The method according to Embodiment 21, where the method further includes:

determining the first source coding rate from first information based on an entropy rate and a source code length of a source sequence, where the first information includes a correspondence among a source coding rate, a source code length, and an entropy rate, and a quantity of source coding rates included in the first information is greater than 6.

Embodiment 23. The method according to Embodiment 21 or 22, where the determining a source coding matrix based on the first source coding rate includes:

determining a source coding basis matrix based on the first source coding rate and a channel coding basis matrix; and determining the source coding matrix based on the source coding basis matrix.

Embodiment 24. The method according to Embodiment 23, where the determining a source coding basis matrix based on the first source coding rate and a channel coding basis matrix includes:

determining a set index to which a lifting size corresponding to the first source coding rate belongs;

determining a first channel coding basis matrix corresponding to the set index;

transposing the first channel coding basis matrix to obtain a second channel coding basis matrix; and pruning rows and/or columns of the second channel coding basis matrix to obtain the source coding basis matrix.

Embodiment 25. The method according to Embodiment 24, where the pruning rows and/or columns of the second channel coding basis matrix includes:

reserving the first $N_1$ rows of the second channel coding basis matrix, where $N_1$ is a positive integer less than or equal to a total quantity of rows of the second channel coding basis matrix; and/or reserving $N_2$ columns of the second channel coding basis matrix, where $N_2$ is a positive integer less than or equal to a total quantity of columns of the second channel coding basis matrix.

Embodiment 26. The method according to Embodiment 25, where $N_1=22$.

Embodiment 27. The method according to Embodiment 25 or 26, where if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{h}$ column of the second channel coding basis matrix.

Embodiment 28. The method according to any one of Embodiments 21 to 27, where the decoding received second information based on the source coding matrix includes:

determining a joint check matrix based on the source coding matrix; and decoding the second information based on the joint check matrix.

Embodiment 29. The method according to Embodiment 28, where the determining a joint check matrix based on the source coding matrix includes:

determining the joint check matrix based on the source coding matrix and a second matrix, where the second matrix is a matrix obtained based on an identity matrix.

Embodiment 30. The method according to Embodiment 29, where the second matrix is obtained by processing the identity matrix according to a search algorithm.

Embodiment 31. The method according to Embodiment 29, where the method further includes:

processing the identity matrix according to the search algorithm to obtain a third matrix; and obtaining the second matrix based on the third matrix, where a source code length corresponding to the second matrix is greater than a source code length corresponding to the third matrix.

Embodiment 32. An information processing apparatus, including:

a processing unit, configured to determine a first source coding rate, the processing unit being further configured to determine a source coding matrix based on the first source coding rate and a channel coding basis matrix; and the processing unit being further configured to input a source sequence into the source coding matrix, to perform source coding on the source sequence.

Embodiment 33. The apparatus according to Embodiment 32, where the processing unit is further configured to determine the first source coding rate from first information based on an entropy rate and a source code length of the source sequence, where the first information includes a correspondence among a source coding rate, a source code length, and an entropy rate, and a quantity of source coding rates included in the first information is greater than 6.

Embodiment 34. The apparatus according to Embodiment 33 or 34, where the processing unit is configured to determine the source coding matrix based on the first source coding rate and the channel coding basis matrix in the following manner:

determining a source coding basis matrix based on the first source coding rate and the channel coding basis matrix; and determining the source coding matrix based on the source coding basis matrix.

Embodiment 35. The apparatus according to Embodiment 34, where the processing unit is configured to determine the source coding basis matrix based on the first source coding rate and the channel coding basis matrix in the following manner:

determining a set index to which a lifting size corresponding to the first source coding rate belongs;

determining a first channel coding basis matrix corresponding to the set index;

transposing the first channel coding basis matrix to obtain a second channel coding basis matrix; and pruning rows and/or columns of the second channel coding basis matrix to obtain the source coding basis matrix.

Embodiment 36. The apparatus according to Embodiment 35, where the processing unit is configured to prune rows and/or columns of the second channel coding basis matrix in the following manner:

reserving the first $N_1$ rows of the second channel coding basis matrix, where $N_1$ is a positive integer less than or equal to a total quantity of rows of the second channel coding basis matrix; and/or reserving $N_2$ columns of the second channel coding basis matrix, where $N_2$ is a positive integer less than or equal to a total quantity of columns of the second channel coding basis matrix.

Embodiment 37. The apparatus according to Embodiment 36, where $N_1=22$.

Embodiment 38. The apparatus according to Embodiment 36 or 37, where if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{th}$ column of the second channel coding basis matrix.

Embodiment 39. The apparatus according to any one of Embodiments 32 or 38, where the processing unit is further configured to perform, based on a first matrix, channel coding on bits output by the source coding matrix, where an output dimension of the source coding matrix is equal to an input dimension of the first matrix.

Embodiment 40. The apparatus according to Embodiment 39, where the processing unit is configured to perform, based on the first matrix, the channel coding on the bits output by the source coding matrix in the following manner:

shuffling, based on a second matrix, the bits output by the source coding matrix; and performing the channel coding on the shuffled bits based on the first matrix.

Embodiment 41. The apparatus according to any one of Embodiments 32 to 40, where the apparatus further includes a transceiver unit, configured to send second information, where the second information is information obtained through the channel coding.

Embodiment 42. An information processing apparatus, including:

a processing unit, configured to obtain a joint check matrix based on a second matrix, where the second matrix is a matrix obtained based on an identity matrix, the processing unit being further configured to decode received second information based on the joint check matrix.

Embodiment 43. The apparatus according to Embodiment 42, where the apparatus further includes a transceiver unit, configured to receive the second information.

Embodiment 44. The apparatus according to Embodiment 42 or 43, where the second matrix is obtained by processing the identity matrix according to a search algorithm.

Embodiment 45. The apparatus according to Embodiment 44, where the processing unit is further configured to:

process the identity matrix according to the search algorithm to obtain a third matrix; and obtain the second matrix based on the third matrix, where a source code length corresponding to the second matrix is greater than a source code length corresponding to the third matrix.

Embodiment 46. The apparatus according to any one of Embodiments 42 to 45, where the processing unit is configured to obtain the joint check matrix based on the second matrix in the following manner:

obtaining the joint check matrix based on a source coding matrix and the second matrix.

Embodiment 47. The apparatus according to Embodiment 46, where the processing unit is further configured to:

determine a first source coding rate; and determine the source coding matrix based on the first source coding rate.

Embodiment 48. The apparatus according to Embodiment 47, where the processing unit is further configured to determine the first source coding rate from first information based on an entropy rate and a source code length of a source sequence, where the first information includes a correspondence among a source coding rate, a source code length, and an entropy rate, and a quantity of source coding rates included in the first information is greater than 6.

Embodiment 49. The apparatus according to Embodiment 47 or 48, where the processing unit is configured to determine the source coding matrix based on the first source coding rate in the following manner:

determining a source coding basis matrix based on the first source coding rate and a channel coding basis matrix; and determining the source coding matrix based on the source coding basis matrix.

Embodiment 50. The apparatus according to Embodiment 49, where the processing unit is configured to determine the source coding basis matrix based on the first source coding rate and the channel coding basis matrix in the following manner:

determining a set index to which a lifting size corresponding to the first source coding rate belongs;

determining a first channel coding basis matrix corresponding to the set index;

transposing the first channel coding basis matrix to obtain a second channel coding basis matrix; and pruning rows and/or columns of the second channel coding basis matrix to obtain the source coding basis matrix.

Embodiment 51. The apparatus according to Embodiment 50, where the processing unit is configured to prune rows and/or columns of the second channel coding basis matrix in the following manner:

reserving the first $N_1$ rows of the second channel coding basis matrix, where $N_1$ is a positive integer less than or equal to a total quantity of rows of the second channel coding basis matrix; and/or reserving $N_2$ columns of the second channel coding basis matrix, where $N_2$ is a positive integer less than or equal to a total quantity of columns of the second channel coding basis matrix.

Embodiment 52. The apparatus according to Embodiment 51, where $N_1=22$.

Embodiment 53. The apparatus according to Embodiment 51 or 52, where if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{h}$ column of the second channel coding basis matrix.

Embodiment 54. An information processing apparatus, including:

a processing unit, configured to determine a first source coding rate, the processing unit being further configured to determine a source coding matrix based on the first source coding rate; and the processing unit being further configured to decode received second information based on the source coding matrix.

Embodiment 55. The apparatus according to Embodiment 54, where the apparatus further includes a transceiver unit, configured to receive the second information.

Embodiment 56. The apparatus according to Embodiment 54 or 55, where the processing unit is further configured to determine the first source coding rate from first information based on an entropy rate and a source code length of a source sequence, where the first information includes a correspondence among a source coding rate, a source code length, and an entropy rate, and a quantity of source coding rates included in the first information is greater than 6.

Embodiment 57. The method according to any one of Embodiments 54 or 56, where the processing unit is configured to determine the source coding matrix based on the first source coding rate in the following manner:

determining a source coding basis matrix based on the first source coding rate and a channel coding basis matrix; and determining the source coding matrix based on the source coding basis matrix.

Embodiment 58. The apparatus according to Embodiment 57, where the processing unit is configured to determine the source coding basis matrix based on the first source coding rate and the channel coding basis matrix in the following manner:

determining a set index to which a lifting size corresponding to the first source coding rate belongs;

determining a first channel coding basis matrix corresponding to the set index;

transposing the first channel coding basis matrix to obtain a second channel coding basis matrix; and pruning rows and/or columns of the second channel coding basis matrix to obtain the source coding basis matrix.

Embodiment 59. The apparatus according to Embodiment 58, where the processing unit is configured to prune rows and/or columns of the second channel coding basis matrix in the following manner:

reserving the first $N_1$ rows of the second channel coding basis matrix, where $N_1$ is a positive integer less than or equal to a total quantity of rows of the second channel coding basis matrix; and/or reserving $N_2$ columns of the second channel coding basis matrix, where $N_2$ is a positive integer less than or equal to a total quantity of columns of the second channel coding basis matrix.

Embodiment 60. The apparatus according to Embodiment 59, where $N_1=22$.

Embodiment 61. The apparatus according to Embodiment 59 or 60, where if $N_2$ is less than or equal to a first value, the $N_2$ columns are a $13^{th}$ column to an $(N_2+12)^{th}$ column of the second channel coding basis matrix; or if $N_2$ is greater than a first value, the $N_2$ columns are a $(46-N_2)^{th}$ column to a $45^{th}$ column of the second channel coding basis matrix.

Embodiment 62. The apparatus according to any one of Embodiments 54 to 61, where the processing unit is configured to decode the received second information based on the source coding matrix in the following manner:

determining a joint check matrix based on the source coding matrix; and decoding the second information based on the joint check matrix.

Embodiment 63. The apparatus according to Embodiment 62, where the processing unit is configured to determine the joint check matrix based on the source coding matrix in the following manner:

determining the joint check matrix based on the source coding matrix and a second matrix, where the second matrix is a matrix obtained based on an identity matrix.

Embodiment 64. The apparatus according to Embodiment 63, where the second matrix is obtained by processing the identity matrix according to a search algorithm.

Embodiment 65. The apparatus according to Embodiment 63, where the processing unit is further configured to:

process the identity matrix according to the search algorithm to obtain a third matrix; and obtain the second matrix based on the third matrix, where a source code length corresponding to the second matrix is greater than a source code length corresponding to the third matrix.

Embodiment 66. An apparatus, including units configured to perform the method described in any embodiment of this application.

Embodiment 67. A computer program product, where the computer program product includes a computer program, and when the computer program runs on a computer, the computer is enabled to perform the method according to any one of Embodiments 1 to 9, or the computer is enabled to perform the method according to any one of Embodiments 10 to 20, or the computer is enabled to perform the method according to any one of Embodiments 21 to 31.

What is claimed is:

1. A method for processing information, comprising:

determining a first source coding rate;

determining a source coding matrix based on the first source coding rate and a channel coding basis matrix; and inputting a source sequence into the source coding matrix to perform source coding on the source sequence.

2. The method according to claim 1, wherein the method further comprises:

determining the first source coding rate from first information based on an entropy rate and a source code length of the source sequence, wherein the first information comprises a correspondence among a source coding rate, a source code length, and an entropy rate, and a quantity of source coding rates comprised in the first information is greater than 6.

3. The method according to claim 1, wherein the determining a source coding matrix based on the first source coding rate and a channel coding basis matrix comprises:

determining a source coding basis matrix based on the first source coding rate and the channel coding basis matrix; and determining the source coding matrix based on the source coding basis matrix.

4. The method according to claim 3, wherein the determining a source coding basis matrix based on the first source coding rate and the channel coding basis matrix comprises:

determining a set index to which a lifting size corresponding to the first source coding rate belongs;

determining a first channel coding basis matrix corresponding to the set index;

transposing the first channel coding basis matrix to obtain a second channel coding basis matrix; and pruning at least one of rows or columns of the second channel coding basis matrix to obtain the source coding basis matrix.

5. The method according to claim 4, wherein the pruning at least one of rows or columns of the second channel coding basis matrix comprises performing at least one of the following:

reserving first $N_1$ rows of the second channel coding basis matrix, wherein $N_1$ is a positive integer less than or equal to a total quantity of rows of the second channel coding basis matrix; or reserving $N_2$ columns of the second channel coding basis matrix, wherein $N_2$ is a positive integer less than or equal to a total quantity of columns of the second channel coding basis matrix.

6. The method according to claim 5, wherein $N_1=22$.

7. The method according to claim 5, wherein:

$N_2$ is less than or equal to a first value, the $N_2$ columns are a $13^{th}$ column to an $(N_2+12)^{th}$ column of the second channel coding basis matrix; or $N_2$ is greater than a first value, the $N_2$ columns are a $(46-N_2)^{th}$ column to a $45^{th}$ column of the second channel coding basis matrix.

8. The method according to claim 1, wherein the method further comprises:

performing, based on a first matrix, channel coding on bits output by the source coding matrix, wherein an output dimension of the source coding matrix is equal to an input dimension of the first matrix.

9. The method according to claim 8, wherein the performing, based on a first matrix, channel coding on bits output by the source coding matrix comprises:

shuffling, based on a second matrix, the bits output by the source coding matrix; and performing the channel coding on the shuffled bits based on the first matrix.

10. A device for processing information, comprising:

one or more processors; and one or more memories coupled to the one or more processors and store programming instructions for execution by the one or more processors to:

determine a first source coding rate;

determine a source coding matrix based on the first source coding rate and a channel coding basis matrix; and input a source sequence into the source coding matrix to perform source coding on the source sequence.

11. The device according to claim 10, wherein the one or more memories store programming instructions for execution by the one or more processors to:

determine the first source coding rate from first information based on an entropy rate and a source code length of the source sequence, wherein the first information comprises a correspondence among a source coding rate, a source code length, and an entropy rate, and a quantity of source coding rates comprised in the first information is greater than 6.

12. A non-transitory computer-readable storage medium, wherein the non-transitory computer-readable storage medium store programming instructions for execution by at least one processor to:

determine a first source coding rate;

determine a source coding matrix based on the first source coding rate and a channel coding basis matrix; and input a source sequence into the source coding matrix to perform source coding on the source sequence.

13. The non-transitory computer-readable storage medium according to claim 12, wherein the non-transitory computer-readable storage medium store programming instructions for execution by at least one processor to:

determine the first source coding rate from first information based on an entropy rate and a source code length of the source sequence, wherein the first information comprises a correspondence among a source coding rate, a source code length, and an entropy rate, and a quantity of source coding rates comprised in the first information is greater than 6.

14. The non-transitory computer-readable storage medium according to claim 12, wherein determining the source coding matrix based on the first source coding rate and the channel coding basis matrix comprises:

determining a source coding basis matrix based on the first source coding rate and the channel coding basis matrix; and determining the source coding matrix based on the source coding basis matrix.

15. The non-transitory computer-readable storage medium according to claim 14, wherein determining the source coding basis matrix based on the first source coding rate and the channel coding basis matrix comprises:

determining a set index to which a lifting size corresponding to the first source coding rate belongs;

determining a first channel coding basis matrix corresponding to the set index;

transposing the first channel coding basis matrix to obtain a second channel coding basis matrix; and pruning at least one of rows or columns of the second channel coding basis matrix to obtain the source coding basis matrix.

16. The non-transitory computer-readable storage medium according to claim 15, wherein pruning the at least one of rows or columns of the second channel coding basis matrix comprises performing at least one of the following:

reserving first $N_1$ rows of the second channel coding basis matrix, wherein $N_1$ is a positive integer less than or equal to a total quantity of rows of the second channel coding basis matrix; or reserving $N_2$ columns of the second channel coding basis matrix, wherein $N_2$ is a positive integer less than or equal to a total quantity of columns of the second channel coding basis matrix.

17. The non-transitory computer-readable storage medium according to claim 16, wherein $N_1=22$.

18. The non-transitory computer-readable storage medium according to claim 16, wherein:

$N_2$ is less than or equal to a first value, the $N_2$ columns are a $13^{th}$ column to an $(N_2+12)^{th}$ column of the second channel coding basis matrix; or $N_2$ is greater than a first value, the $N_2$ columns are a $(46-N_2)^{th}$ column to a $45^{th}$ column of the second channel coding basis matrix.

19. The non-transitory computer-readable storage medium according to claim 12, wherein the non-transitory computer-readable storage medium store programming instructions for execution by at least one processor to:

perform, based on a first matrix, channel coding on bits output by the source coding matrix, wherein an output dimension of the source coding matrix is equal to an input dimension of the first matrix.

20. The non-transitory computer-readable storage medium according to claim 19, wherein performing, based on a first matrix, the channel coding on bits output by the source coding matrix comprises:

shuffling, based on a second matrix, the bits output by the source coding matrix; and performing the channel coding on the shuffled bits based on the first matrix.

* * * * *